US012429767B2

(12) United States Patent
Hatakeyama

(10) Patent No.: US 12,429,767 B2
(45) **Date of Patent: *Sep. 30, 2025**

(54) RESIST COMPOSITION AND PATTERNING PROCESS

(71) Applicant: Shin-Etsu Chemical Co., Ltd., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 637 days.

This patent is subject to a terminal disclaimer.

(21) Appl. No.: 17/725,846

(22) Filed: Apr. 21, 2022

(65) Prior Publication Data

US 2022/0382149 A1 Dec. 1, 2022

(30) Foreign Application Priority Data

May 7, 2021 (JP) ................................ 2021-078966

(51) Int. Cl.

| | |
|---|---|
| ***G03F 7/004*** | (2006.01) |
| ***C08F 212/14*** | (2006.01) |
| ***C08F 220/18*** | (2006.01) |
| ***C08F 220/22*** | (2006.01) |
| ***G03F 7/038*** | (2006.01) |
| ***G03F 7/039*** | (2006.01) |

(52) U.S. Cl.

CPC .......... *G03F 7/0045* (2013.01); *C08F 212/24* (2020.02); *C08F 220/1806* (2020.02); *C08F 220/22* (2013.01); *G03F 7/0382* (2013.01); *G03F 7/0392* (2013.01)

(58) Field of Classification Search

None

See application file for complete search history.

(56) References Cited

U.S. PATENT DOCUMENTS

| | | | | |
|---|---|---|---|---|
| 10,101,653 | B2 | 10/2018 | Hatakeyama et al. | |
| 10,323,113 | B2 | 6/2019 | Hatakeyama et al. | |
| 2017/0351177 | A1* | 12/2017 | Hatakeyama | G03F 7/0048 |
| 2018/0364574 | A1* | 12/2018 | Hatakeyama | G03F 7/0045 |

FOREIGN PATENT DOCUMENTS

| | | | |
|---|---|---|---|
| JP | 2011-121937 | A | 6/2011 |
| JP | 2013-53137 | A | 3/2013 |
| JP | 2019-53287 | A | 4/2019 |
| JP | 2020-15715 | A | 1/2020 |
| JP | 2020-63242 | A | 4/2020 |
| JP | 6720926 | B2 | 7/2020 |
| JP | 6743781 | B2 | 8/2020 |

OTHER PUBLICATIONS

Non-Final Office Action dated Oct. 22, 2024, issued in U.S. Appl. No. 17/724,716. (16 pages).

* cited by examiner

*Primary Examiner* — Mark F. Huff
*Assistant Examiner* — Kevin J Drummey
(74) *Attorney, Agent, or Firm* — WHDA, LLP

(57) ABSTRACT

A resist composition comprising a base polymer and a sulfonium or iodonium salt of a fluorinated sulfonic acid having a phenylene group which is substituted with an iodized phenyl-containing group and a nitro group is provided. The resist composition has a high sensitivity and forms a pattern with improved LWR or CDU, independent of whether it is of positive or negative tone.

14 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application No. 2021-078966 filed in Japan on May 7, 2021, the entire contents of which are hereby incorporated by reference.

TECHNICAL FIELD

This invention relates to a resist composition and a pattern forming process.

BACKGROUND ART

To meet the demand for higher integration density and operating speed of LSIs, the effort to reduce the pattern rule is in rapid progress. In particular, the enlargement of the logic memory market to comply with the wide-spread use of smart phones drives forward the miniaturization technology. As the advanced miniaturization technology, manufacturing of microelectronic devices at the 10-nm node by double patterning of the ArF immersion lithography has been implemented in a mass scale. Manufacturing of 7-nm node devices as the next generation by the double patterning technology is approaching to the verge of high-volume application. The candidate for 5-nm node devices as the next generation but one is EUV lithography.

The EUV resist material must meet high sensitivity, high resolution and low edge roughness (LWR) at the same time. As the acid diffusion distance is reduced, LWR is reduced, but sensitivity becomes lower. For example, as the PEB temperature is lowered, the outcome is a reduced LWR, but a lower sensitivity. As the amount of quencher added is increased, the outcome is a reduced LWR, but a lower sensitivity. It is necessary to overcome the tradeoff relation between sensitivity and LWR.

The wavelength (13.5 nm) of EUV is shorter than the wavelength (193 nm) of ArF excimer laser by at least one order, and the energy density of EUV is greater than that of ArF by one order. It is believed that since the number of photons available in a photoresist layer upon EUV exposure is as small as 1/14 of that of ArF exposure, a variation of size (LWR or CDU) is largely affected by a variation of photon number. There arises the phenomenon that a hole pattern is not opened at a one-in-several millions probability because of a variation of photon number. It is pointed out that the light absorption of a photoresist material must be increased in order to minimize the variation of photon number.

Patent Documents 1 and 2 disclose acid generators capable of generating acids having an iodized benzene ring. Since fully EUV absorptive iodine atoms are introduced on the anion side, the decomposition of the acid generator upon EUV exposure is promoted, leading to an improvement in sensitivity. Further improvements in sensitivity and LWR or CDU are demanded.

CITATION LIST

Patent Document 1: JP 6720926 (U.S. Pat. No. 10,323,113)

Patent Document 2: JP 6743781 (U.S. Pat. No. 10,101,653)

SUMMARY OF INVENTION

For the chemically amplified resist composition using an acid catalyst, it is desired to develop an acid generator capable of achieving a high sensitivity and reducing the LWR of line patterns or improving the CDU of hole patterns.

An object of the invention is to provide a resist composition which achieves a high sensitivity, minimal LWR and improved CDU independent of whether it is of positive or negative tone, and a pattern forming process using the resist composition.

The inventor has found that a resist composition having a high sensitivity, minimal LWR, improved CDU, high contrast, high resolution and wide process margin is obtained using a sulfonium or iodonium salt of a fluorinated sulfonic acid having a phenylene group which is substituted with an iodized phenyl-containing group and a nitro group, as an acid generator.

In one aspect, the invention provides a resist composition comprising a base polymer and a sulfonium salt having the formula (A-1) or an iodonium salt having the formula (A-2).

(A-1)

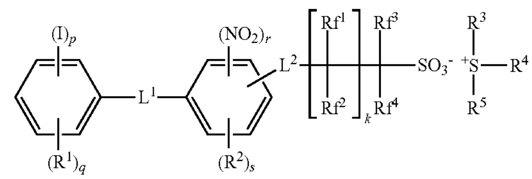

(A-2)

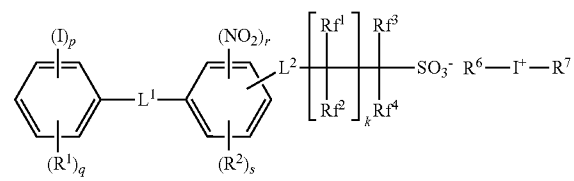

Herein k is an integer of 0 to 2, p is an integer of 1 to 5, q is an integer of 0 to 4, p+q is from 1 to 5, r is 1 or 2, s is an integer of 0 to 3, r+s is from 1 to 4. $L^1$ is a single bond, ether bond, ester bond, amide bond, or a $C_1$-$C_6$ saturated hydrocarbylene group in which some constituent —$CH_2$— may be replaced by an ether bond, ester bond or amide bond. $L^2$ is a single bond or a $C_1$-$C_{20}$ divalent linking group which may contain oxygen, sulfur or nitrogen. $Rf^1$ to $Rf^4$ are each independently hydrogen, fluorine or trifluoromethyl, at least one of $Rf^1$ to $Rf^4$ being fluorine or trifluoromethyl. $R^1$ is a hydroxy, carboxy, fluorine, chlorine, bromine, amino group, or a $C_1$-$C_{20}$ hydrocarbyl group, $C_1$-$C_{20}$ hydrocarbyloxy group, $C_2$-$C_{20}$ hydrocarbyloxycarbonyl group, $C_2$-$C_{20}$ hydrocarbylcarbonyloxy group, or $C_1$-$C_{20}$ hydrocarbylsulfonyloxy group, which may contain fluorine, chlorine, bromine, hydroxy, amino or ether bond, or —$N(R^{1A})(R^{1B})$, —$N(R^{1C})$—C(═O)—$R^{1D}$, or —$N(R^{1C})$—C(═O)—O—$R^{1D}$ wherein $R^{1A}$ and $R^{1B}$ are each independently hydrogen or a $C_1$-$C_6$ saturated hydrocarbyl group, $R^{1C}$ is hydrogen or a $C_1$-$C_6$ saturated hydrocarbyl group which may contain halogen, hydroxy moiety, a $C_1$-$C_6$ saturated hydrocarbyloxy moiety, $C_2$-$C_6$ saturated hydrocarbylcarbonyl moiety, or $C_2$-$C_6$ saturated hydrocarbylcarbonyloxy moiety, $R^{1D}$ is a $C_1$-$C_{16}$ aliphatic hydrocarbyl group or $C_6$-$C_{12}$ aryl group, which may contain halogen, hydroxy moiety, a $C_1$-$C_6$ saturated hydrocarbyloxy moiety, $C_2$-$C_6$ saturated hydrocarbylcarbonyl moiety, or $C_2$-$C_6$ saturated hydrocarbylcarbonyloxy moiety. $R^2$ is a $C_1$-$C_4$ alkyl group, $C_1$-$C_4$ alkyloxy group, $C_2$-$C_5$ alkylcarbonyloxy group, or halogen. $R^3$, $R^4$, $R^5$, $R^6$ and $R^7$ are each independently halogen or a $C_1$-$C_{20}$ hydrocarbyl group which may contain a heteroatom, $R^3$ and $R^4$ may bond together to form a ring with the sulfur atom to which they are attached.

In a preferred embodiment, the base polymer comprises repeat units having the formula (a1) or repeat units having the formula (a2).

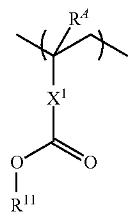

(a1)

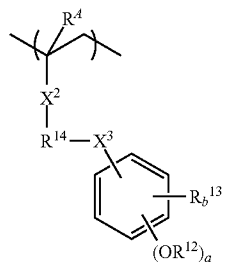

(a2)

Herein $R^A$ is each independently hydrogen or methyl. $X^1$ is a single bond, phenylene, naphthylene, or a $C_1$-$C_{12}$ linking group containing an ester bond, ether bond or lactone ring. $X^2$ is a single bond or ester bond. $X^3$ is a single bond, ether bond or ester bond. $R^{11}$ and $R^{12}$ are each independently an acid labile group. $R^{13}$ is fluorine, trifluoromethyl group, cyano group, a $C_1$-$C_6$ saturated hydrocarbyl group, $C_1$-$C_6$ saturated hydrocarbyloxy group, $C_2$-$C_7$ saturated hydrocarbylcarbonyl group, $C_2$-$C_7$ saturated hydrocarbylcarbonyloxy group, or $C_2$-$C_7$ saturated hydrocarbyloxycarbonyl group. $R^{14}$ is a single bond or a $C_1$-$C_6$ alkanediyl group in which some constituent —$CH_2$— may be replaced by an ether bond or ester bond, a is 1 or 2, and b is an integer of 0 to 4.

Typically, the resist composition is a chemically amplified positive resist composition.

In another embodiment, the base polymer is free of an acid labile group. Typically, the resist composition is a chemically amplified negative resist composition.

In a preferred embodiment, the base polymer comprises repeat units of at least one type selected from repeat units having the formulae (f1) to (f3).

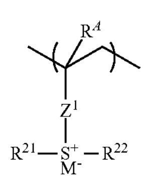

(f1)

-continued

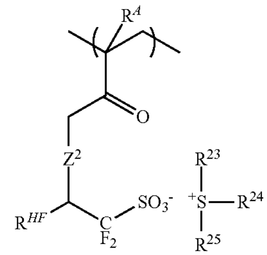

(f2)

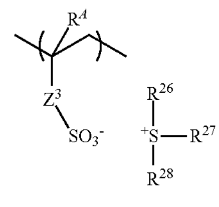

(f3)

Herein $R^A$ is each independently hydrogen or methyl. $Z^1$ is a single bond, a $C_1$-$C_6$ aliphatic hydrocarbylene group, phenylene group, naphthylene group, or $C_7$-$C_{18}$ group obtained by combining the foregoing, or —O—$Z^{11}$—, —C(═O)—O—$Z^{11}$— or —C(═O)—NH—$Z^{11}$—, wherein $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety. $Z^2$ is a single bond, —$Z^{21}$—C(═O)—O—, —$Z^{21}$— or —$Z^{21}$—O—C(═O)—, wherein $Z^{21}$ is a $C_1$-$C_{12}$ saturated hydrocarbylene group which may contain a carbonyl moiety, ester bond or ether bond. $Z^3$ is a single bond, methylene, ethylene, phenylene, fluorinated phenylene, trifluoromethyl-substituted phenylene group, —O—$Z^{31}$—, —C(═O)—O—$Z^{31}$—, or —C(═O)—NH—$Z^{31}$—, wherein $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety. $R^{21}$ to $R^{28}$ are each independently halogen or a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached. $R^{HF}$ is hydrogen or trifluoromethyl. $M^-$ is a non-nucleophilic counter ion.

The resist composition may further comprise an organic solvent, a quencher, and/or a surfactant.

In another aspect, the invention provides a pattern forming process comprising the steps of applying the resist composition defined above onto a substrate to form a resist film thereon, exposing the resist film to high-energy radiation, and developing the exposed resist film in a developer.

Preferably, the high-energy radiation is ArF excimer laser of wavelength 193 nm, KrF excimer laser of wavelength 248 nm, EB, or EUV of wavelength 3 to 15 nm.

Advantageous Effects of Invention

The sulfonium or iodonium salt of a fluorinated sulfonic acid having a phenylene group which is substituted with an iodized phenyl-containing group and a nitro group is characterized in that the nitro group serves to control acid diffusion so that the acid diffusion distance is made uniform. Since iodine is highly absorptive to EUV of wavelength 13.5 nm and the nitro group is polarizable, the iodine atom and nitro group generate secondary electrons during light exposure, contributing to a high sensitivity. An increase of photon absorption by iodine atom leads to an improvement in physical contrast. Owing to these advantages, a resist composition having a high sensitivity, minimal LWR and improved CDU can be designed.

DESCRIPTION OF EMBODIMENTS

As used herein, the singular forms "a," "an" and "the" include plural referents unless the context clearly dictates otherwise. The notation (Cn-Cm) means a group containing from n to m carbon atoms per group. As used herein, the term "iodized" or "fluorinated" indicates that a compound contains iodine or fluorine; and the terms "group" and "moiety" are interchangeable. In chemical formulae, the broken line designates a valence bond.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity

Resist Composition

One embodiment of the invention is a resist composition comprising a base polymer and an acid generator, the acid generator containing a sulfonium salt having the formula (A-1) or an iodonium salt having the formula (A-2). The sulfonium or iodonium salt is an acid generator capable of generating a fluorinated sulfonic acid having a phenylene group which is substituted with an iodized phenyl-containing group and a nitro group, referred to as "fluorinated sulfonic acid IN," hereinafter, upon light exposure. In the resist composition, another acid generator capable of generating a different sulfonic acid, imide acid or methide acid may be added, or a base polymer having an acid generator bound thereto may be combined.

When a resist composition containing the sulfonium salt having formula (A-1) in admixture with a sulfonium salt of weaker sulfonic or carboxylic acid is exposed to radiation, the fluorinated sulfonic acid IN and the weaker sulfonic or carboxylic acid generate. Since the acid generator is not entirely decomposed, the undecomposed acid generator is present nearby. When the fluorinated sulfonic acid IN co-exists with the sulfonium salt of weaker sulfonic or carboxylic acid, an ion exchange takes place between the fluorinated sulfonic acid IN and the sulfonium salt of weaker sulfonic or carboxylic acid, whereby a salt of the fluorinated sulfonic acid IN is created and the weaker sulfonic or carboxylic acid is released. This is because the salt of fluorinated sulfonic acid IN having a higher acid strength is more stable. In contrast, when a sulfonium salt of the fluorinated sulfonic acid IN co-exists with weaker sulfonic or carboxylic acid, no ion exchange takes place. The ion exchange conforming to the order of acid strength takes place not only with sulfonium salts, but also similarly with iodonium salts. When combined with an acid generator in the form of a sulfonium or iodonium salt of the fluorinated sulfonic acid IN, a sulfonium or iodonium salt of weak acid functions as a quencher.

As the contrast of an optical image is enhanced, the dissolution contrast of a resist film is improved, leading to an improvement in LWR or CDU. Under the context that light may be described as either a wave or a particle, as the number of particles absorbed in a resist film increases, the dissolution contrast of a resist film is improved, leading to an improvement in LWR or CDU. Since iodine is highly absorptive to EUV of wavelength 13.5 nm, an acid generator having iodine introduced therein absorbs an increased number of photons, leading to an improvement in physical contrast.

While the nitro group polarizes to positive (+) and negative (−) charges, the negative charge portion generates secondary electrons during light exposure to promote decomposition of the acid generator, contributing to a higher sensitivity. Particularly when highly absorptive iodine atoms coexist in proximity to the nitro group, the number of secondary electrons generated by the nitro group increases. The effect is outstanding particularly when the substitution number of iodine is 2 or more.

The sulfonium or iodonium salt of fluorinated sulfonic acid IN is reduced in acid diffusion because an iodine atom with a large atomic weight and a nitro group capable of controlling acid diffusion are introduced in the anion. The salt is highly compatible with and thus fully dispersible in a polymer, leading to an improvement in LWR or CDU. The nitro group is hydrophilic enough to offset a lowering of solubility in alkaline developer by iodine.

The sulfonium or iodonium salt of fluorinated sulfonic acid IN exerts a LWR or CDU-improving effect, which may stand good either in positive and negative tone pattern formation by aqueous alkaline development or in negative tone pattern formation by organic solvent development.

Sulfonium or iodonium salt of fluorinated sulfonic acid having a phenylene group substituted with an iodized phenyl-containing group and a nitro group The sulfonium salt and iodonium salt used herein have the following formulae (A-1) and (A-2), respectively.

(A-1)

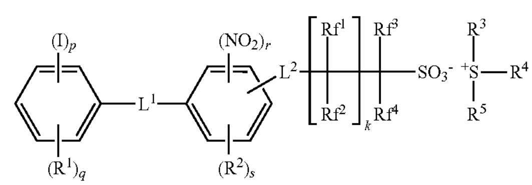

(A-2)

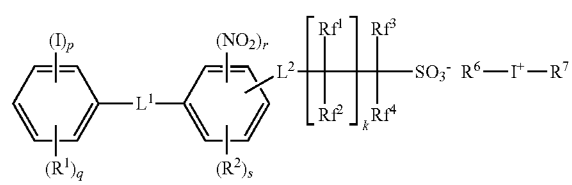

In formulae (A-1) and (A-2), k is an integer of 0 to 2, p is an integer of 1 to 5, q is an integer of 0 to 4, p+q is from 1 to 5, r is 1 or 2, s is an integer of 0 to 3, and r+s is from 1 to 4.

In formulae (A-1) and (A-2), $L^1$ is a single bond, ether bond, ester bond, amide bond, or a $C_1$-$C_6$ saturated hydrocarbylene group. In the saturated hydrocarbylene group, some constituent —$CH_2$— may be replaced by an ether bond, ester bond or amide bond. The constituent —$CH_2$— may be located at the end of the group.

The $C_1$-$C_6$ saturated hydrocarbylene group represented by $L^1$ may be straight, branched or cyclic. Examples thereof include $C_1$-$C_6$ alkanediyl groups such as methanediyl, ethane-1,1-diyl, ethane-1,2-diyl, propane-1,3-diyl, butane-1,4-diyl, pentane-1,5-diyl, and hexane-1,6-diyl; $C_3$-$C_6$ cyclic saturated hydrocarbylene groups such as cyclopropanediyl, cyclobutanediyl, cyclopentanediyl and cyclohexanediyl; and combinations thereof.

In formulae (A-1) and (A-2), $L^2$ is a single bond or a $C_1$-$C_{20}$ divalent linking group which may contain oxygen, sulfur or nitrogen.

Suitable $C_1$-$C_{20}$ divalent linking groups include ester bonds, amide bonds, and $C_1$-$C_{20}$ hydrocarbylene groups. The hydrocarbylene groups may be saturated or unsaturated and straight, branched or cyclic. Examples thereof include $C_1$-$C_{20}$ alkanediyl groups such as methanediyl, ethane-1,1-diyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, and dodecane-1,12-diyl; $C_3$-$C_{20}$ cyclic saturated hydrocarbylene groups such as cyclopentanediyl, cyclohexanediyl, norbornanediyl, and adamantanediyl; $C_2$-$C_{20}$ unsaturated aliphatic hydrocarbylene groups such as vinylene, propene-1,3-diyl, and 2-butene-1,4-diyl; $C_6$-$C_{20}$ arylene groups such as phenylene and naphthylene; and combinations thereof. In the hydrocarbylene group, some constituent —$CH_2$— may be replaced by an ester bond, ether bond, amide bond or sulfonic ester bond. The constituent —$CH_2$— may be located at the end of the group.

In formulae (A-1) and (A-2), $Rf^1$ to $Rf^4$ are each independently hydrogen, fluorine or trifluoromethyl, at least one of $Rf^1$ to $Rf^4$ being fluorine or trifluoromethyl. In case of k=0, at least one of $Rf^3$ and $Rf^4$ is preferably fluorine or trifluoromethyl. In case of k=1, at least one of $Rf^1$ to $Rf^4$ is preferably fluorine or trifluoromethyl. In case of k=2, at least one of $Rf^1$ and $Rf^2$ attached to β-carbon relative to —$SO_3$, and $Rf^3$ and $Rf^4$ is preferably fluorine or trifluoromethyl.

In formulae (A-1) and (A-2), $R^1$ is a hydroxy, carboxy, fluorine, chlorine, bromine, or amino group, or a $C_1$-$C_{20}$ hydrocarbyl group, $C_1$-$C_{20}$ hydrocarbyloxy group, $C_2$-$C_{20}$ hydrocarbyloxycarbonyl group, $C_2$-$C_{20}$ hydrocarbylcarbonyloxy group, or $C_1$-$C_{20}$ hydrocarbylsulfonyloxy group, which may contain fluorine, chlorine, bromine, hydroxy, amino or ether bond, or —$N(R^{1A})(R^{1B})$, —$N(R^{1C})$—C(═O)—$R^{1D}$, or —$N(R^{1C})$—C(═O)—O—$R^{1D}R^{1A}$ and $R^{1B}$ are each independently hydrogen or a $C_1$-$C_6$ saturated hydrocarbyl group. $R^{1C}$ is hydrogen or a $C_1$-$C_6$ saturated hydrocarbyl group which may contain halogen, hydroxy moiety, a $C_1$-$C_6$ saturated hydrocarbyloxy moiety, $C_2$-$C_6$ saturated hydrocarbylcarbonyl moiety, or $C_2$-$C_6$ saturated hydrocarbylcarbonyloxy moiety. $R^{1D}$ is a $C_1$-$C_{16}$ aliphatic hydrocarbyl group or $C_6$-$C_{12}$ aryl group, which may contain halogen, hydroxy moiety, a $C_1$-$C_6$ saturated hydrocarbyloxy moiety, $C_2$-$C_6$ saturated hydrocarbylcarbonyl moiety, or $C_2$-$C_6$ saturated hydrocarbylcarbonyloxy moiety.

The $C_1$-$C_{20}$ saturated hydrocarbyl group, and the hydrocarbyl moiety in the $C_1$-$C_{20}$ hydrocarbyloxy, $C_2$-$C_{20}$ hydrocarbyloxycarbonyl, $C_2$-$C_{20}$ hydrocarbylcarbonyloxy and $C_1$-$C_{20}$ hydrocarbylsulfonyloxy group, represented by $R^1$, may be straight, branched or cyclic. Examples include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl, and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl, and adamantyl; $C_2$-$C_{20}$ alkenyl groups such as vinyl, propenyl, butenyl and hexenyl; $C_2$-$C_{20}$ cyclic unsaturated aliphatic hydrocarbyl groups such as cyclohexenyl and norbornenyl; $C_2$-$C_{20}$ alkynyl groups such as ethynyl, propynyl and butynyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl; $C_7$-$C_{20}$ aralkyl groups such as benzyl and phenethyl; and combinations thereof.

The $C_1$-$C_6$ saturated hydrocarbyl groups represented by $R^{1A}$, $R^{1B}$ and $R^{1C}$ may be straight, branched or cyclic. Examples thereof include $C_1$-$C_6$ alkyl groups such as methyl, ethyl, n-propyl, isopropyl, n-butyl, isobutyl, sec-butyl, tert-butyl, n-pentyl, and n-hexyl; and $C_3$-$C_6$ cyclic saturated hydrocarbyl groups such as cyclopropyl, cyclobutyl, cyclopentyl and cyclohexyl. Examples of the saturated hydrocarbyl moiety in the $C_1$-$C_6$ saturated hydrocarbyloxy group that $R^{1C}$ may contain include those exemplified above for the saturated hydrocarbyl group. Examples of the saturated hydrocarbyl moiety in the $C_2$-$C_6$ saturated hydrocarbylcarbonyl group and $C_2$-$C_6$ saturated hydrocarbylcarbonyloxy group that $R^{1C}$ may contain include those exemplified above for the $C_1$-$C_6$ saturated hydrocarbyl group, but of 1 to 5 carbon atoms.

The aliphatic hydrocarbyl group represented by $R^{1D}$ may be saturated or unsaturated, and straight, branched or cyclic. Examples thereof include $C_1$-$C_{16}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl and pentadecyl; $C_3$-$C_{16}$ cyclic saturated hydrocarbyl groups such as cyclopropyl, cyclopentyl, cyclohexyl, cyclopropylmethyl, 4-methylcyclohexyl, cyclohexylmethyl, norbornyl and adamantyl; $C_2$-$C_{16}$ alkenyl groups such as vinyl, propenyl, butenyl and hexenyl; $C_2$-$C_{20}$ alkynyl groups such as ethynyl, propynyl and butynyl; $C_3$-$C_{16}$ cyclic unsaturated aliphatic hydrocarbyl groups such as cyclohexenyl and norbornenyl; and combinations thereof. Examples of the $C_6$-$C_{12}$ aryl group $R^{1D}$ include phenyl and naphthyl. Examples of the hydrocarbyl moiety in the $C_1$-$C_6$ saturated hydrocarbyloxy group that $R^{1D}$ may contain include those exemplified above for the $C_1$-$C_6$ saturated hydrocarbyl group represented by $R^{1A}$, $R^{1B}$ and $R^{1C}$. Examples of the saturated hydrocarbyl moiety in the $C_2$-$C_6$ saturated hydrocarbylcarbonyl group and $C_2$-$C_6$ saturated hydrocarbylcarbonyloxy group that $R^{1D}$ may contain include those exemplified above for the $C_1$-$C_6$ saturated hydrocarbyl group, but of 1 to 5 carbon atoms.

In formulae (A-1) and (A-2), $R^2$ is a $C_1$-$C_4$ alkyl group, $C_1$-$C_4$ alkyloxy group, $C_2$-$C_5$ alkylcarbonyloxy group, or halogen. Examples of the alkyl group and alkyl moiety in the alkyloxy and alkylcarbonyloxy groups include methyl, ethyl, n-propyl, isopropyl, n-butyl, isobutyl, sec-butyl and tert-butyl. Suitable halogen atoms include fluorine, chlorine, bromine and iodine.

In formulae (A-1) and (A-2), $R^3$, $R^4$, $R^5$, $R^6$ and $R^7$ are each independently halogen or a $C_1$-$C_{20}$ hydrocarbyl group which may contain a heteroatom.

Suitable halogen atoms represented by $R^3$ to $R^7$ include fluorine, chlorine, bromine and iodine.

The $C_1$-$C_{20}$ hydrocarbyl groups represented by $R^3$ to $R^7$ may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl; $C_3$-$C_{20}$ saturated cyclic hydrocarbyl groups such as cyclopropyl, cyclopentyl, cyclohexyl, cyclopropylmethyl, 4-methylcyclohexyl, cyclohexylmethyl, norbornyl, and adamantyl; $C_2$-$C_{20}$ alkenyl groups such as vinyl, propenyl, butenyl, and hexenyl; $C_2$-$C_{20}$ alkynyl groups such as ethynyl, propynyl and butynyl; $C_3$-$C_{20}$ cyclic unsaturated aliphatic hydrocarbyl groups such as cyclohexenyl and norbomenyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl; $C_7$-$C_{20}$ aralkyl groups such as benzyl and phenethyl; and combinations thereof.

In the hydrocarbyl groups, some or all of the hydrogen atoms may be substituted by a moiety containing a heteroatom such as oxygen, sulfur, nitrogen or halogen, or some constituent —$CH_2$— may be replaced by a moiety containing a heteroatom such as oxygen, sulfur or nitrogen, so that the group may contain a hydroxy moiety, fluorine, chlorine, bromine, iodine, cyano moiety, nitro moiety, carbonyl moiety, ether bond, ester bond, sulfonic ester bond, carbonate bond, lactone ring, sultone ring, carboxylic anhydride (—C(═O)—O—C(═O)—) or haloalkyl moiety.

Also, $R^3$ and $R^4$ may bond together to form a ring with the sulfur atom to which they are attached. Preferred examples of the ring are shown by the following structures.

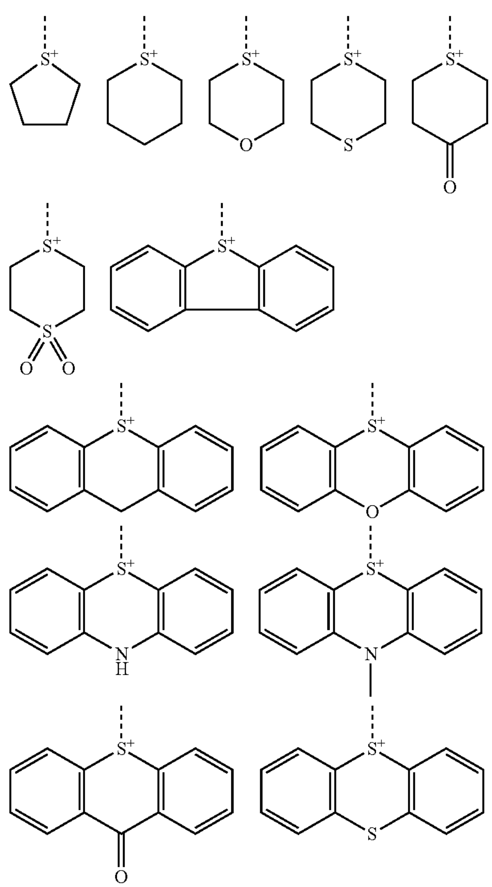

-continued

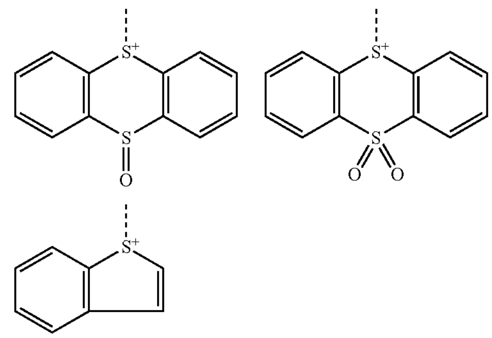

Herein the broken line designates a point of attachment to $R^5$.

Examples of the cation in the sulfonium salt having formula (A-1) are shown below, but not limited thereto.

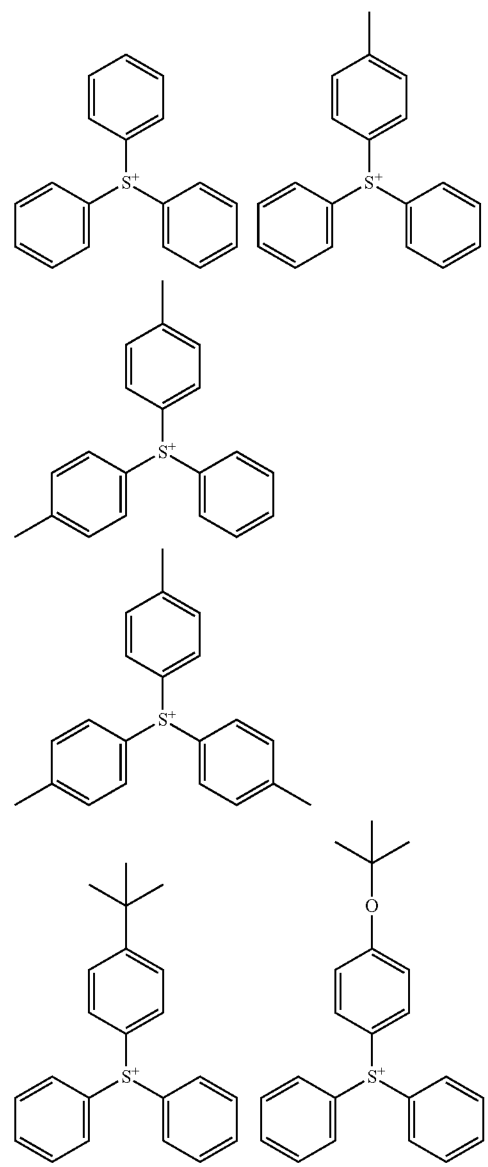

-continued
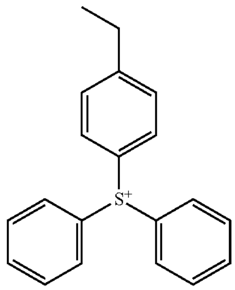
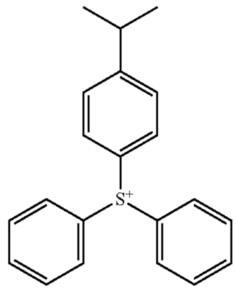
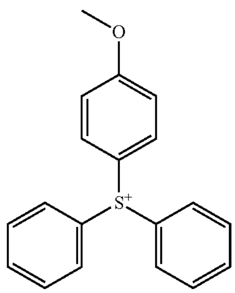
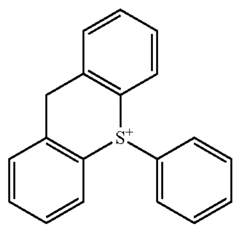
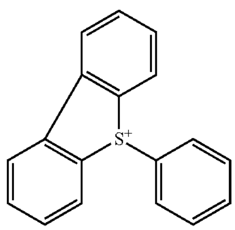
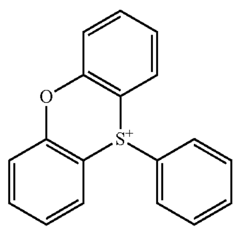
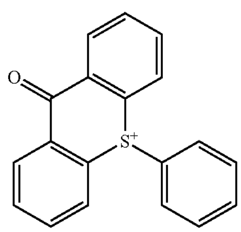
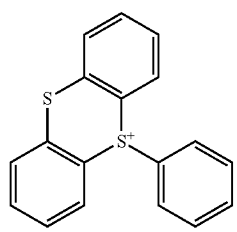
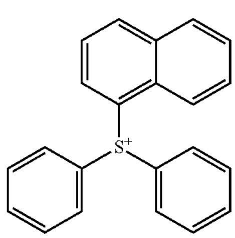
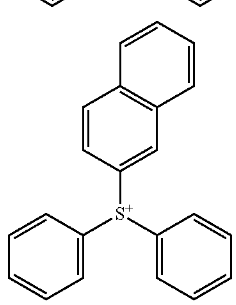
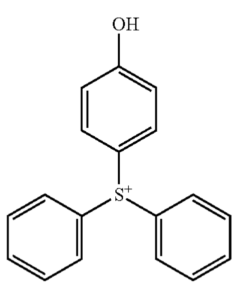
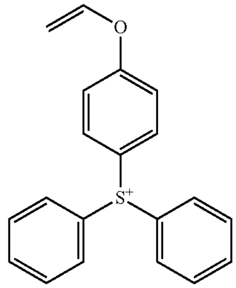
-continued
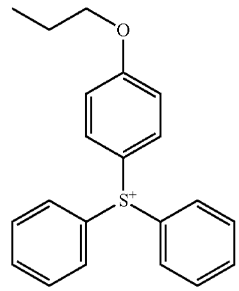
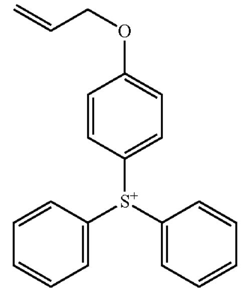
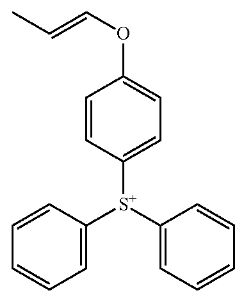
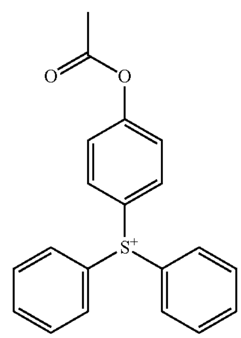
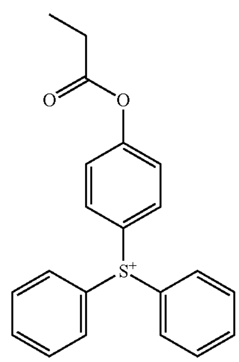
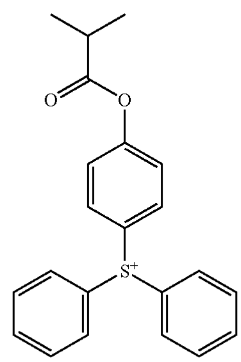
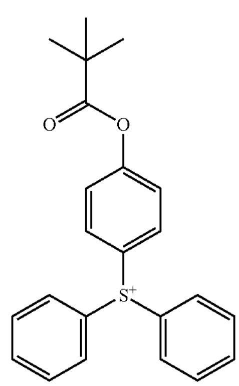
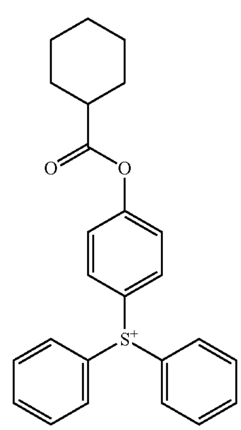

-continued
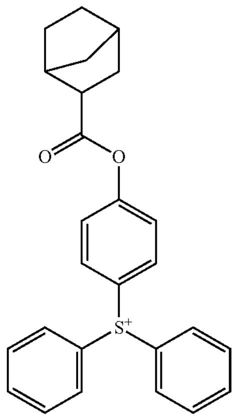
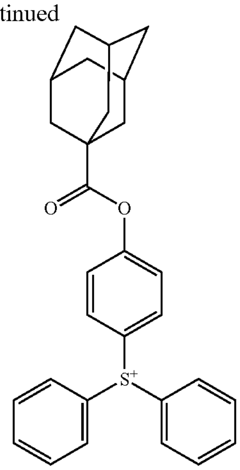
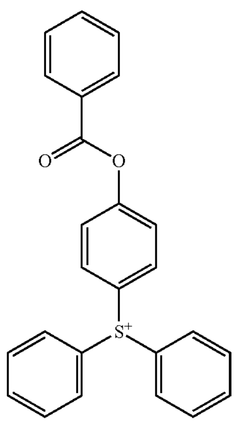
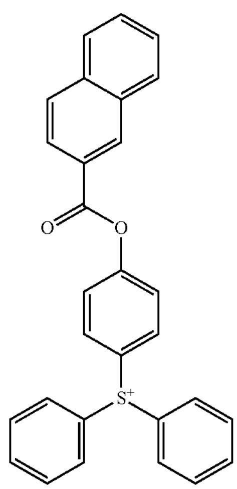
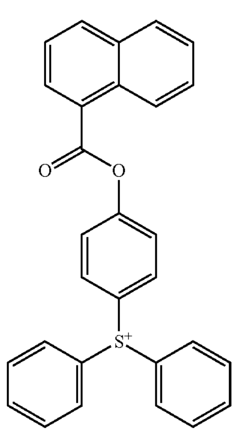
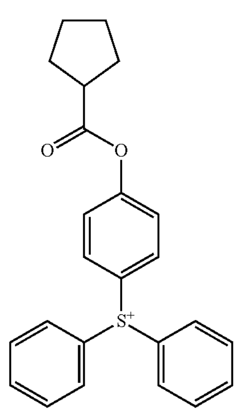
-continued
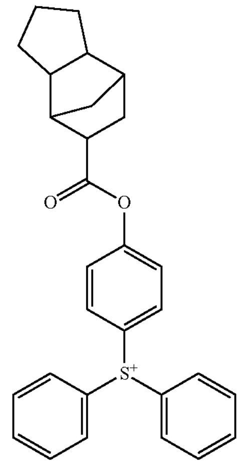
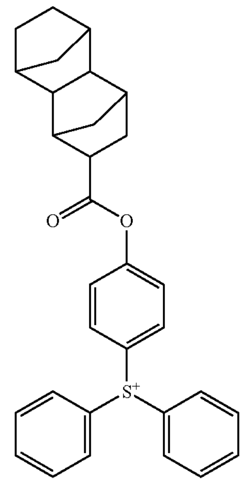
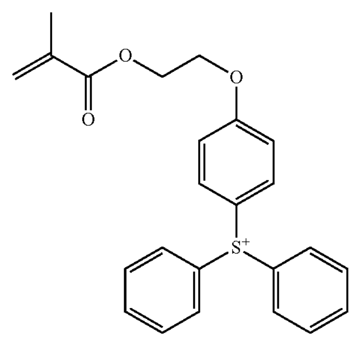
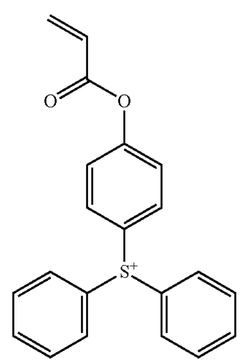
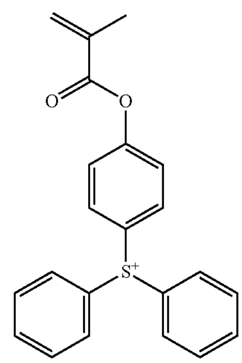
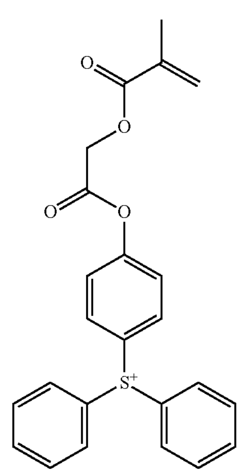

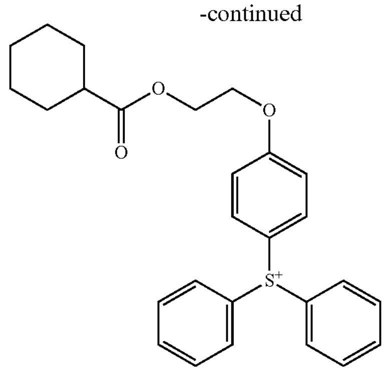
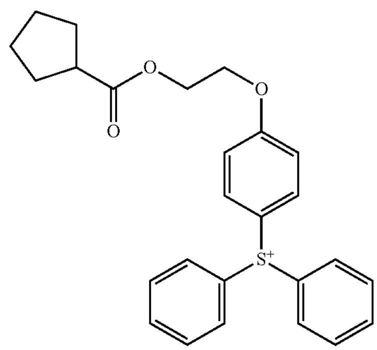
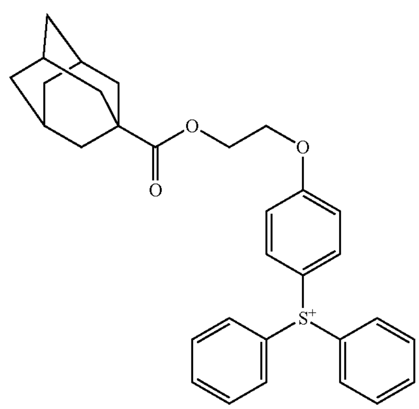
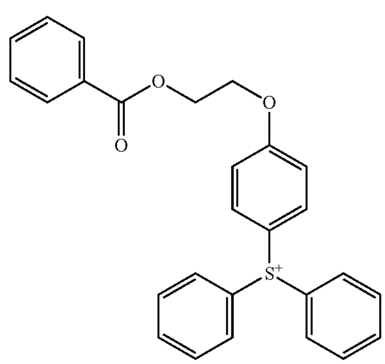
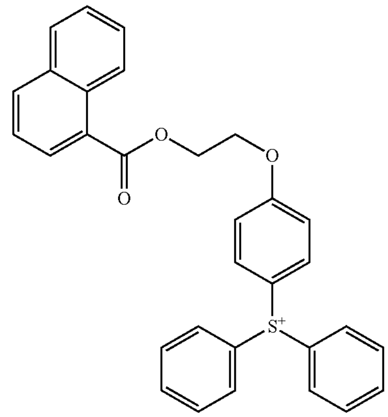
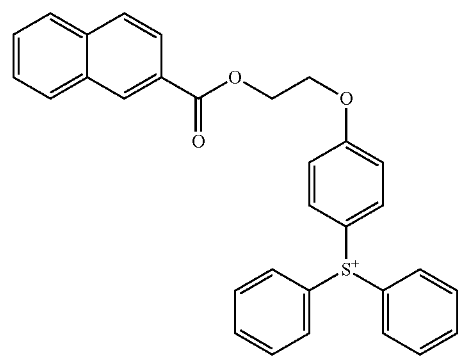
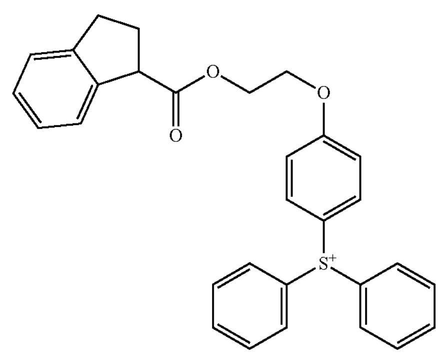
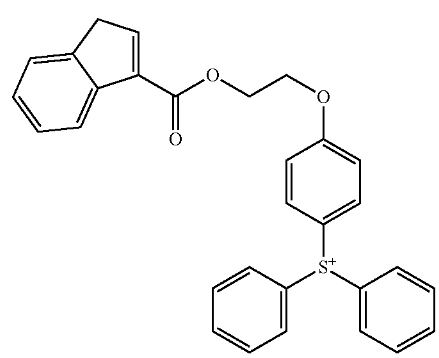

-continued
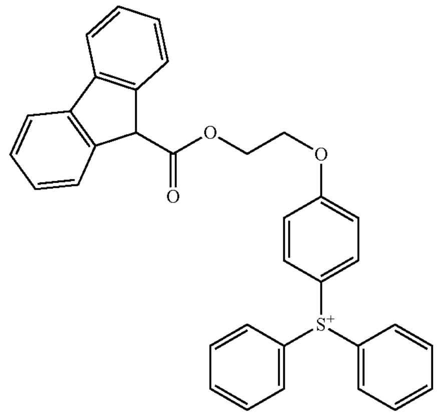
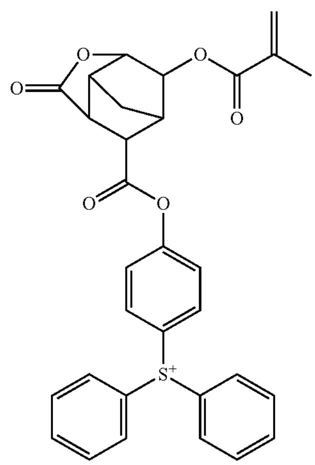
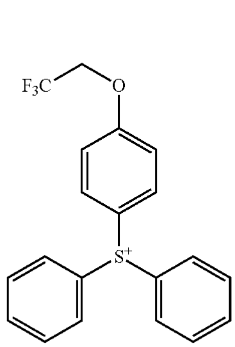
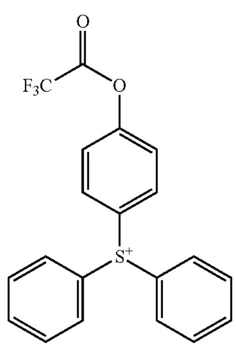
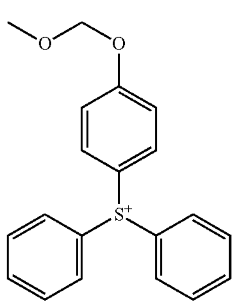
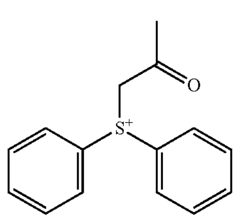
-continued
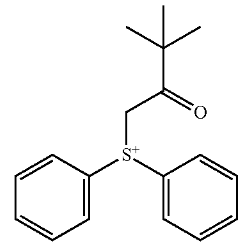
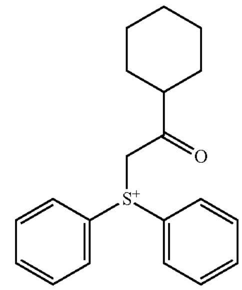
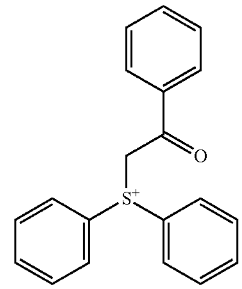
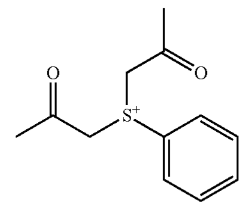
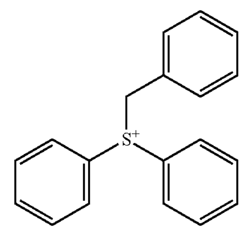
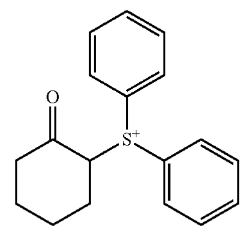
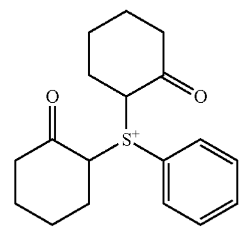
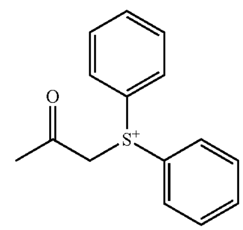
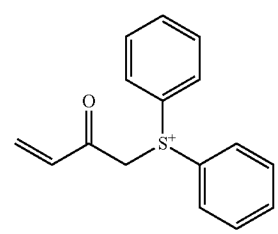
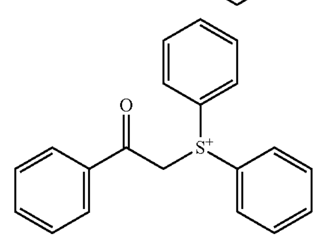
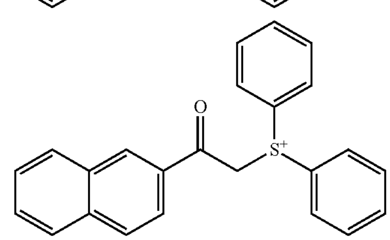

-continued
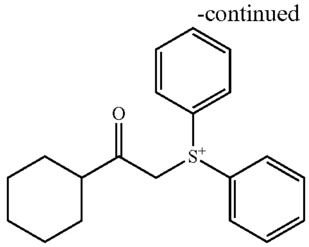
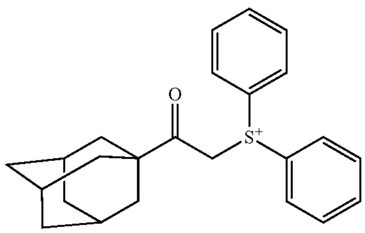
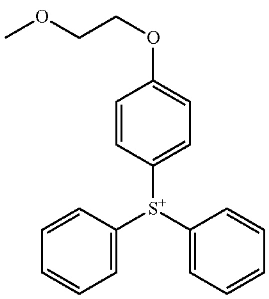
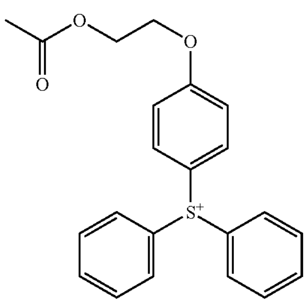
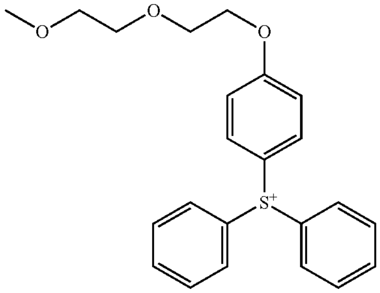
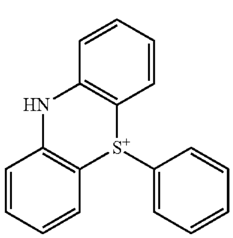
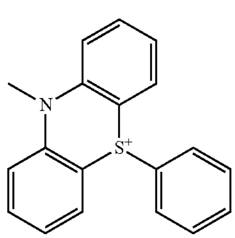
-continued
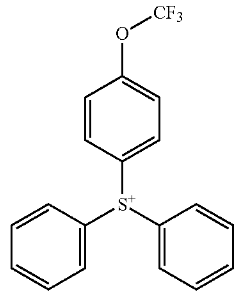
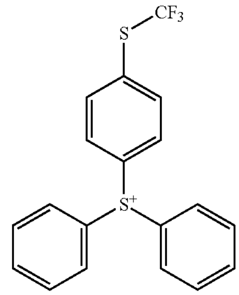
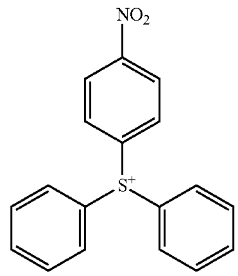
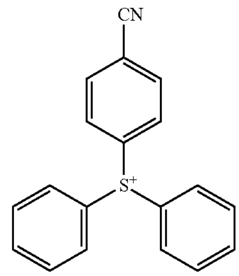
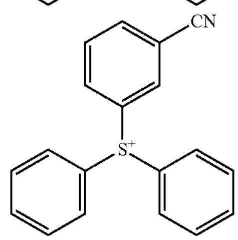
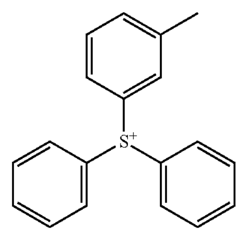
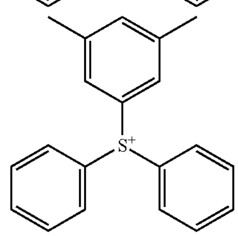
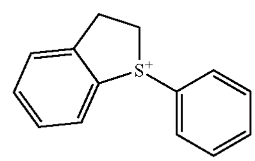
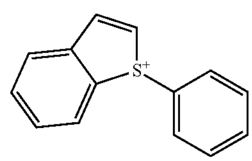
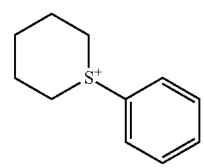
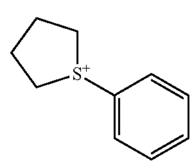
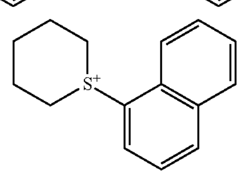
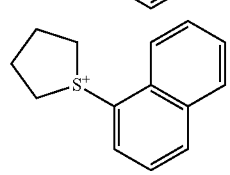
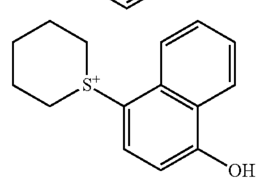
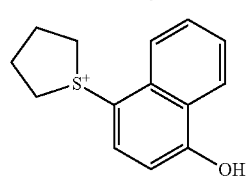
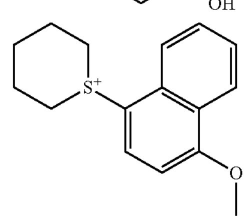

-continued
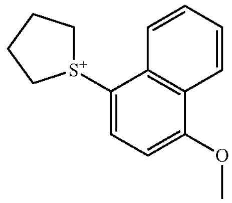
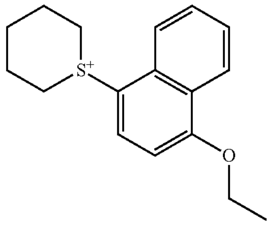
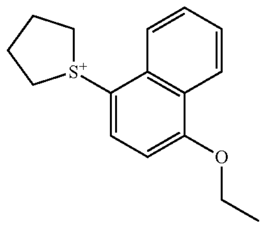
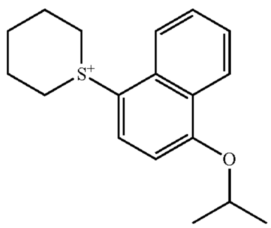
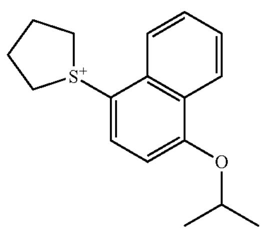
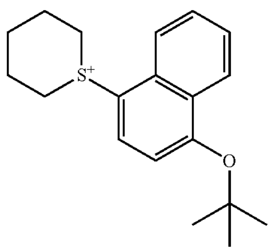
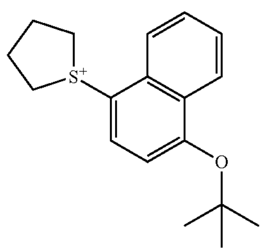
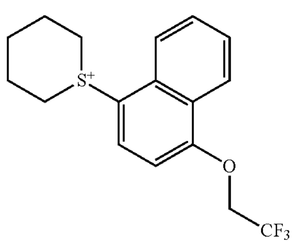
-continued
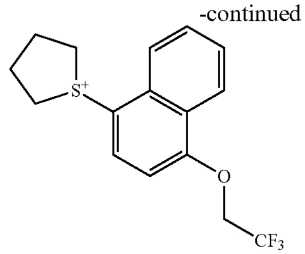
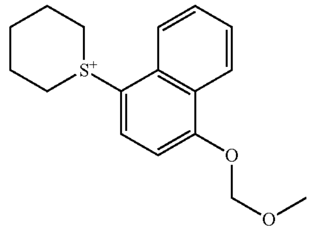
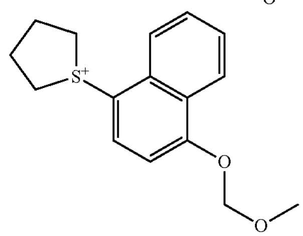
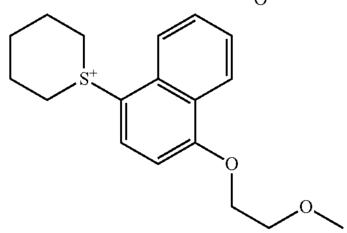
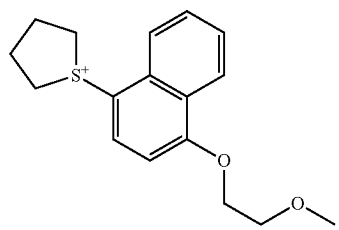
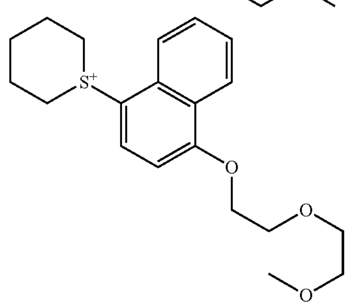
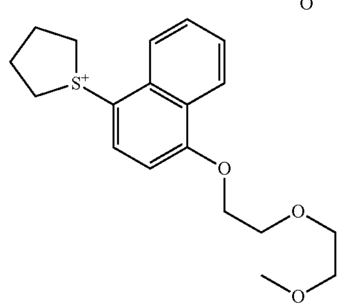

-continued
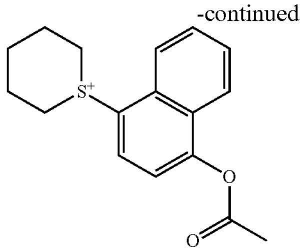
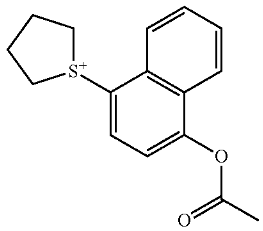
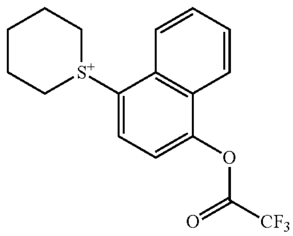
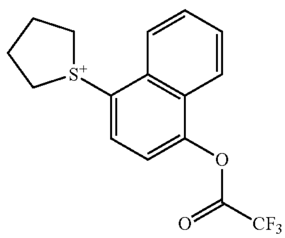
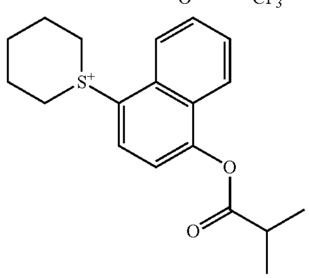
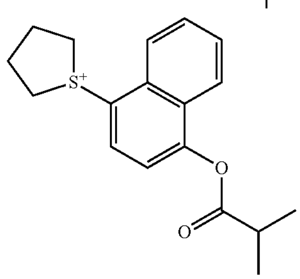
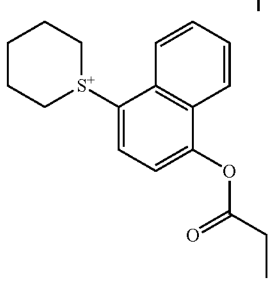
-continued
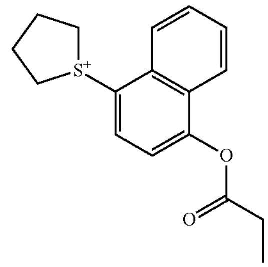
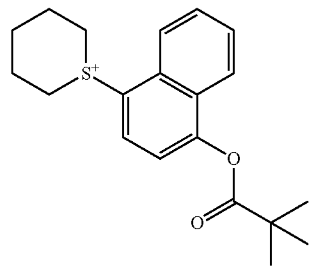
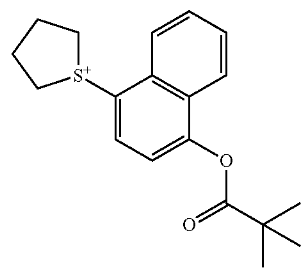
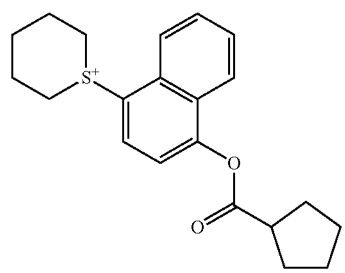
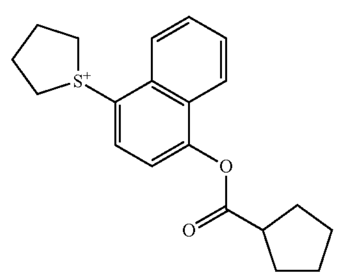
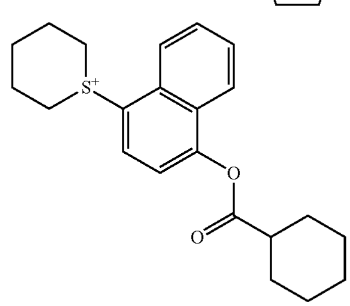

-continued
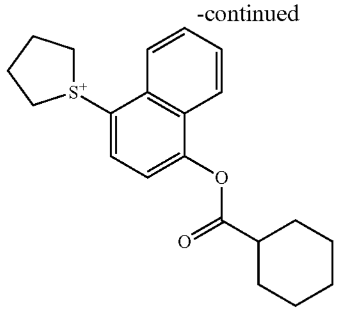
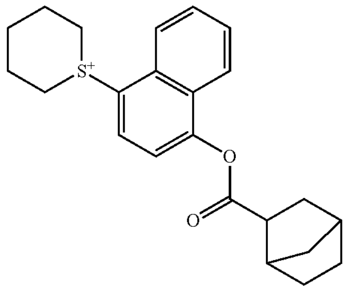
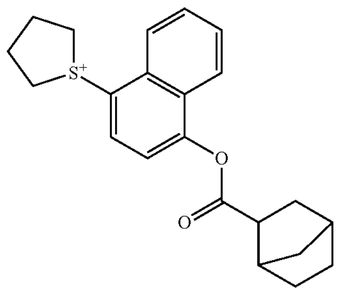
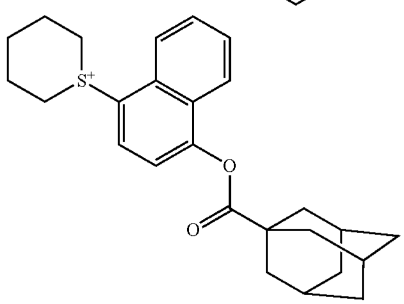
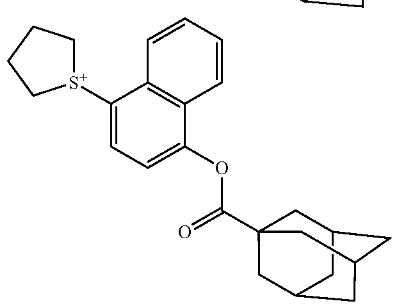
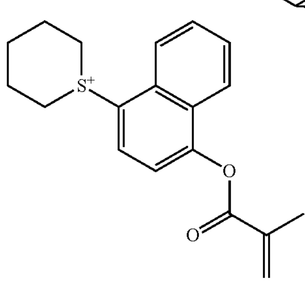
-continued
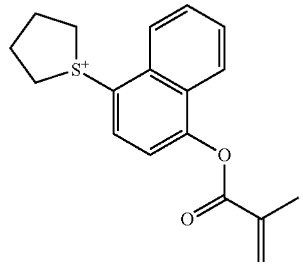
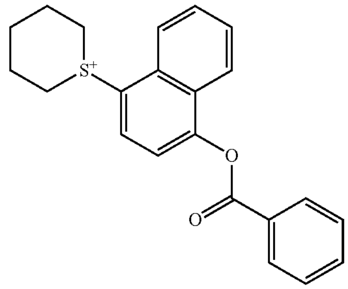
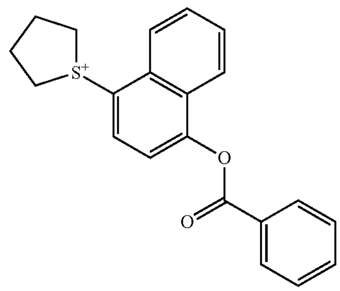
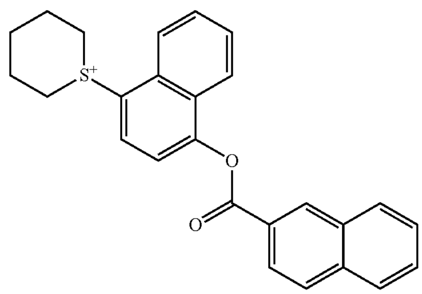
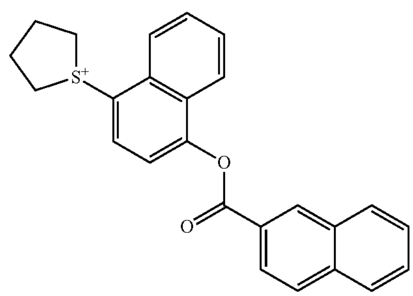
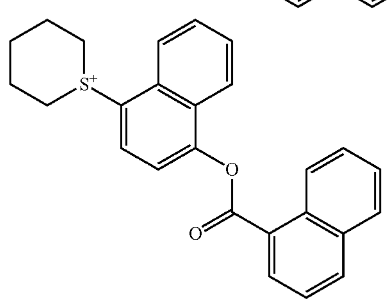

-continued
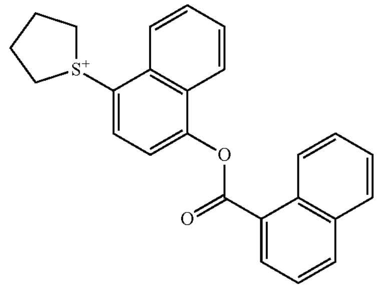
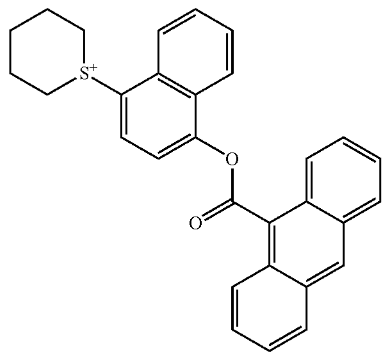
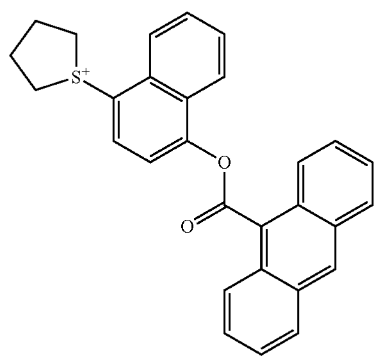
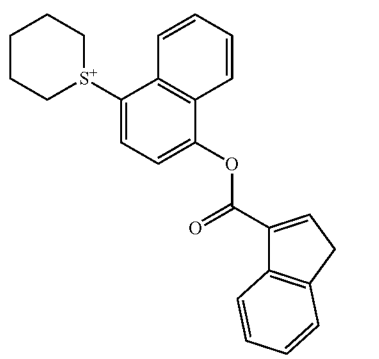
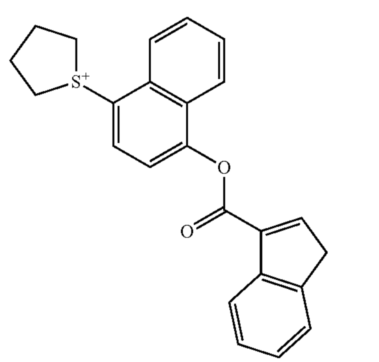
-continued
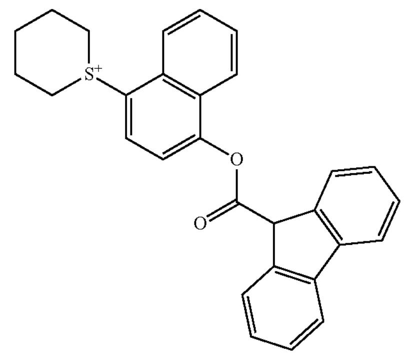
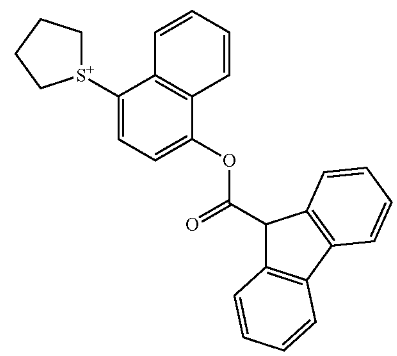
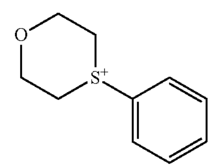
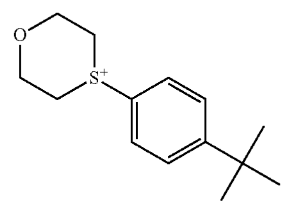
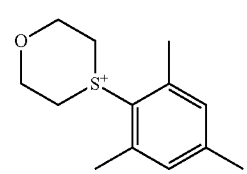
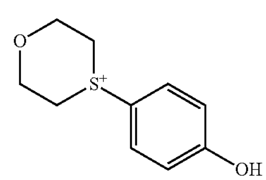
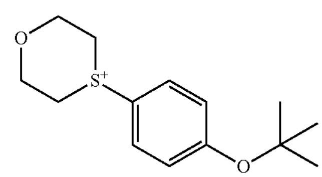
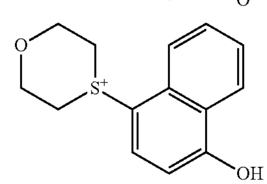
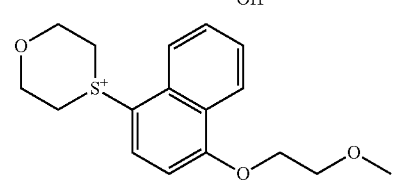

-continued
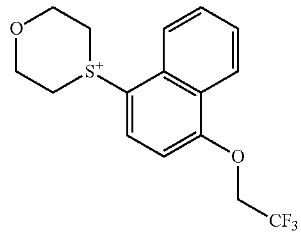
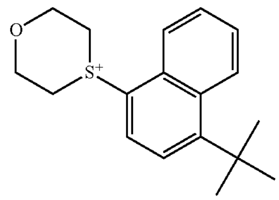
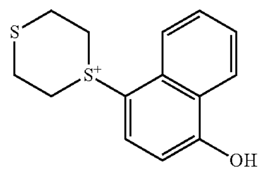
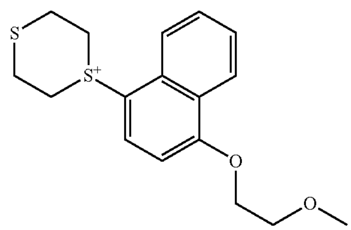
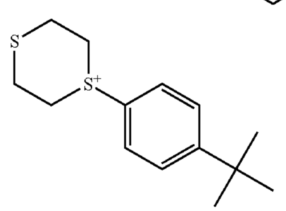
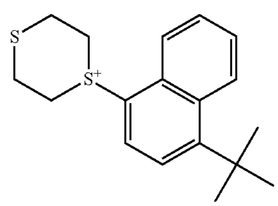
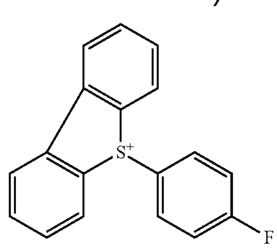
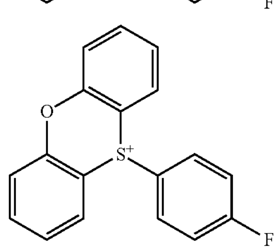
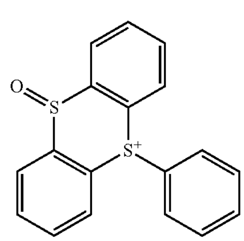
-continued
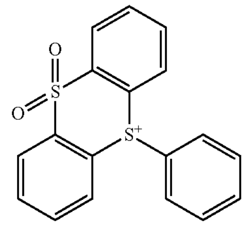
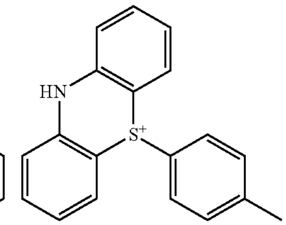
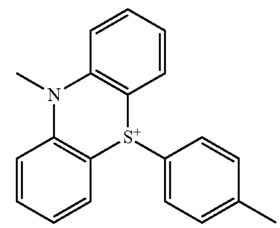
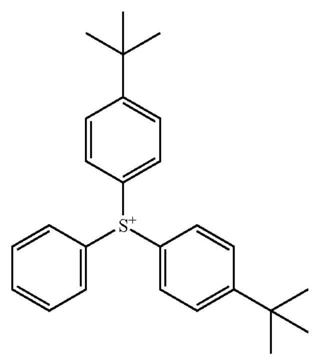
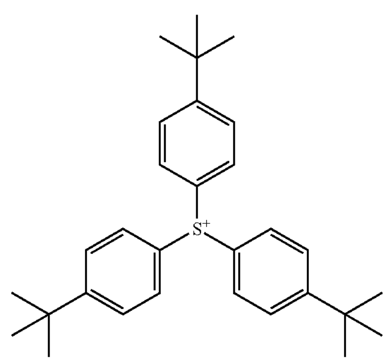
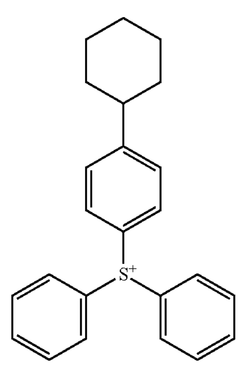

-continued
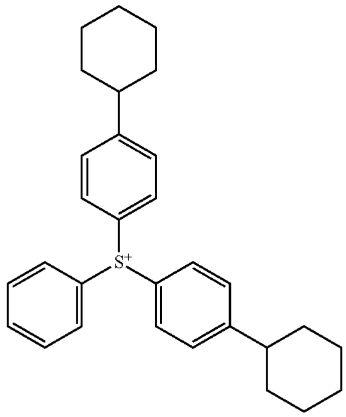
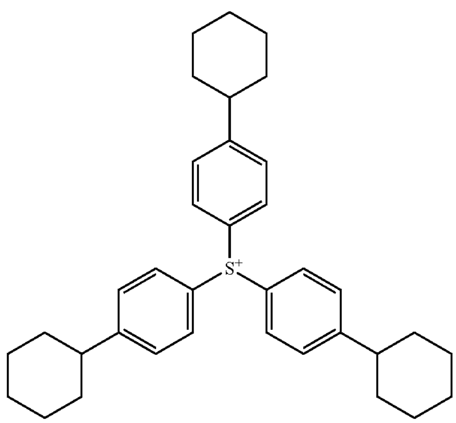
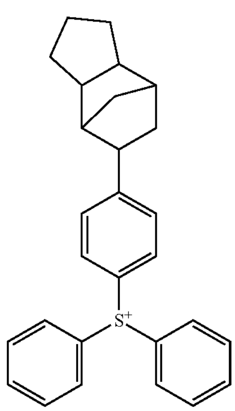
-continued
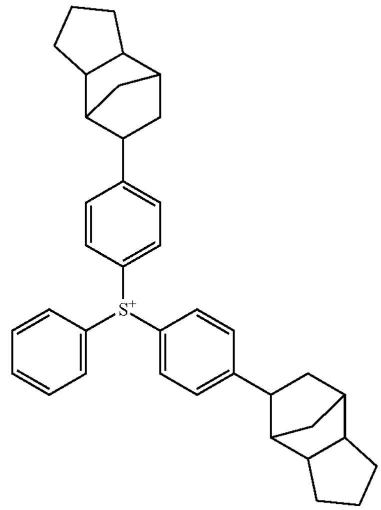
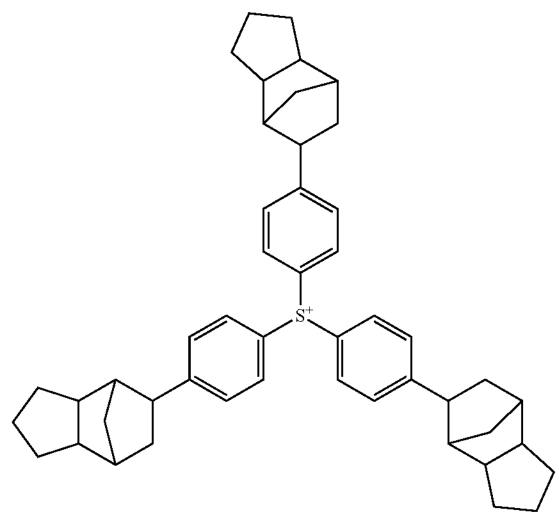
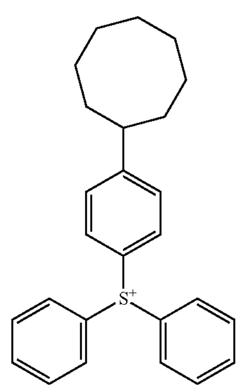

-continued
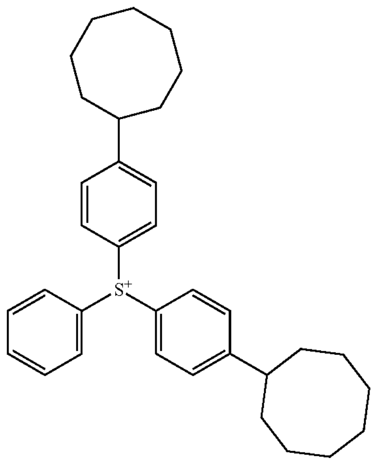
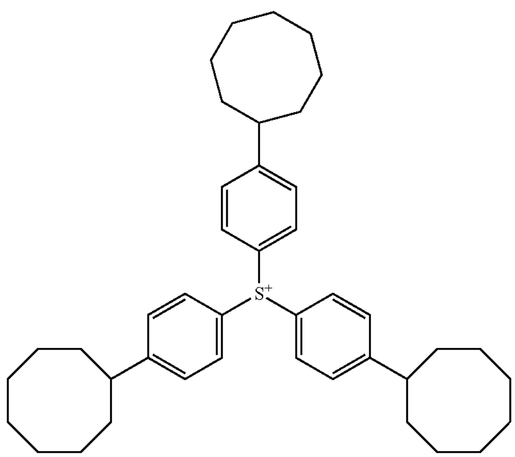
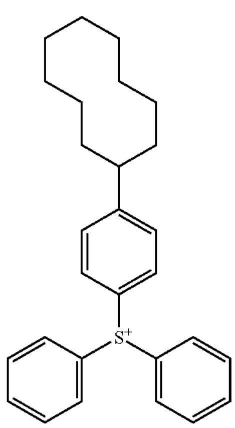
-continued
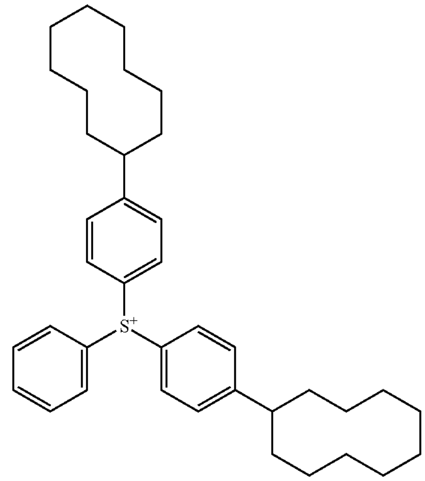
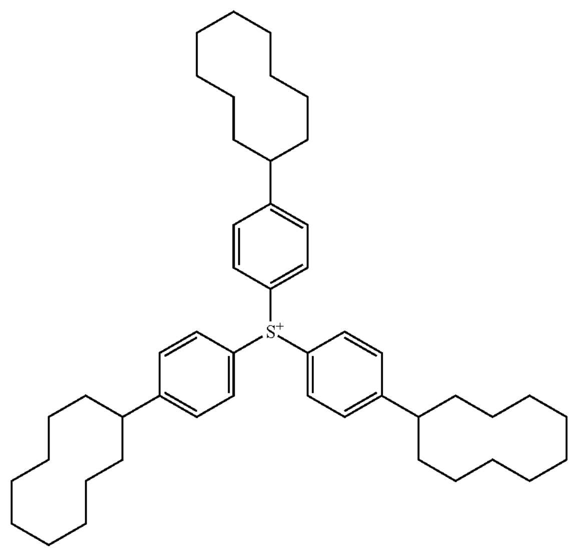
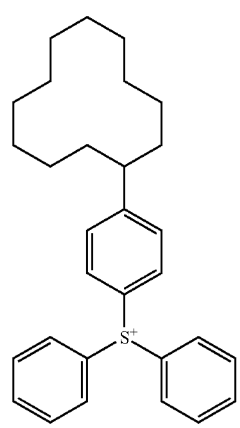

-continued
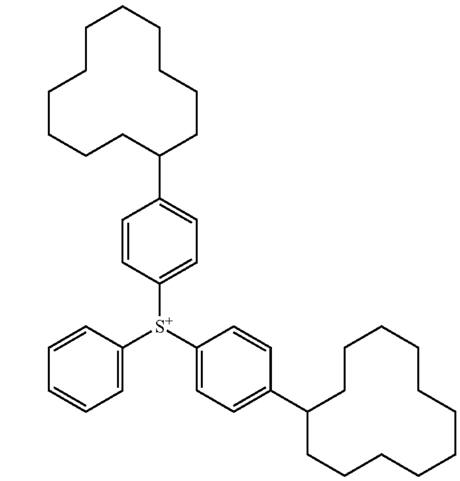
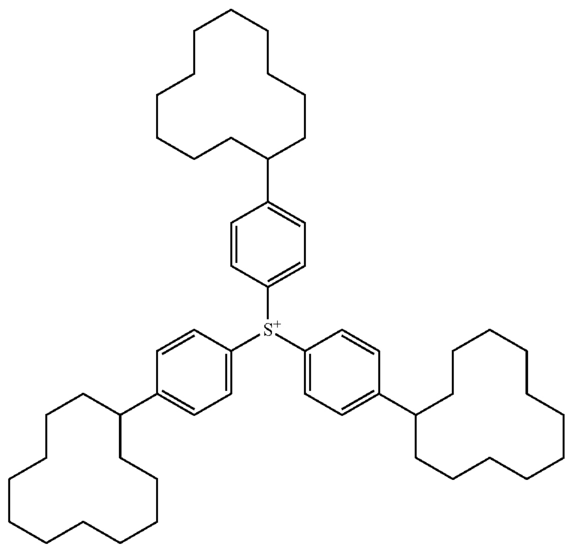
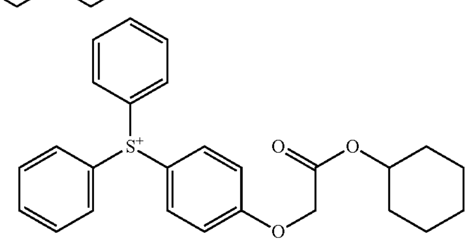
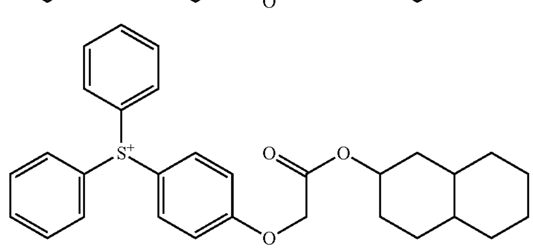
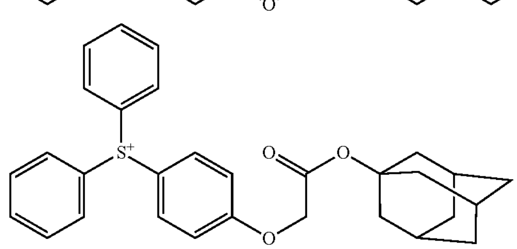
-continued
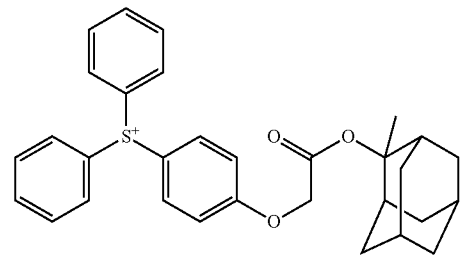
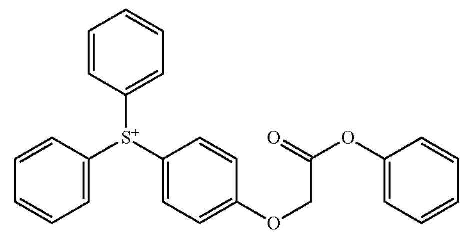
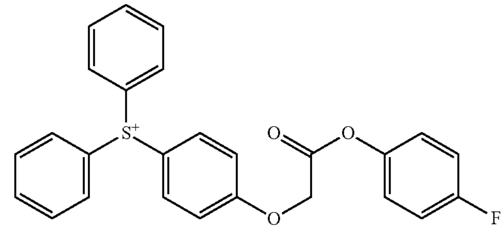
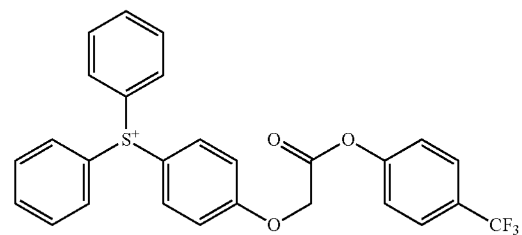
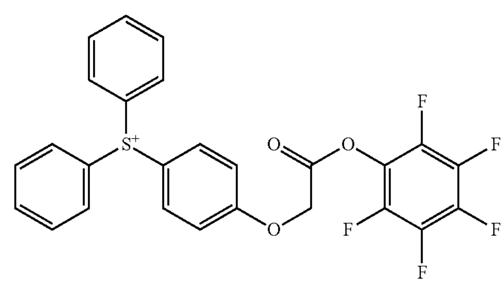
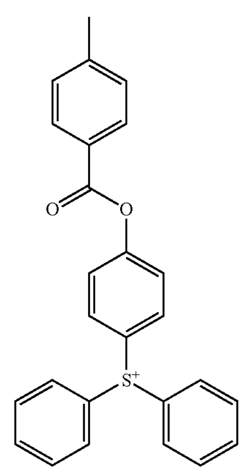
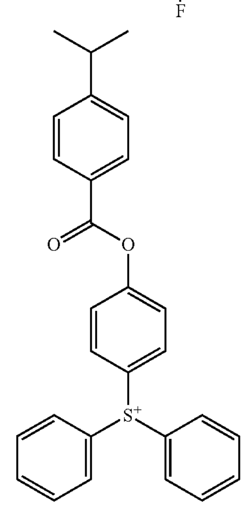

-continued
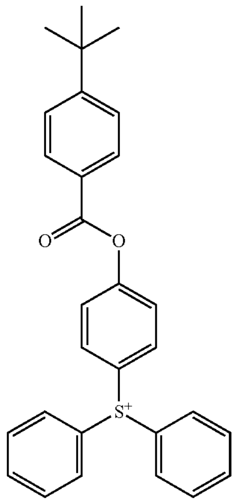
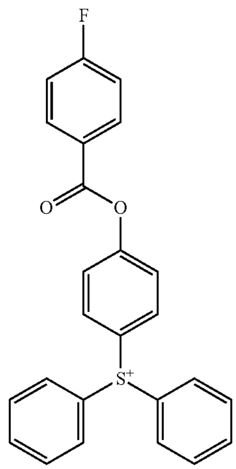
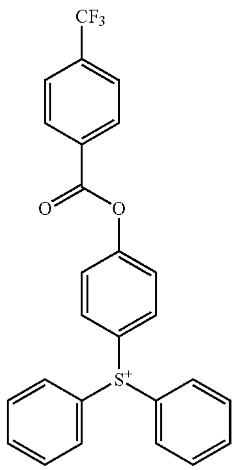
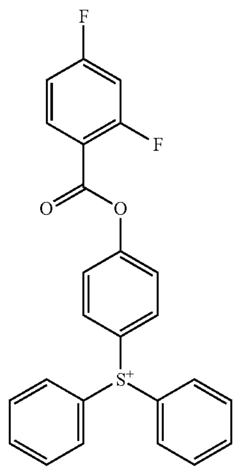
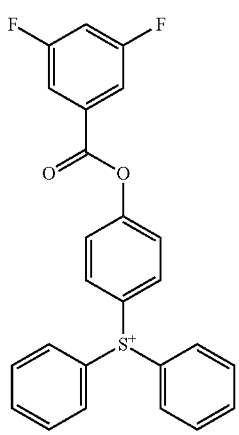
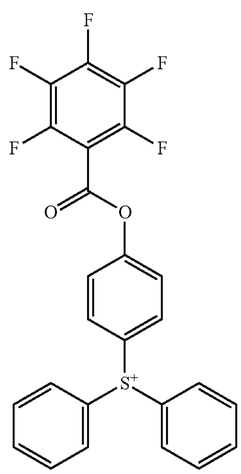
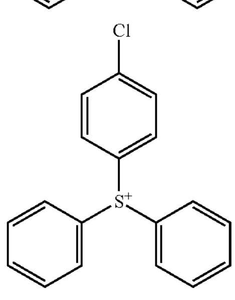
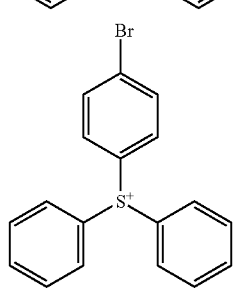
-continued
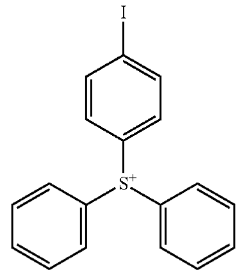
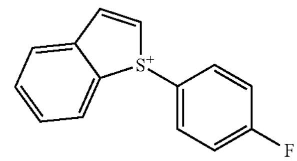
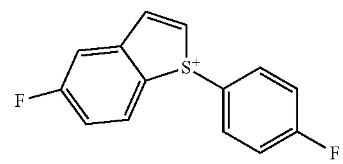
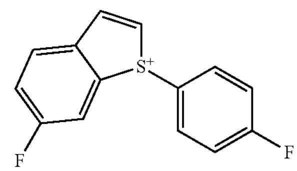
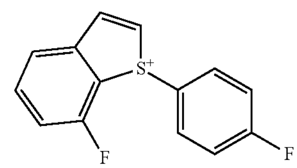
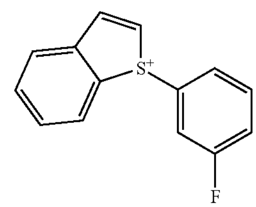
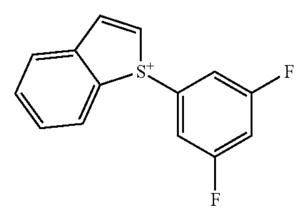
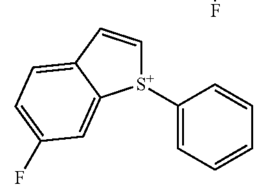
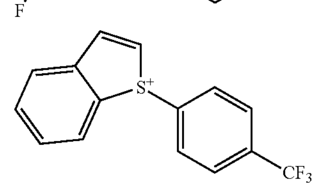
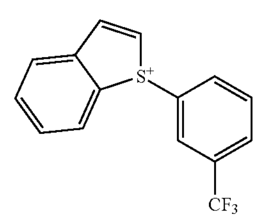
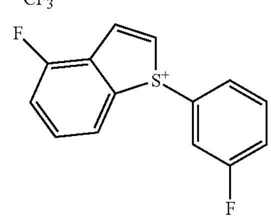

-continued
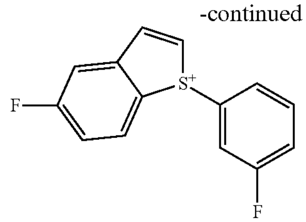
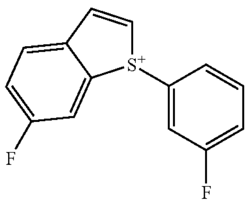
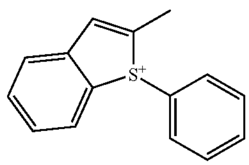
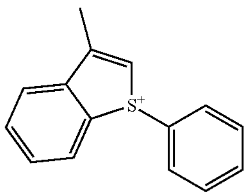
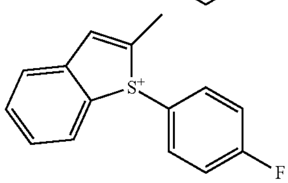
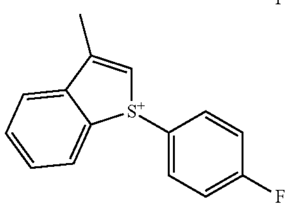
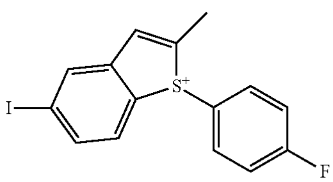
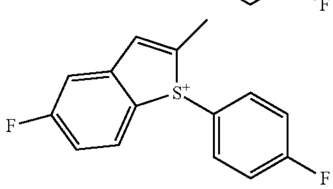
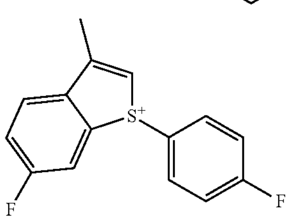
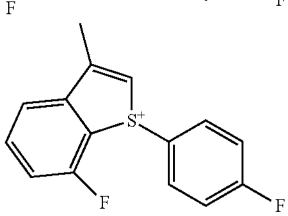
-continued
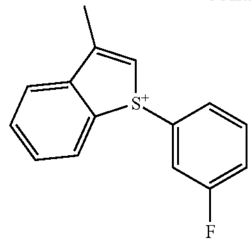
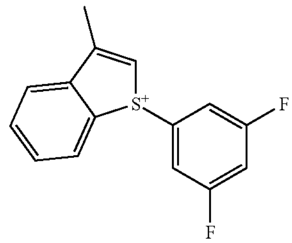
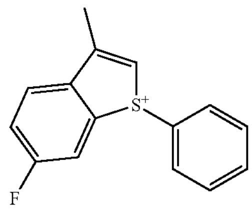
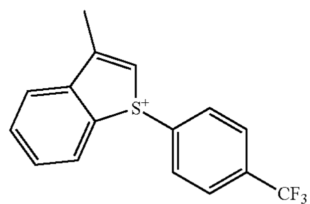
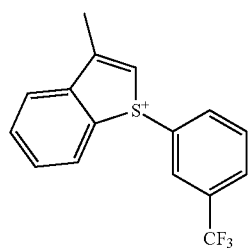
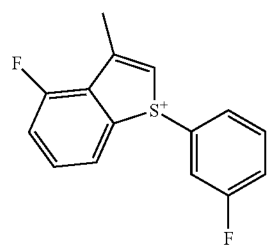
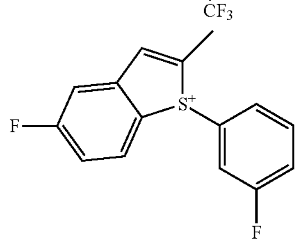
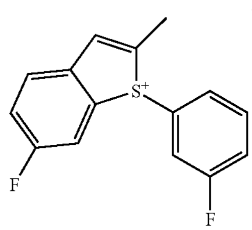
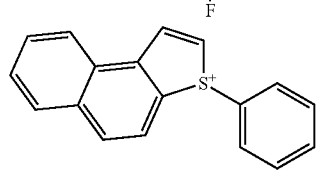

-continued
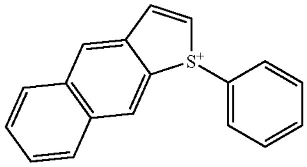
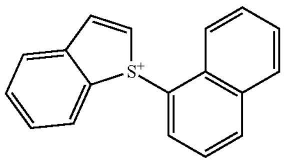
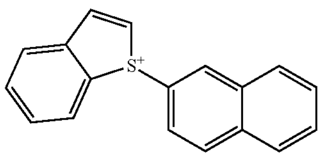
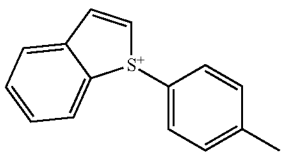
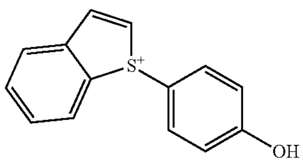
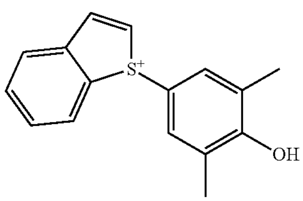
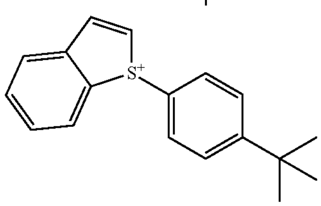
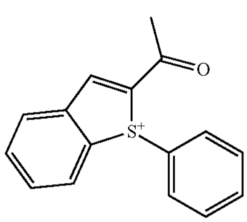
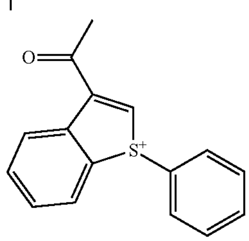
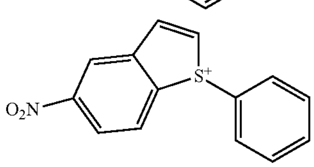
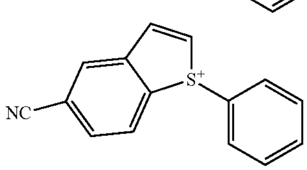
-continued
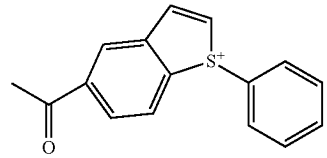
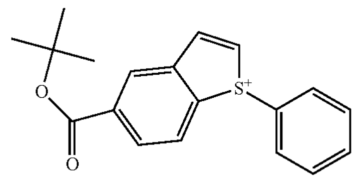
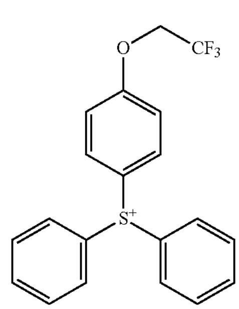
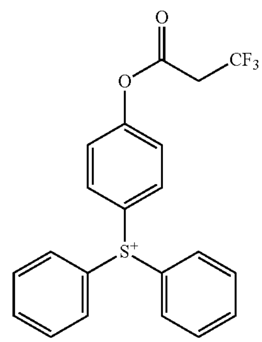
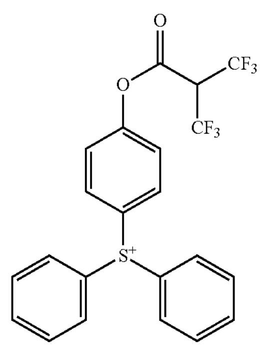
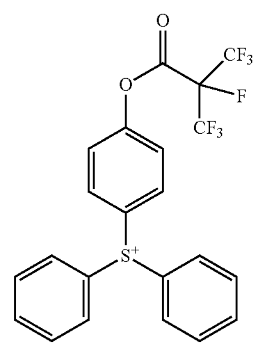
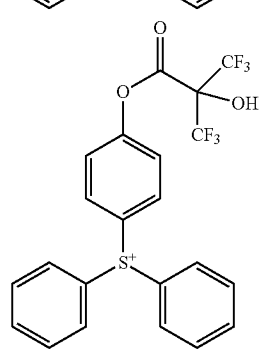
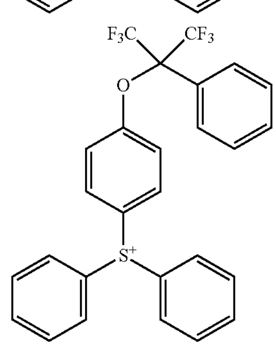

-continued
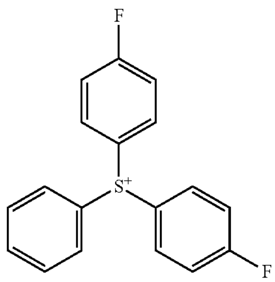
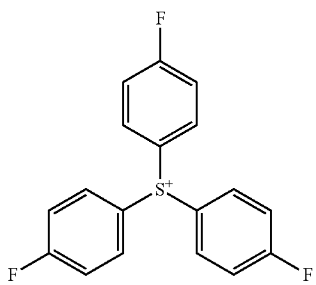
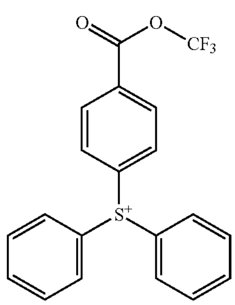
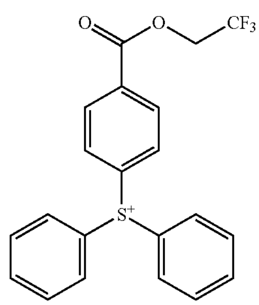
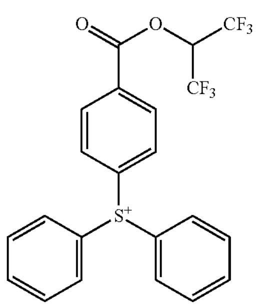
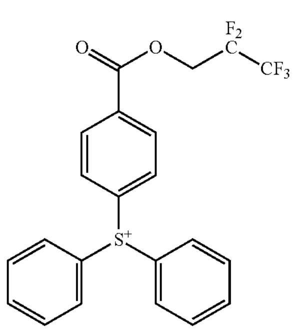
-continued
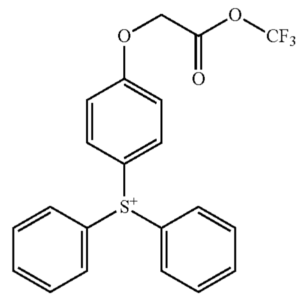
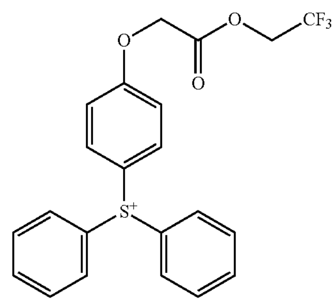
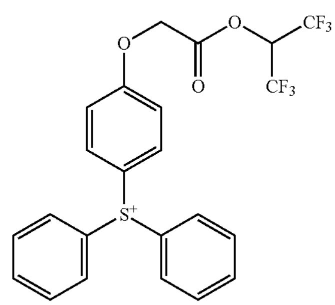
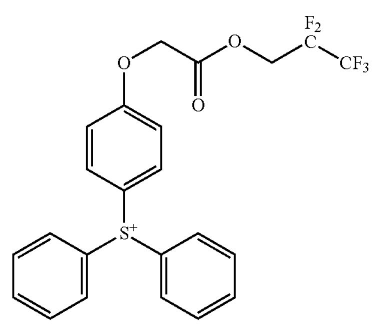
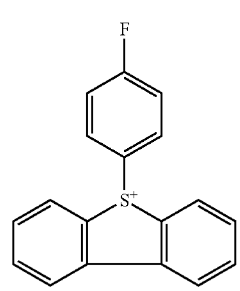
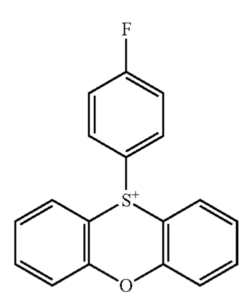

-continued
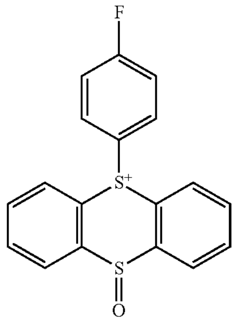
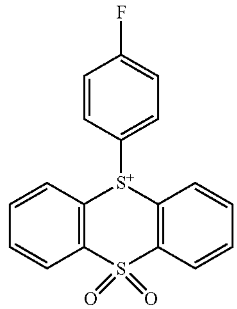
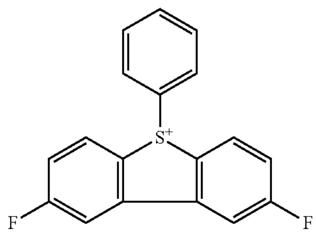
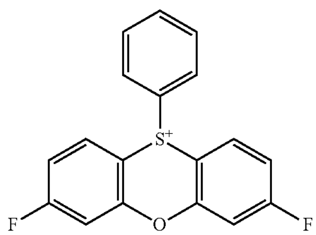
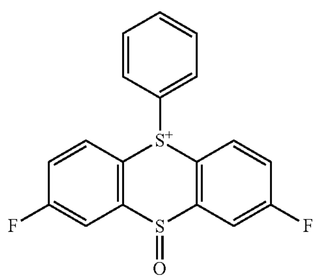
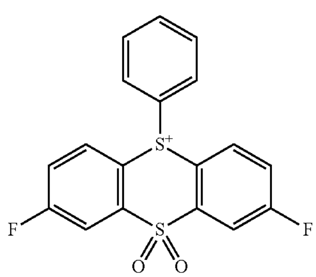
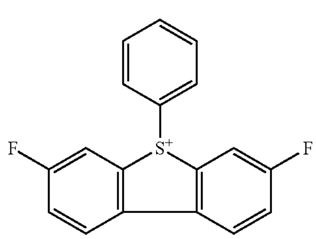
-continued
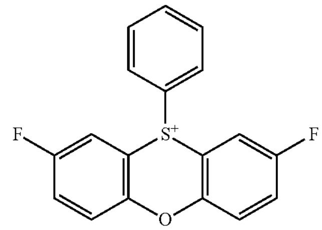
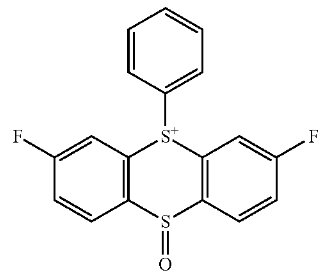
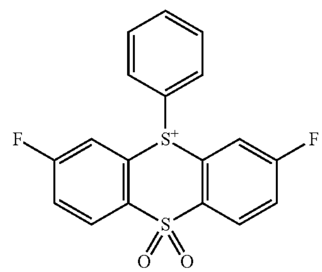
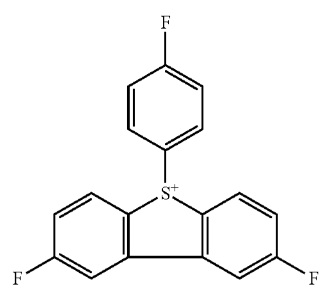
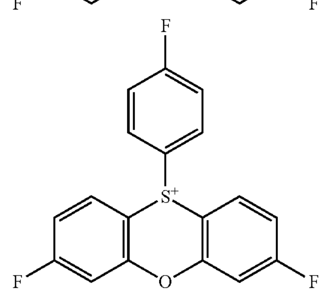
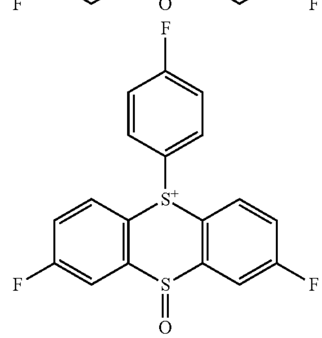

-continued
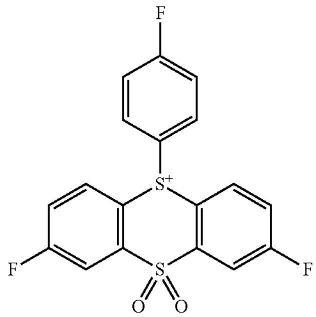
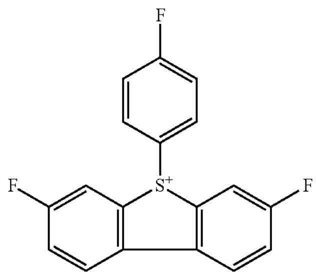
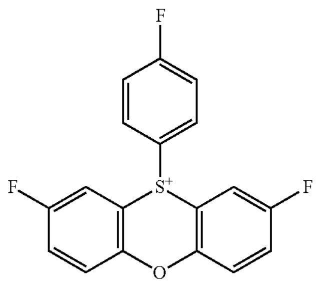
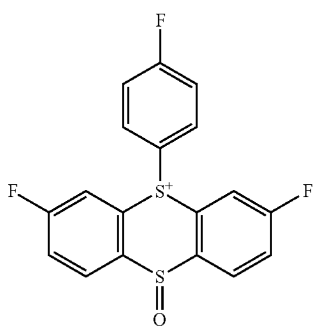
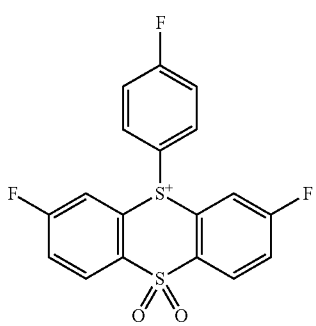
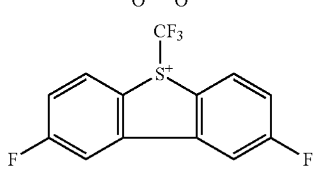
-continued
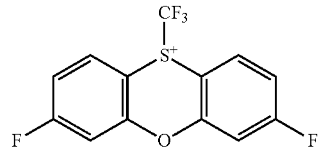
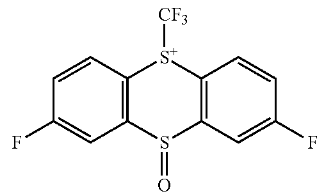
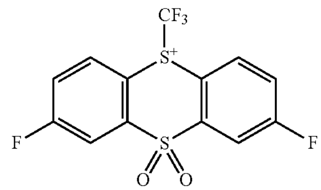
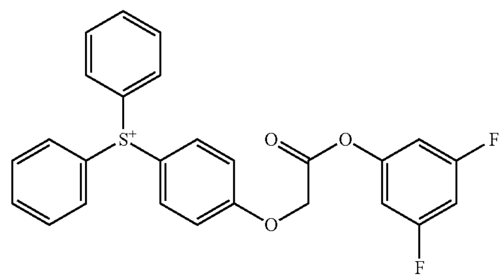
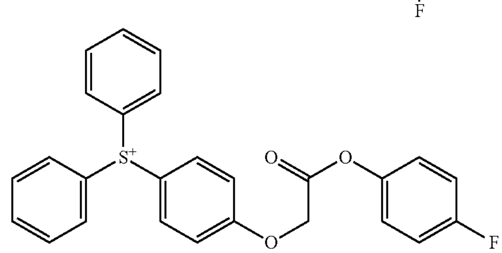
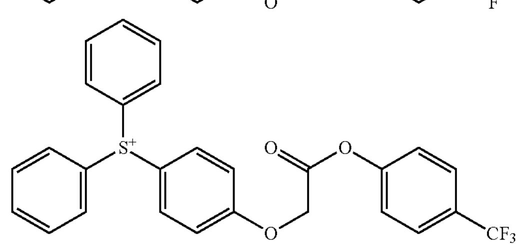
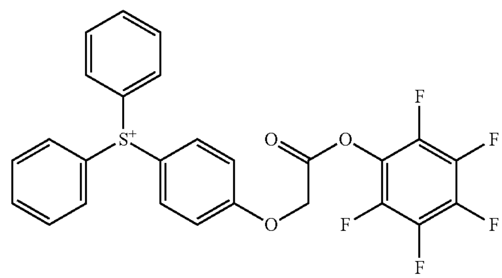

-continued
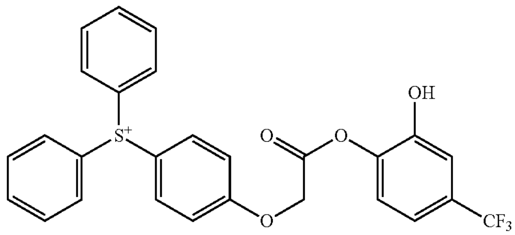
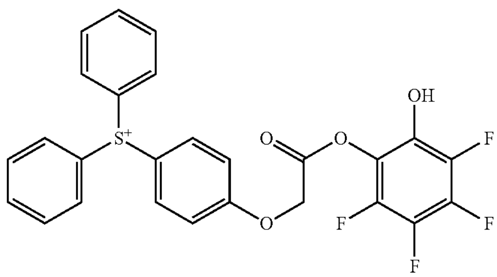
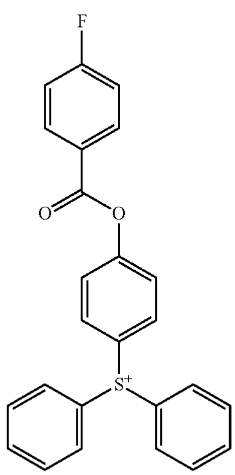
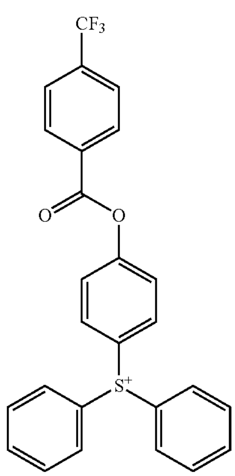
-continued
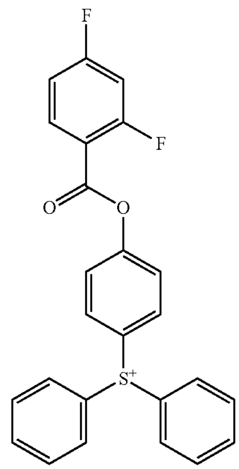
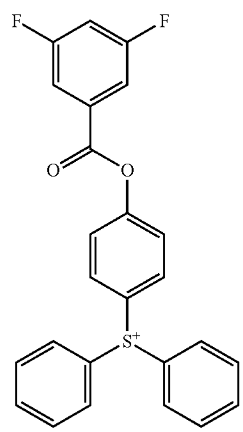
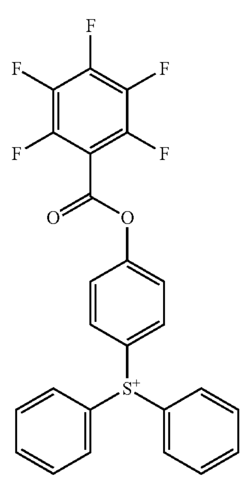

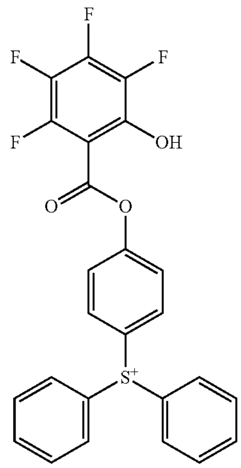
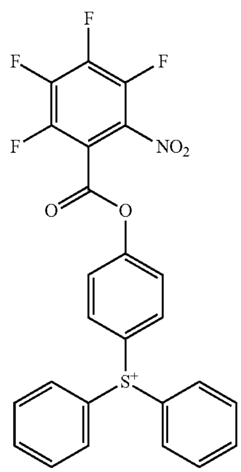
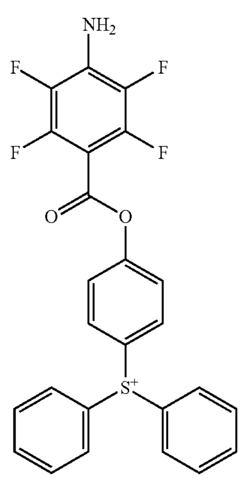
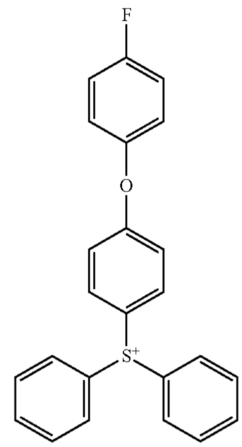
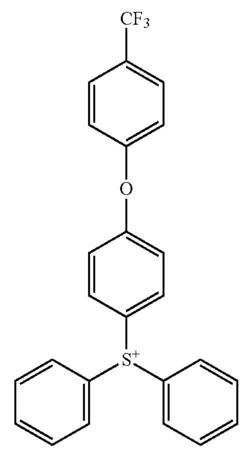
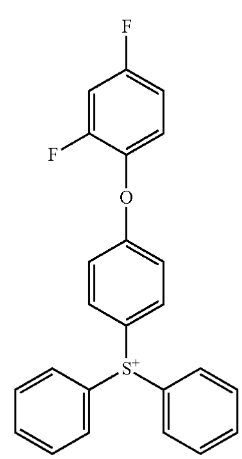

-continued
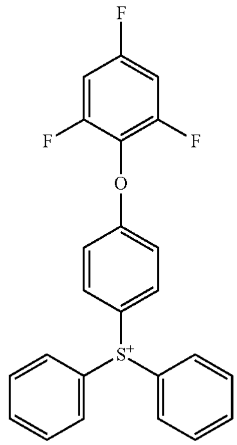
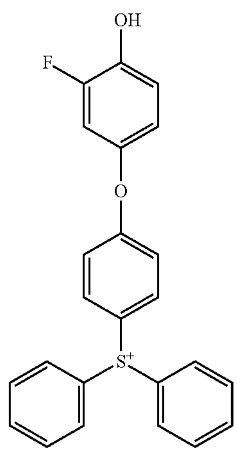
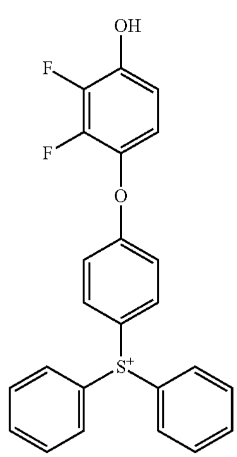
-continued
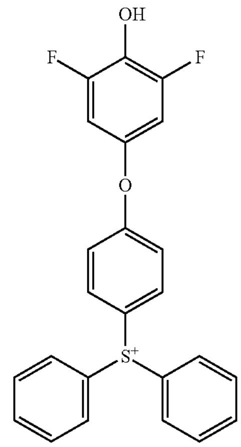
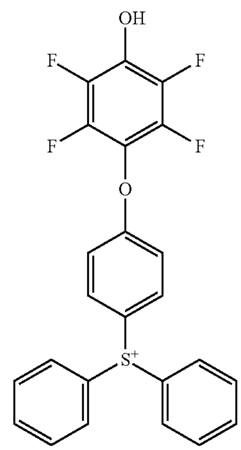
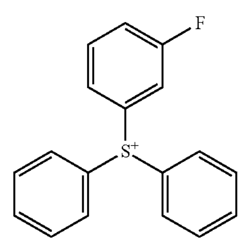
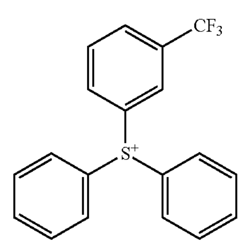
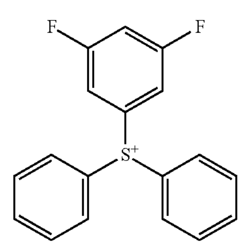

-continued
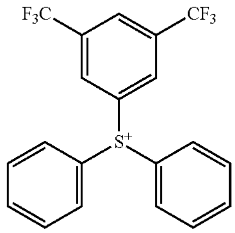
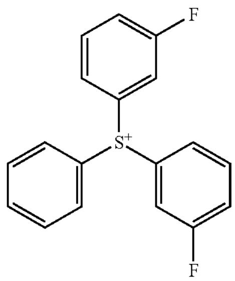
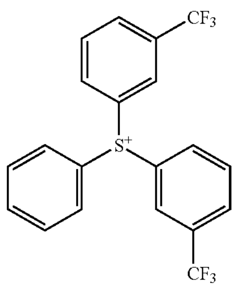
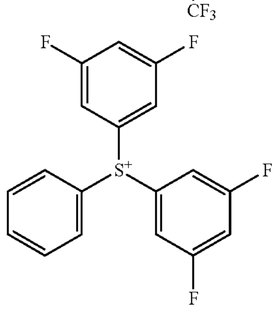
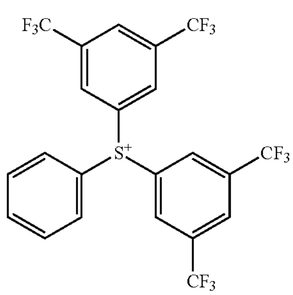
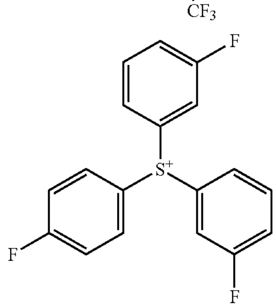
-continued
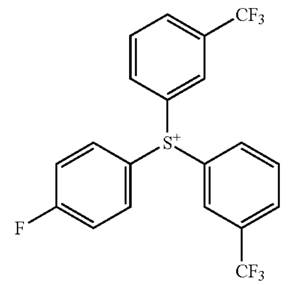
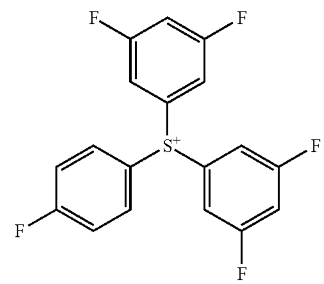
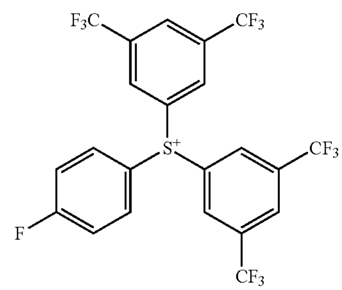
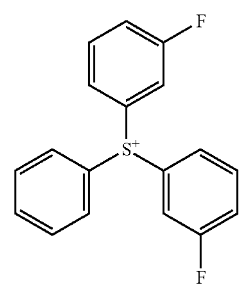
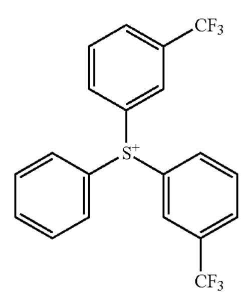
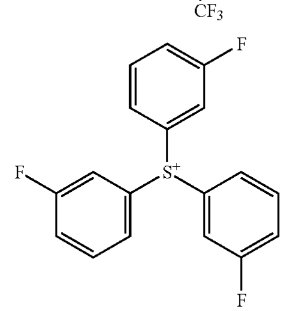

-continued
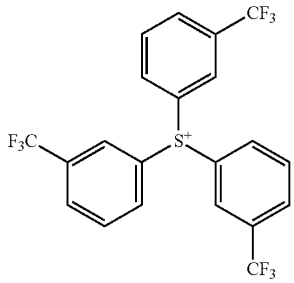
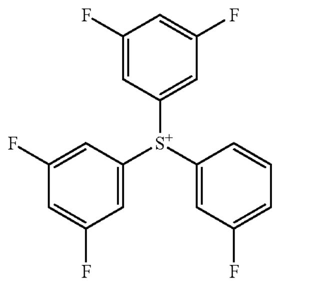
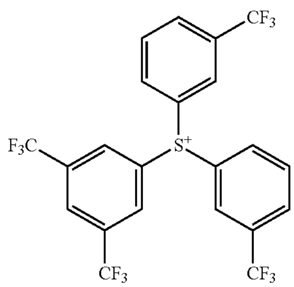
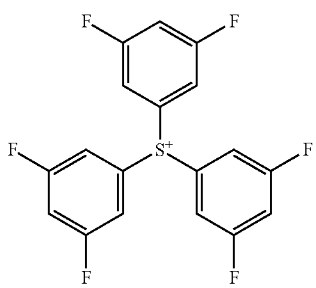
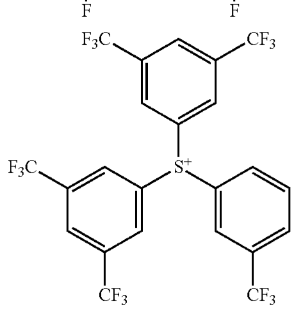
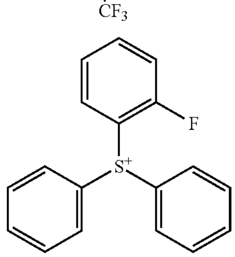
-continued
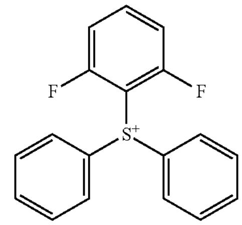
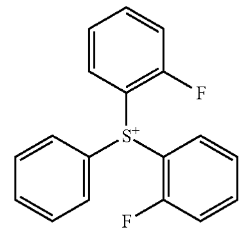
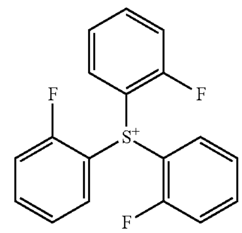
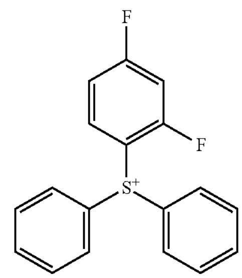
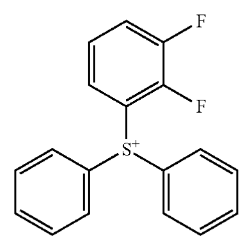
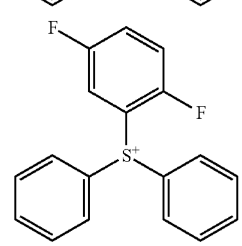
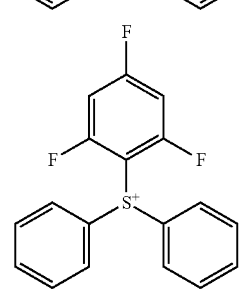

-continued
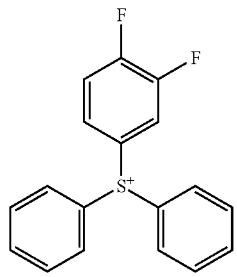
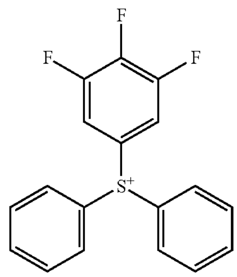
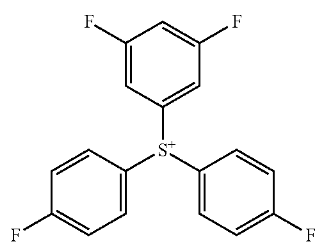
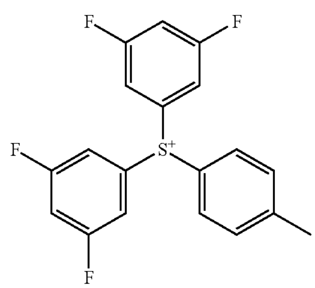
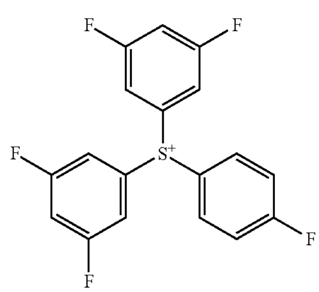
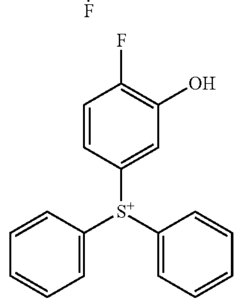
-continued
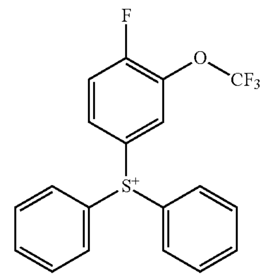
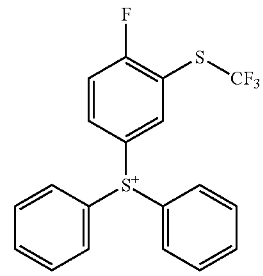
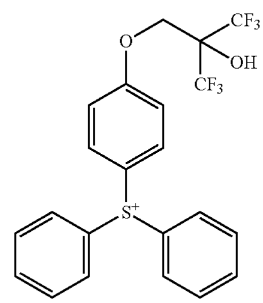
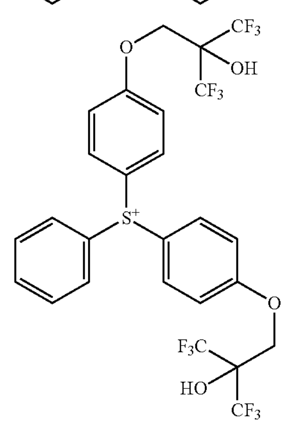
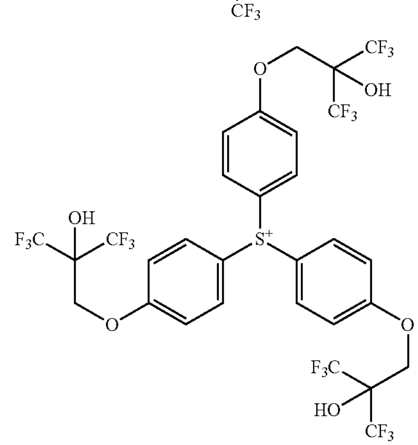

-continued
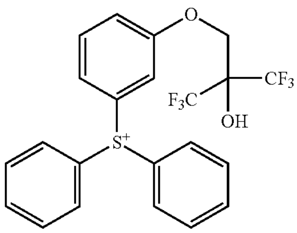
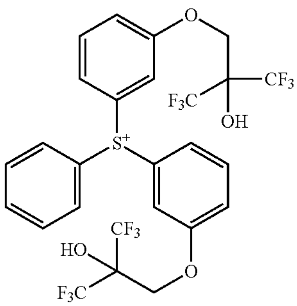
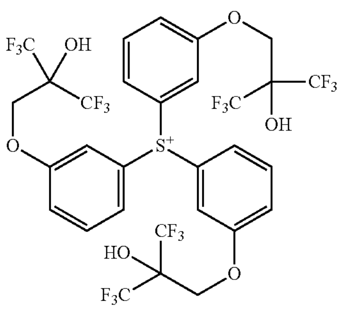
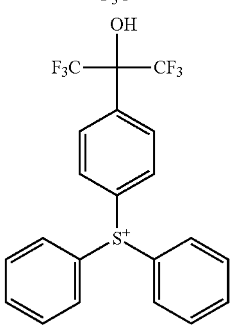
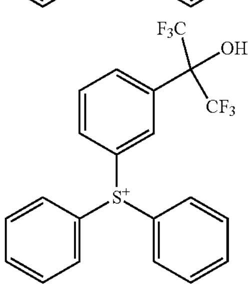
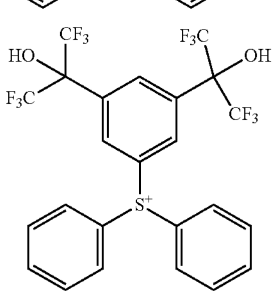
-continued
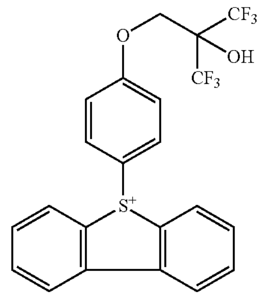
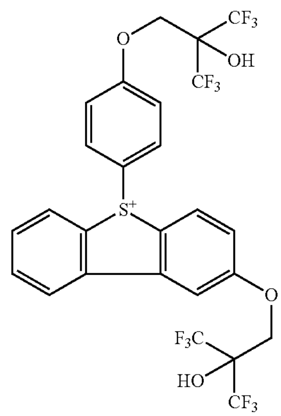
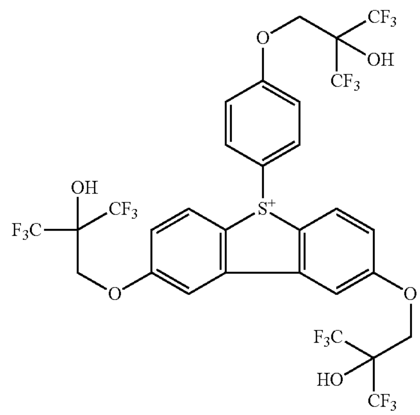
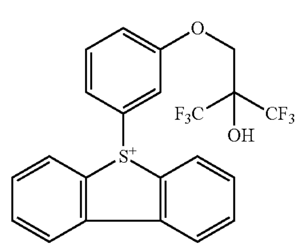
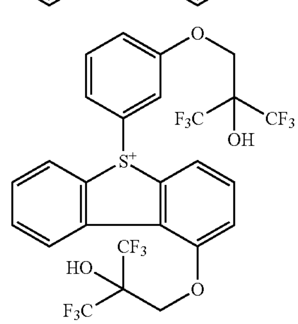

-continued
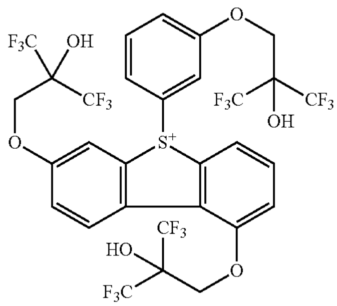
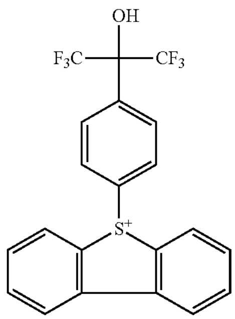
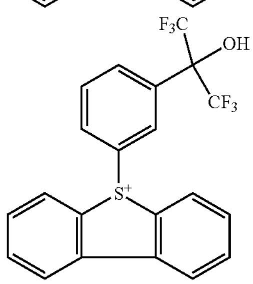
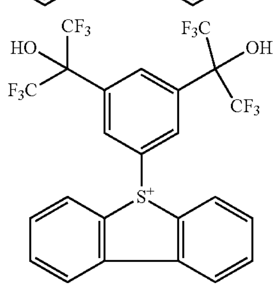
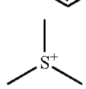
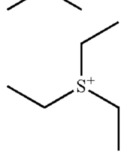
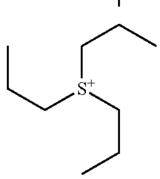
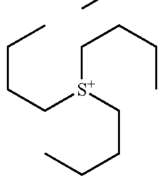
-continued
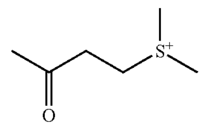
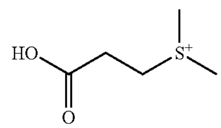
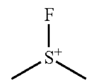
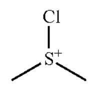
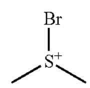
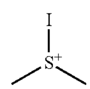
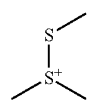
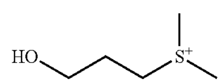
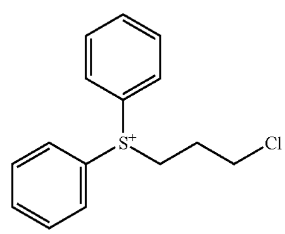
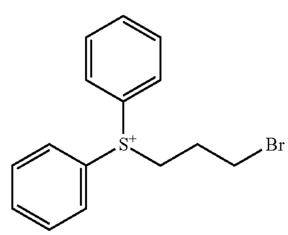
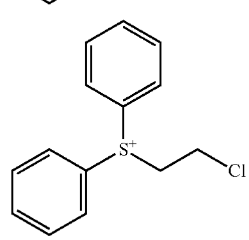
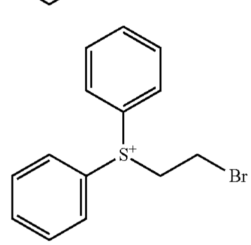

-continued
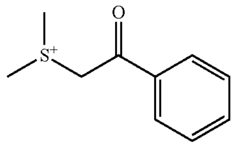
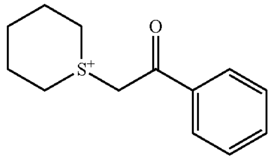
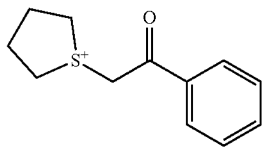
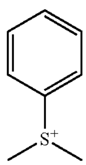
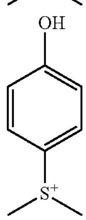
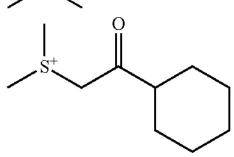
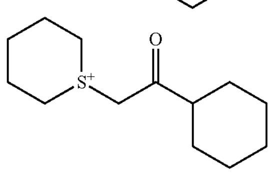
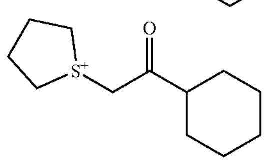
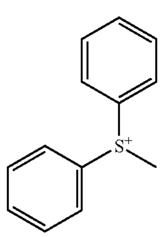
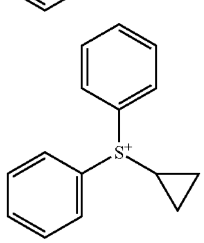
-continued
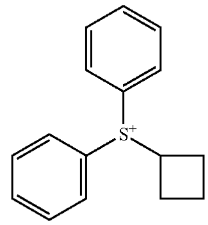
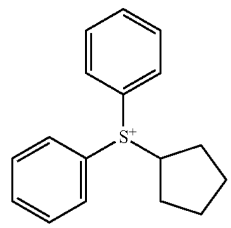
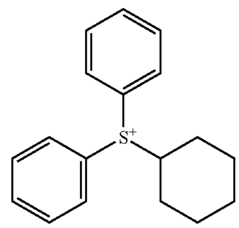
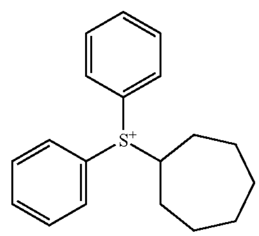
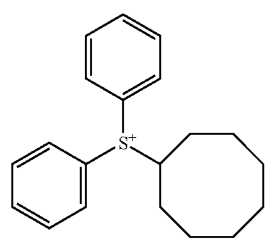
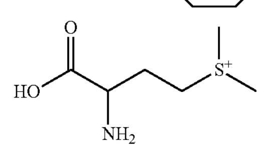
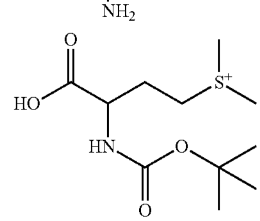
Examples of the cation in the iodonium salt having formula (A-2) are shown below, but not limited thereto.
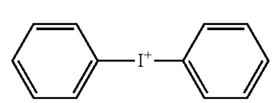

-continued
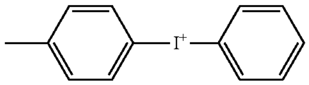
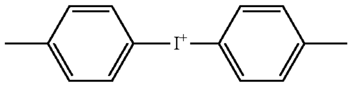
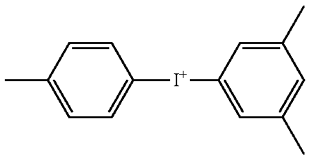
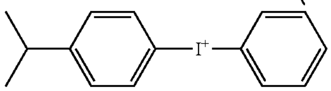
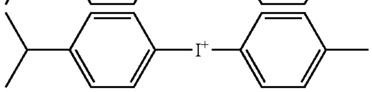
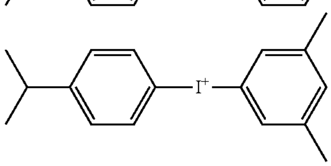
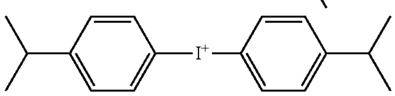
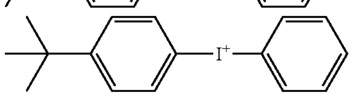
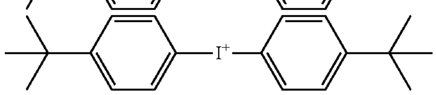
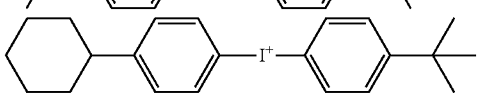
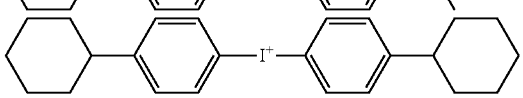
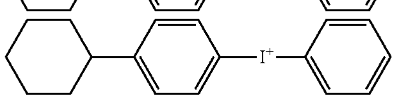
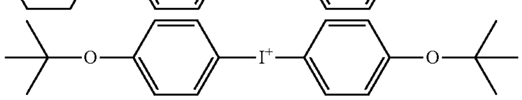
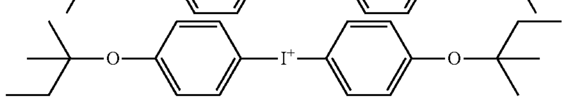
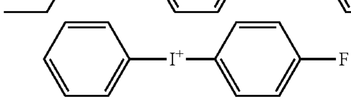
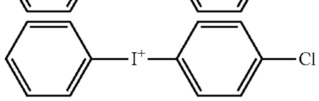
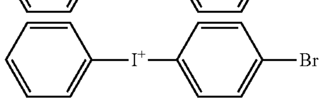
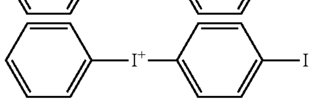
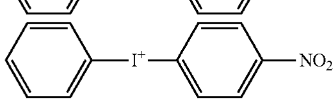
-continued
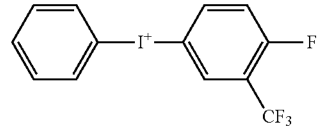
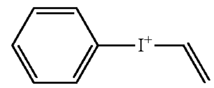
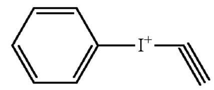
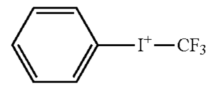
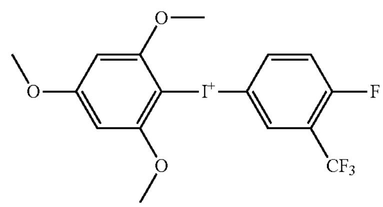
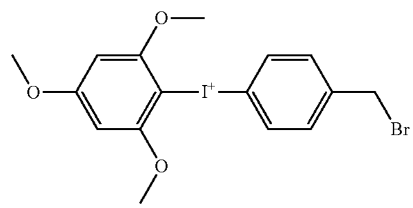
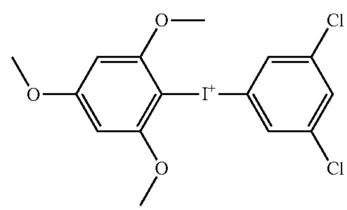
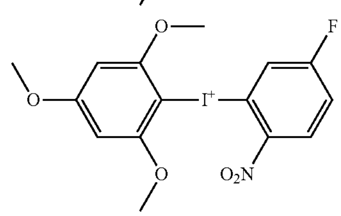
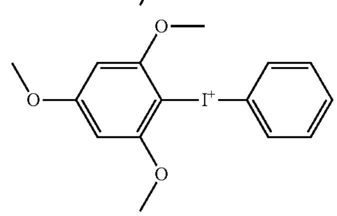
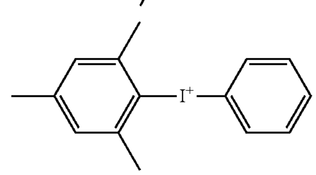
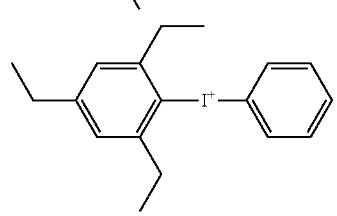

-continued
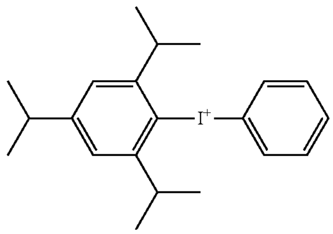
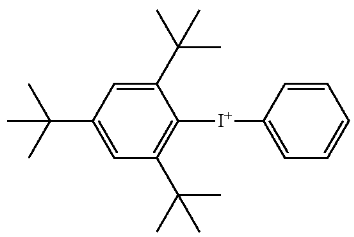
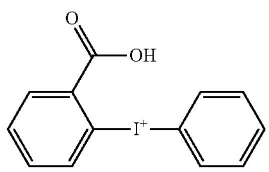
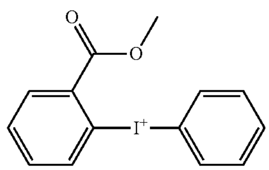
Examples of the anion in the sulfonium salt having formula (A-1) and the iodonium salt having formula (A-2) are shown below, but not limited thereto.
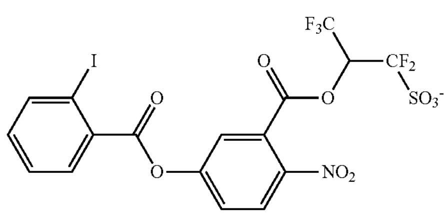
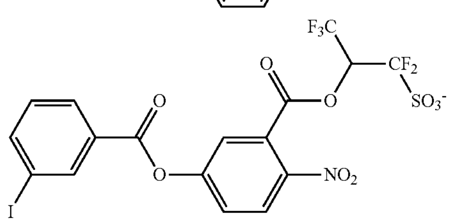
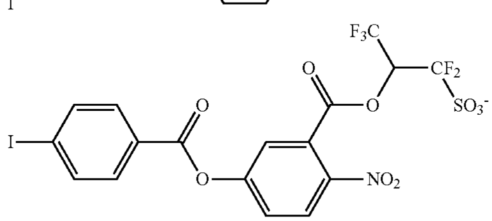
-continued
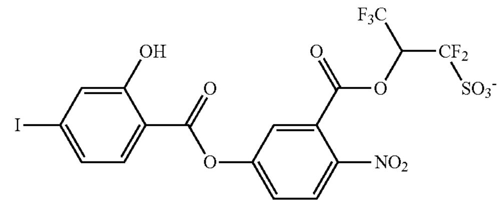
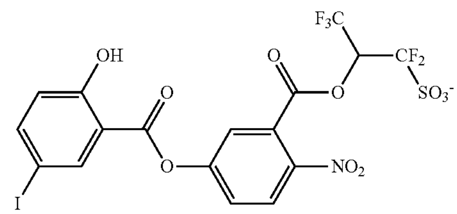
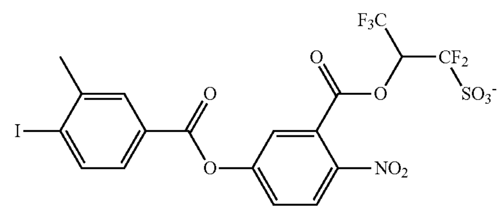
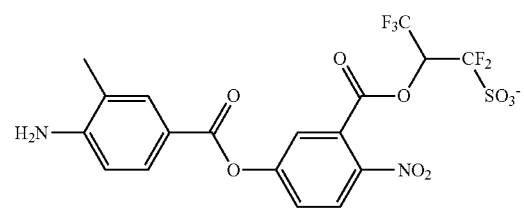
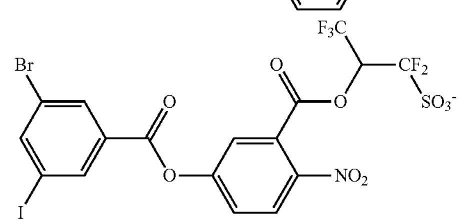
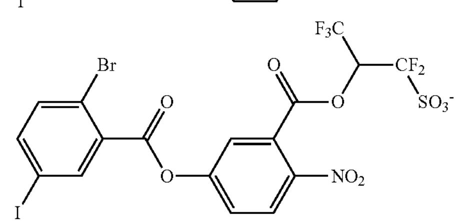
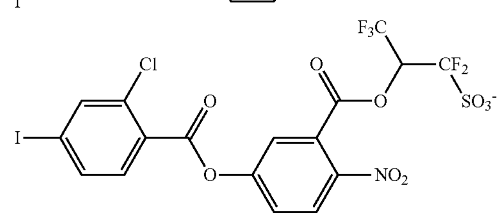
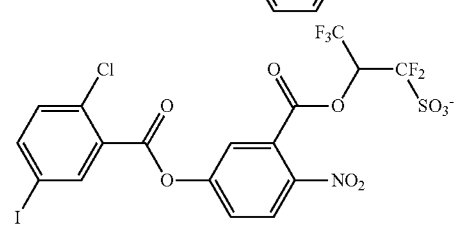

-continued
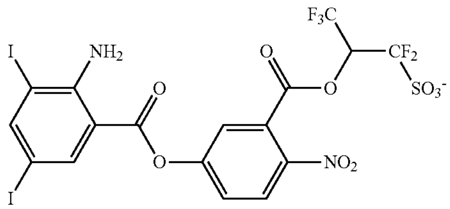
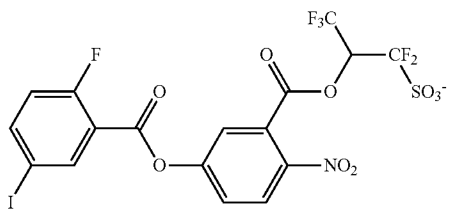
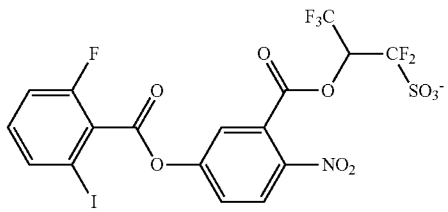
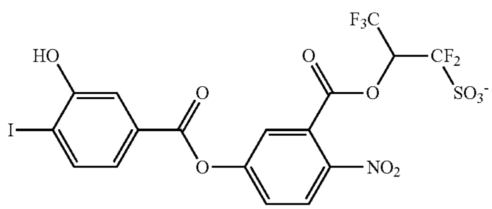
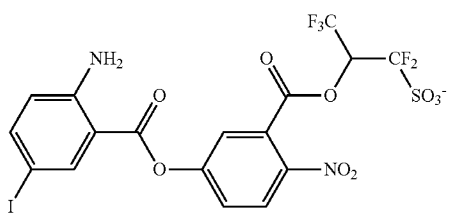
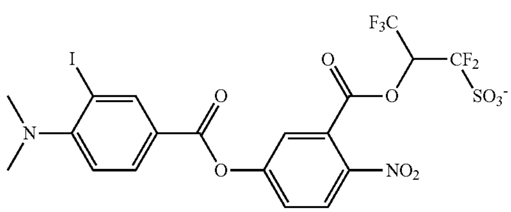
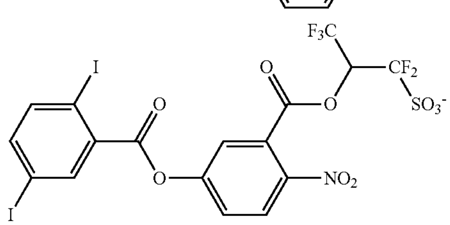
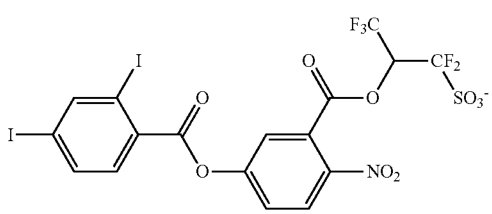
-continued
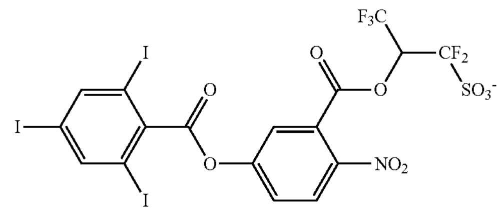
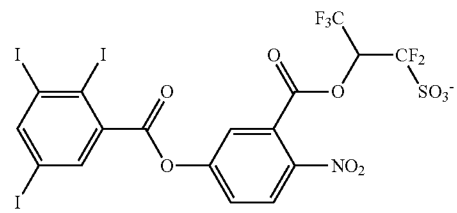
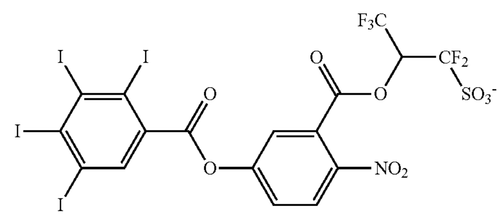
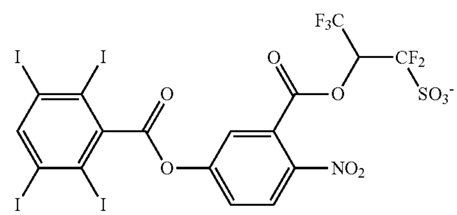
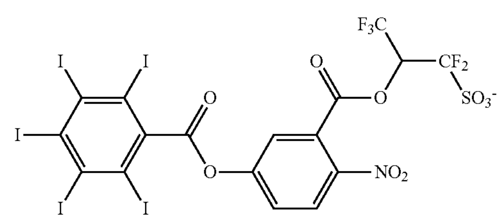
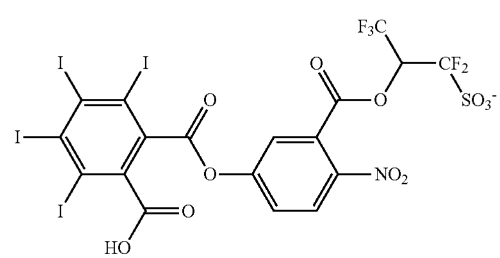
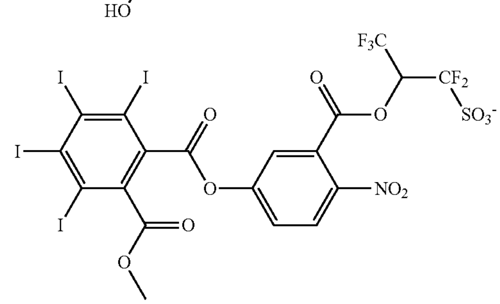

-continued
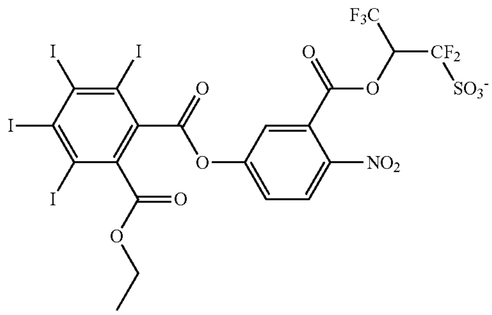
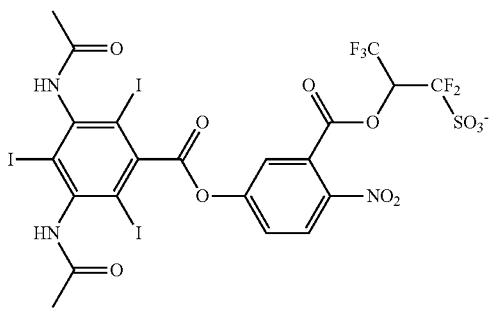
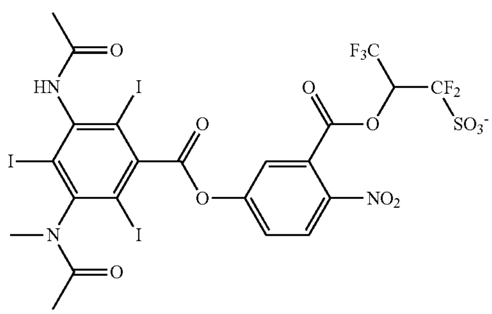
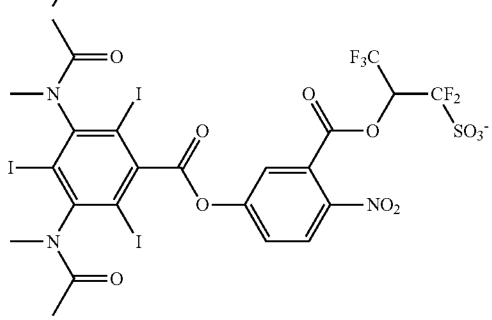
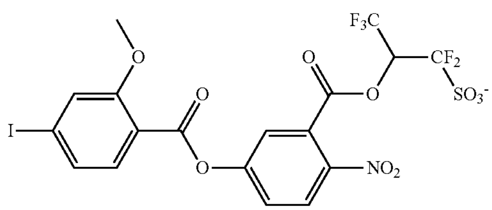
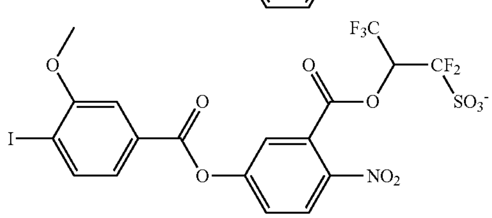
-continued
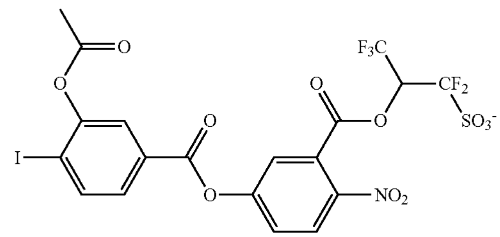
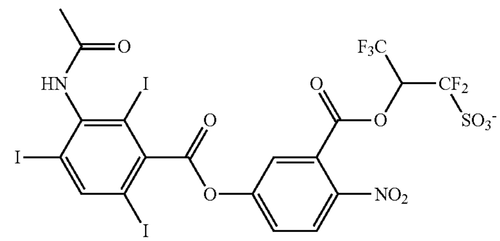
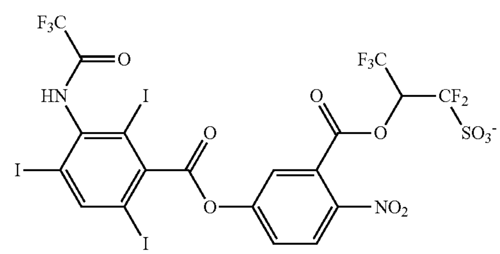
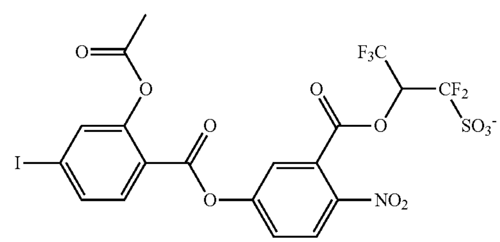
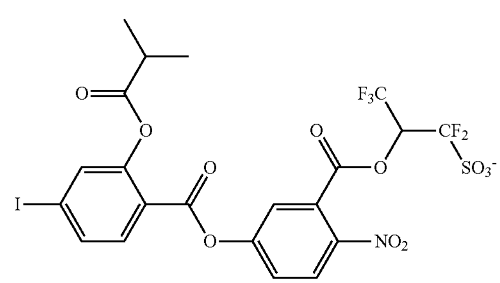
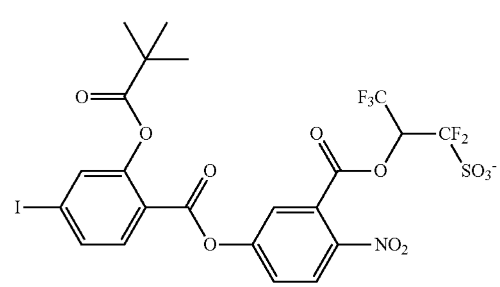

-continued
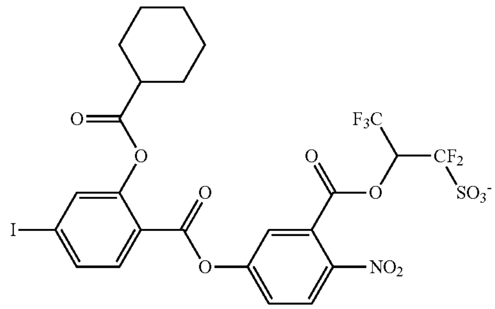
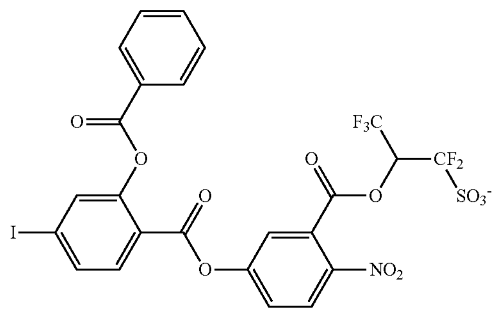
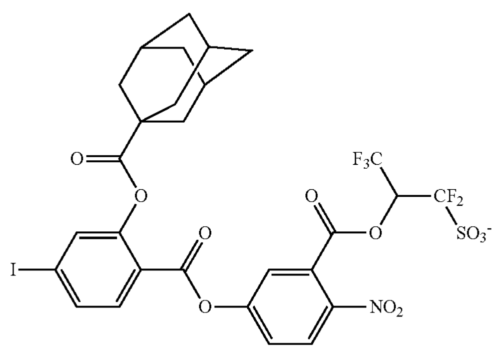
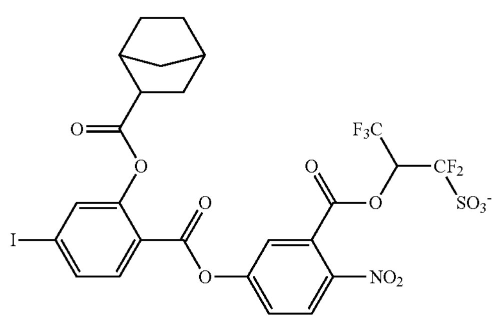
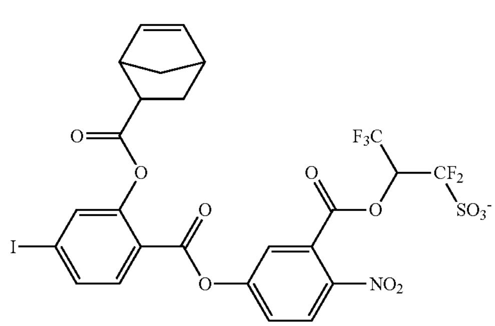
-continued
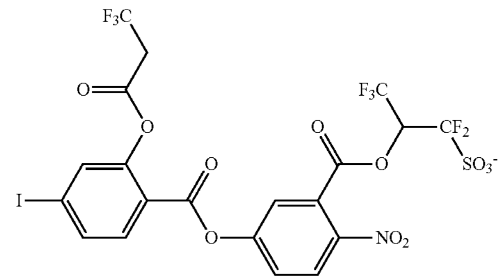
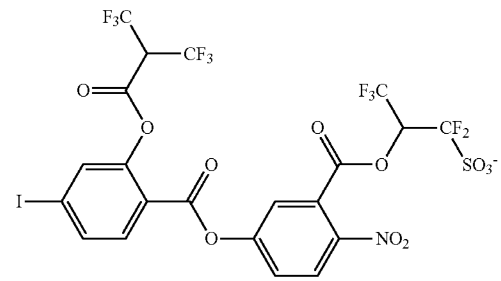
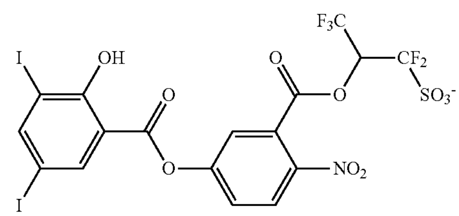
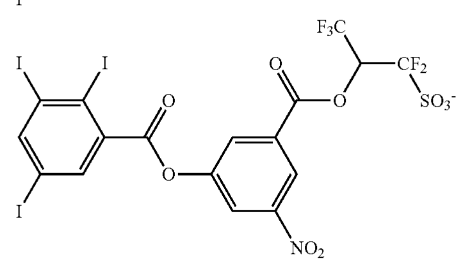
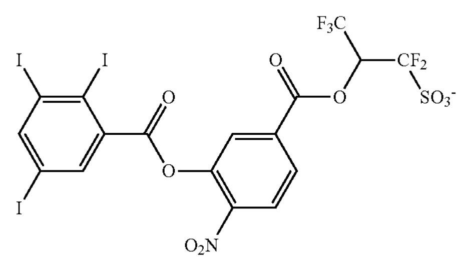
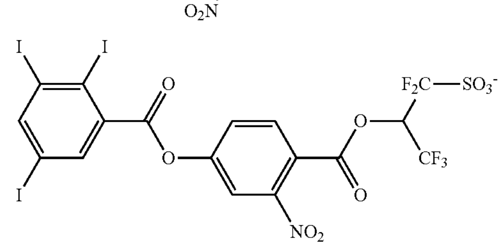
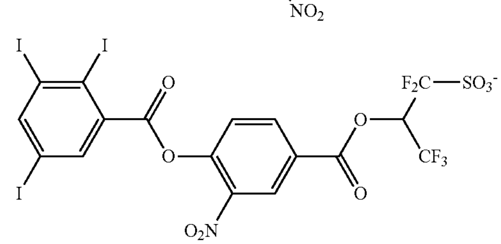

-continued
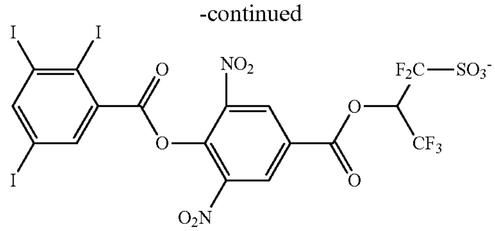
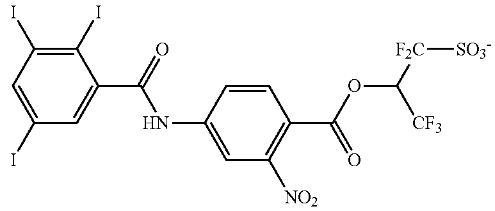
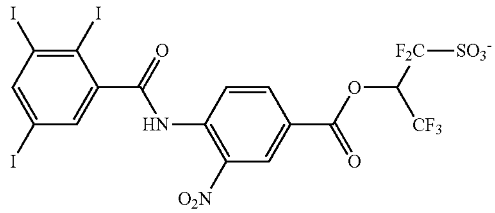
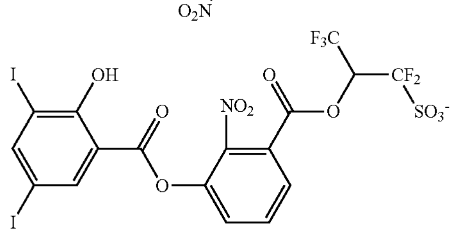
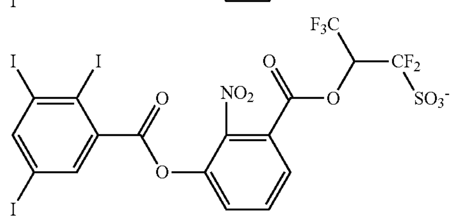
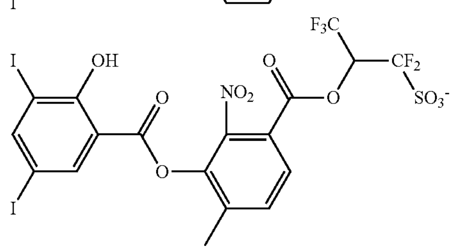
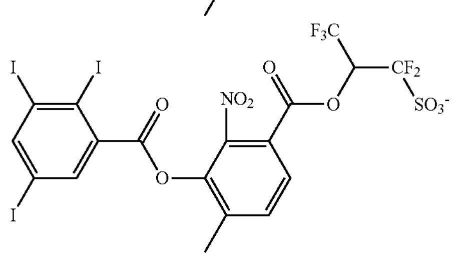
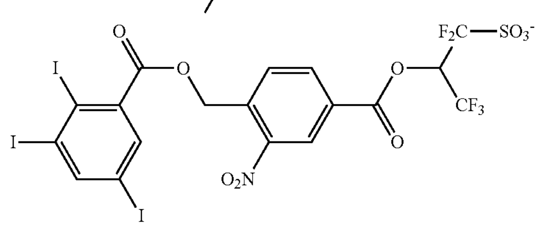
-continued
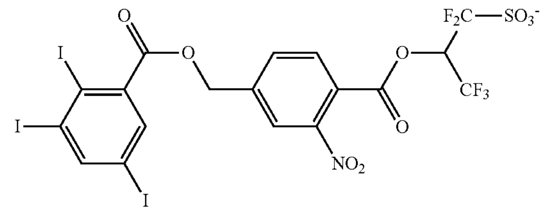
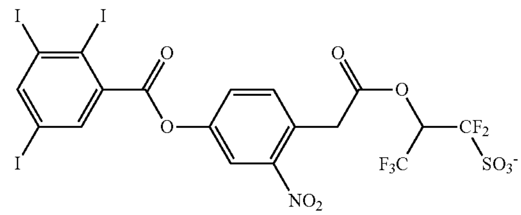
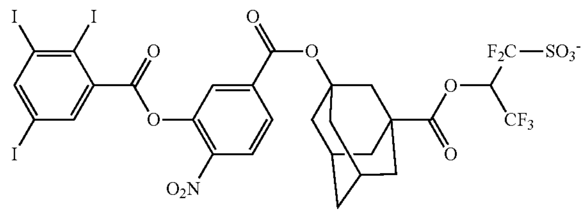
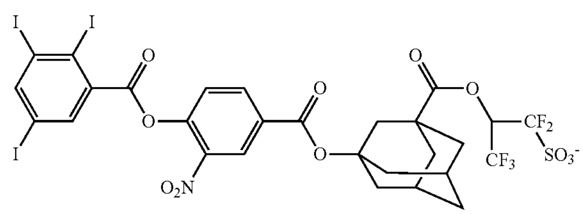
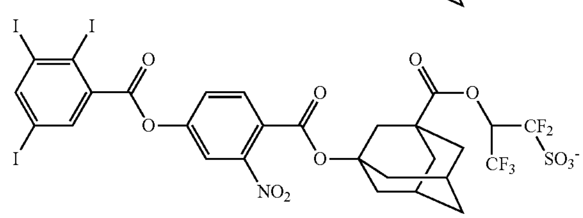
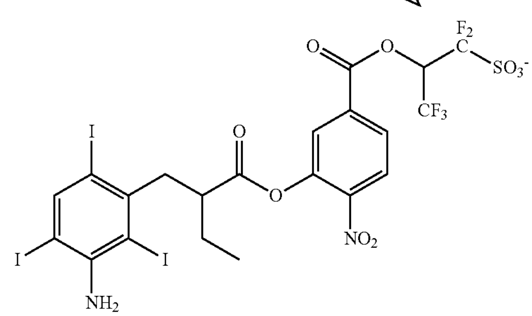
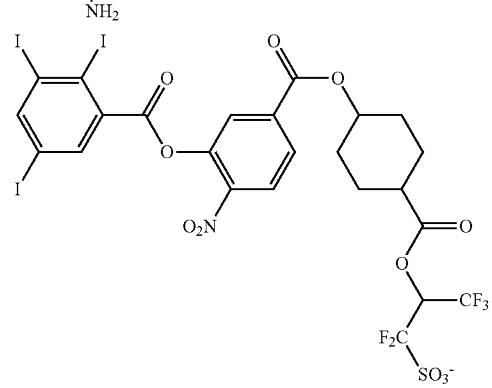

-continued
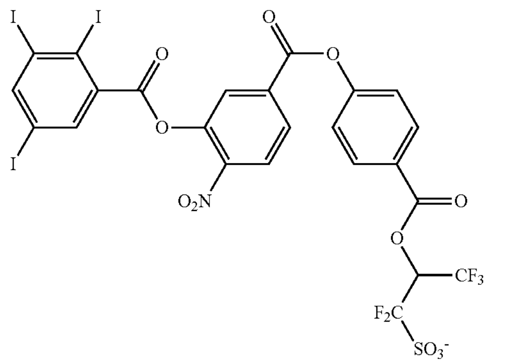
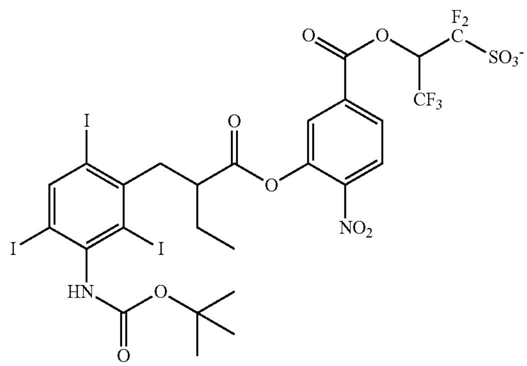
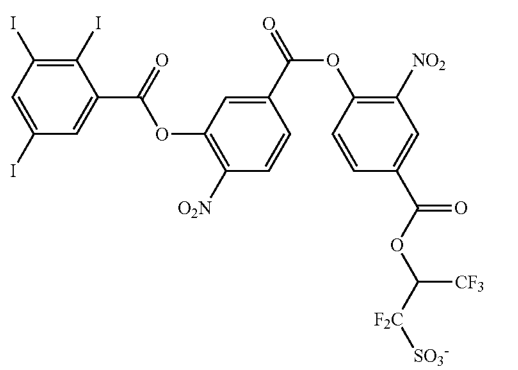
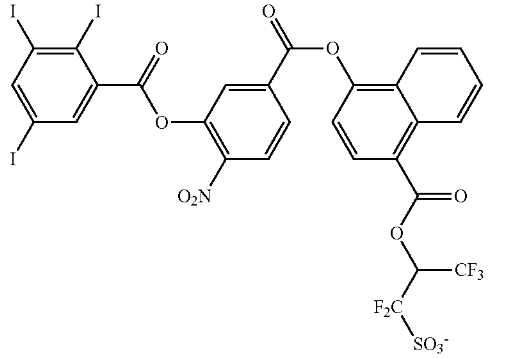
-continued
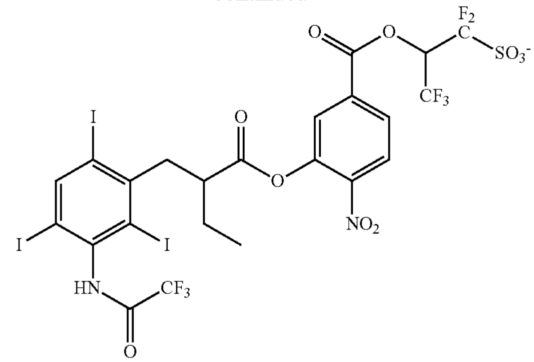
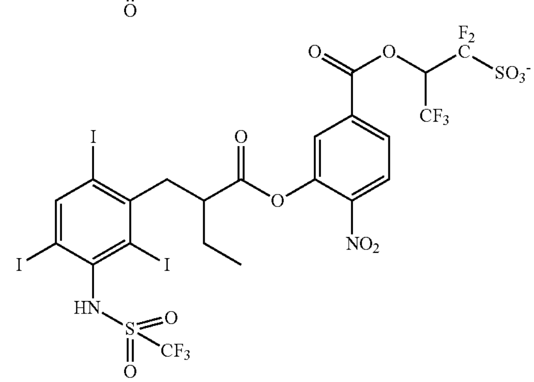
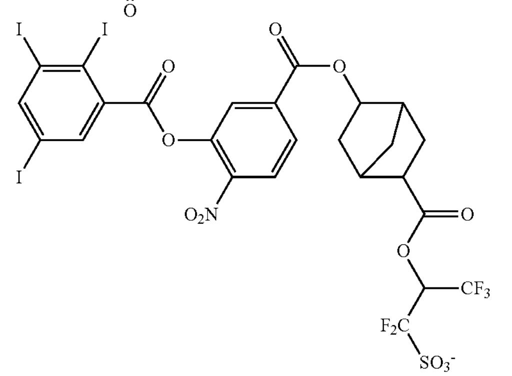
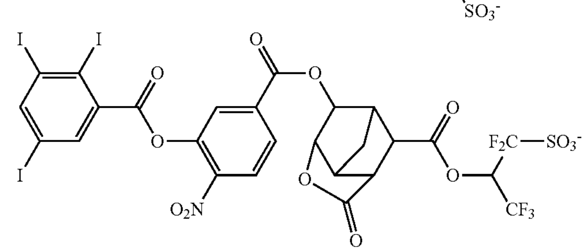
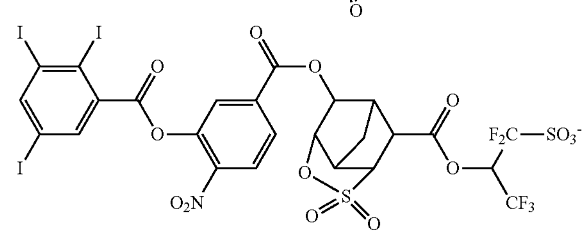
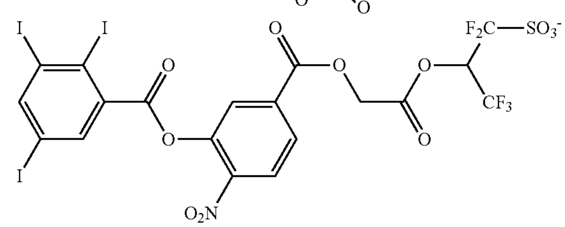

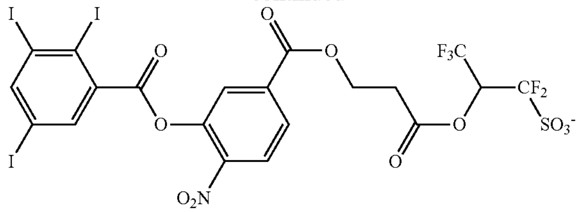
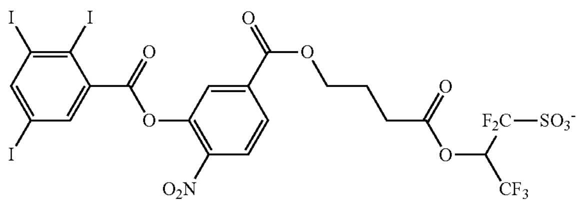
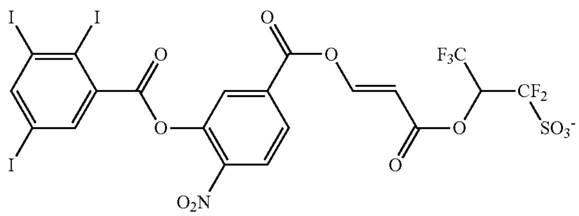
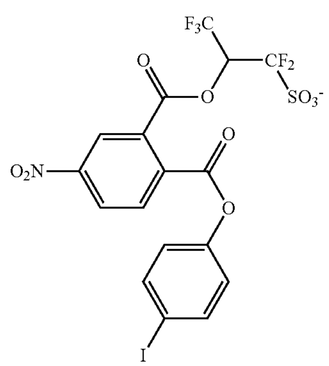
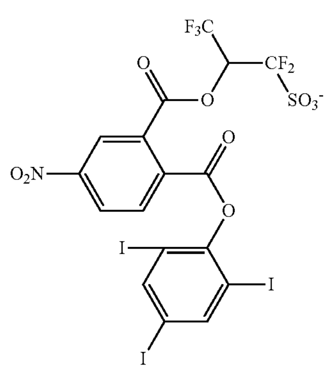
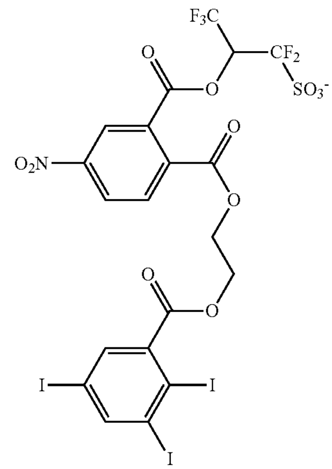
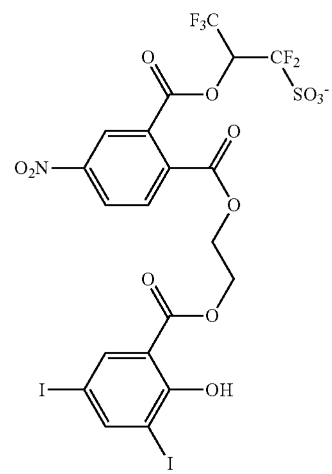
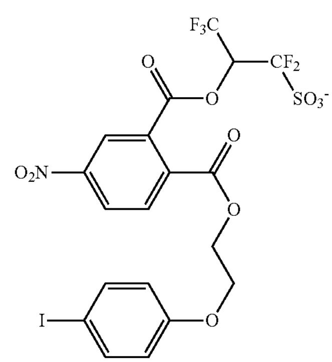
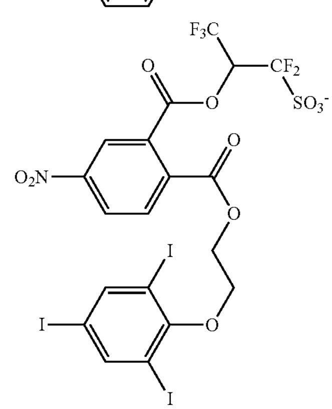

-continued
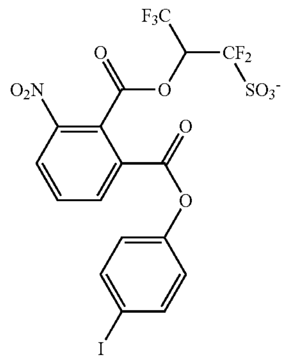
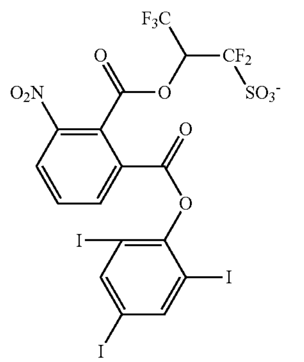
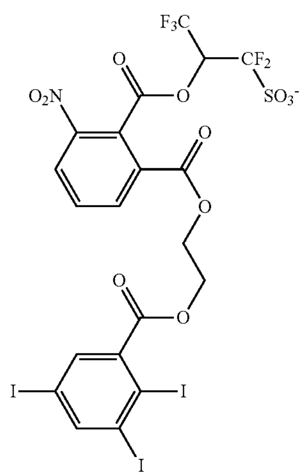
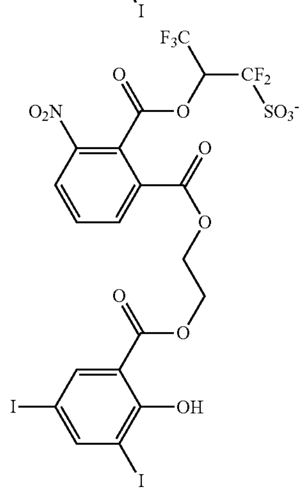
-continued
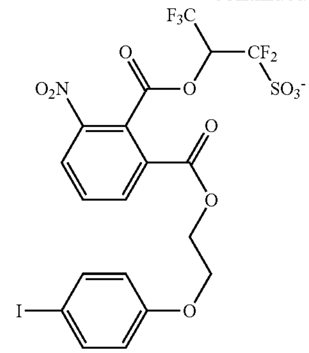
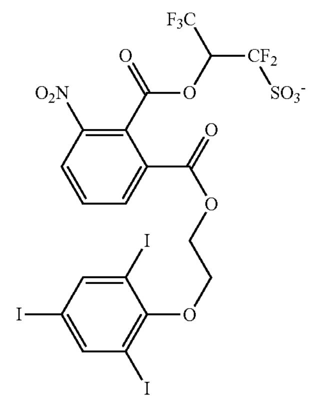
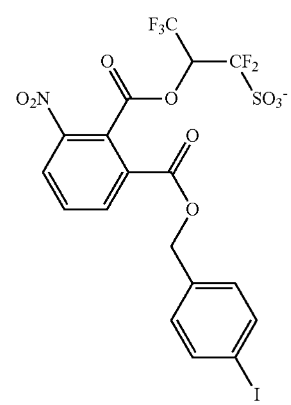
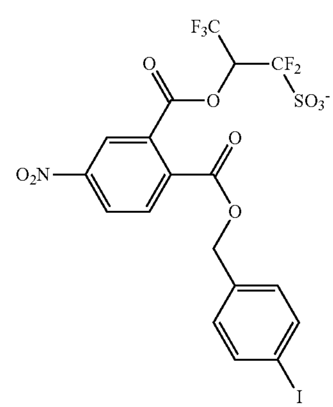

-continued
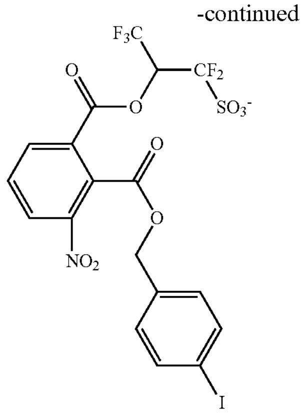
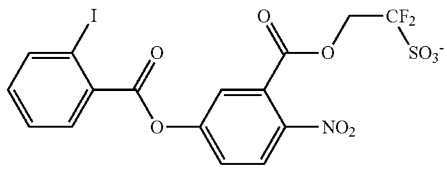
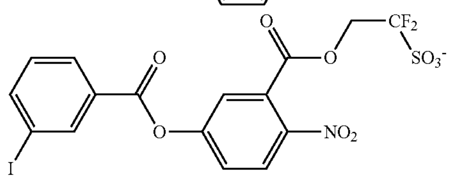
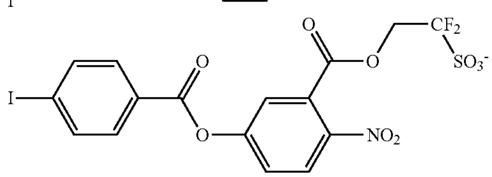
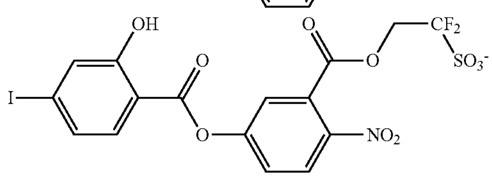
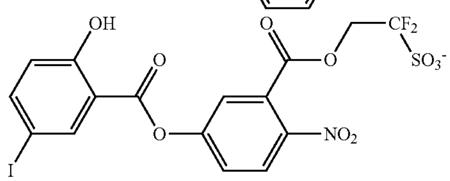
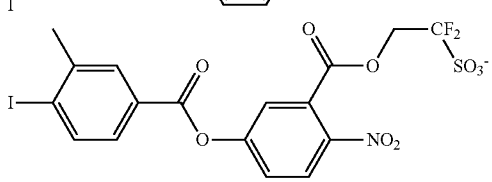
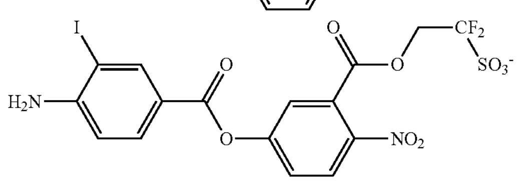
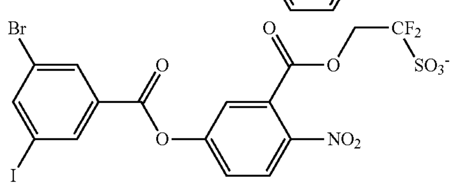
-continued
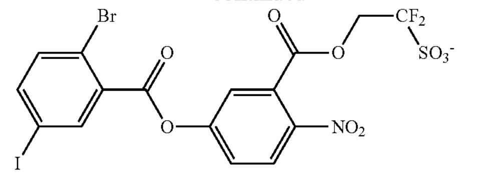
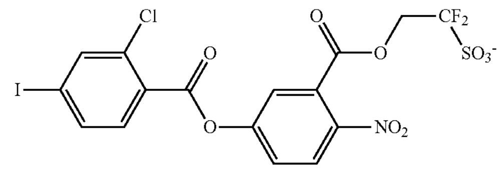
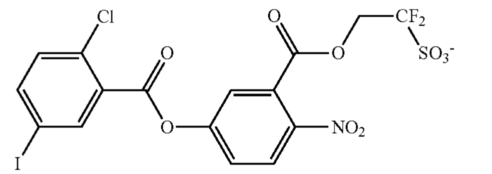
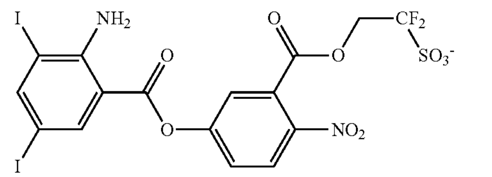
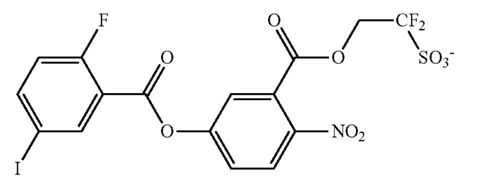
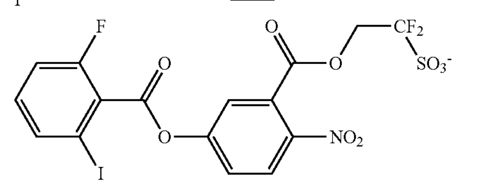
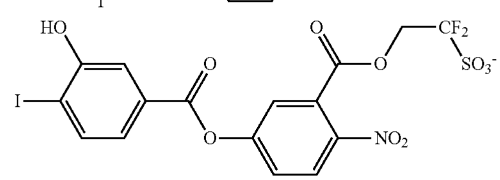
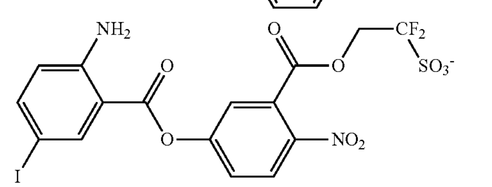
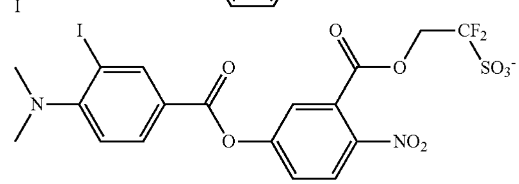
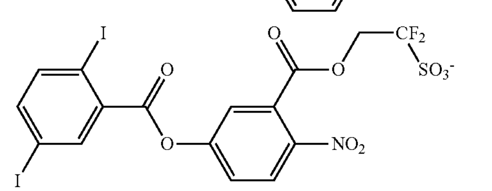

-continued
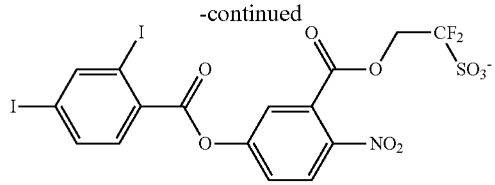
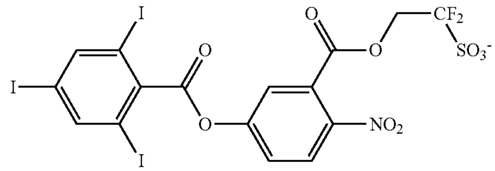
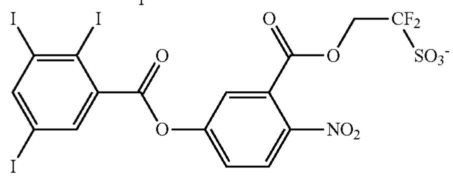
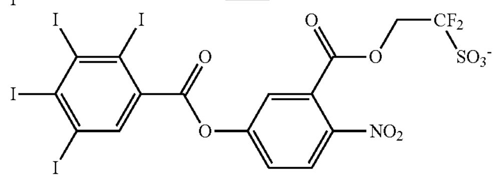
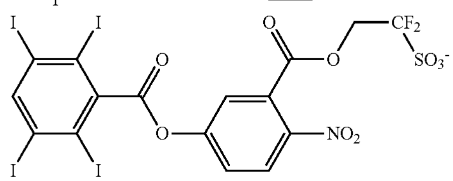
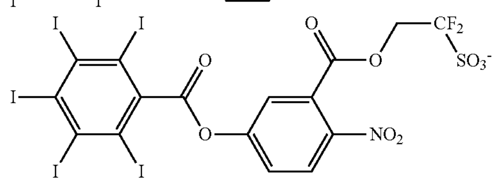
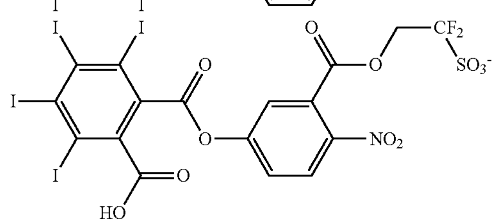
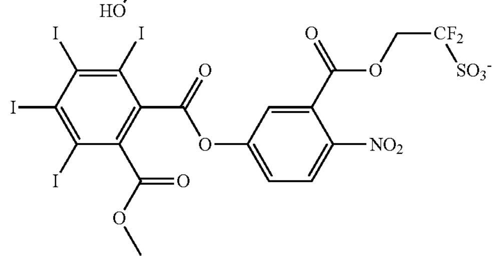
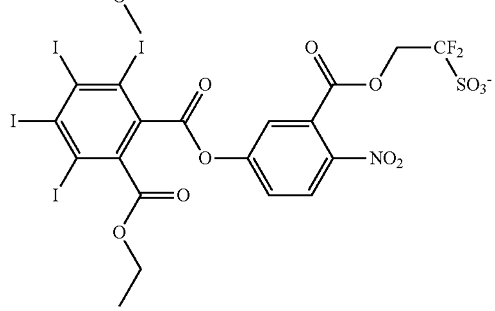
-continued
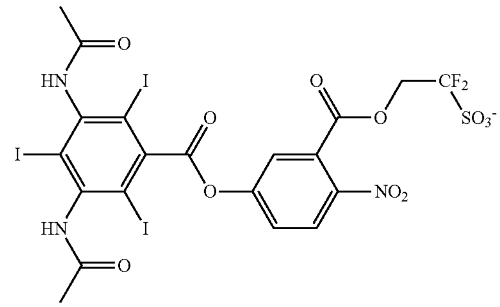
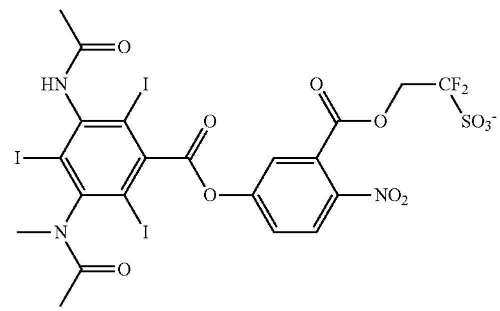
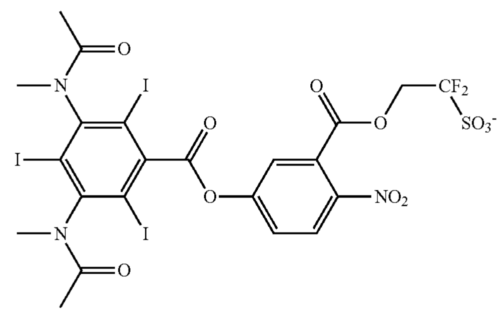
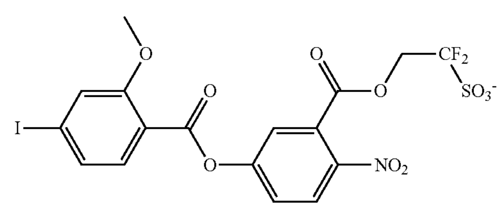
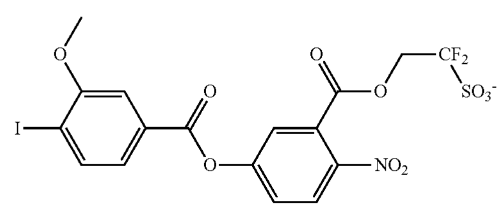
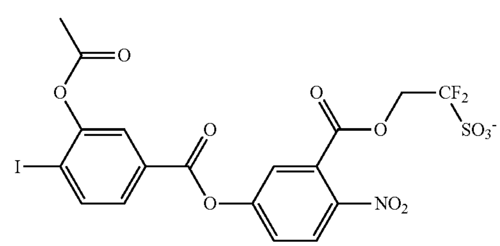

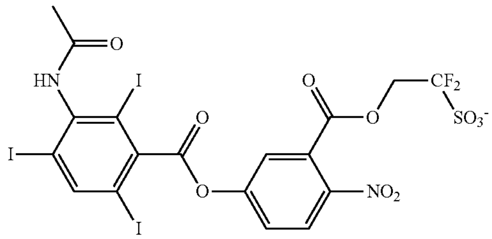
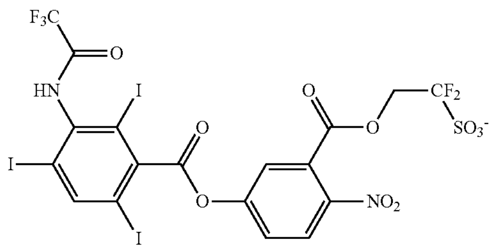
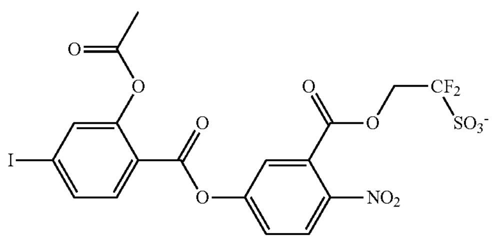
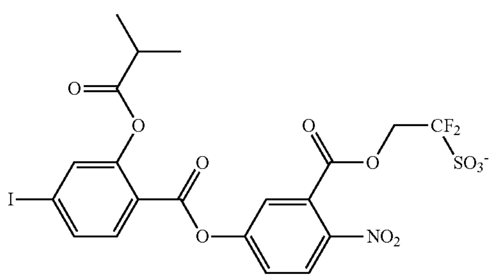
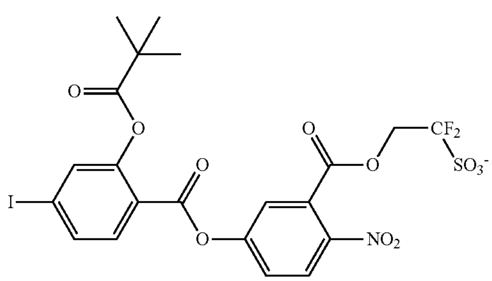
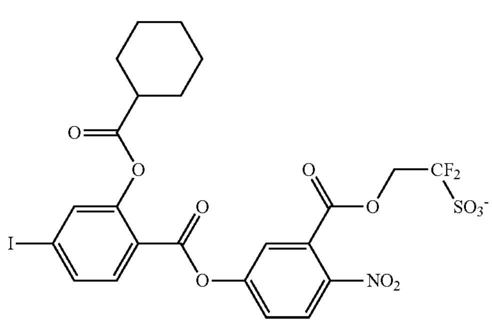
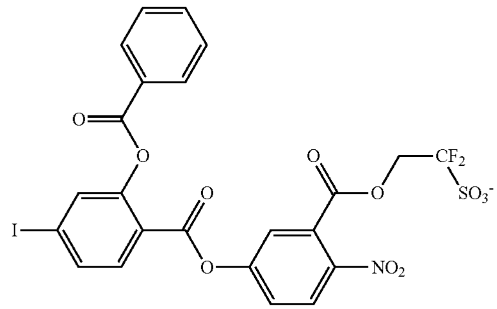
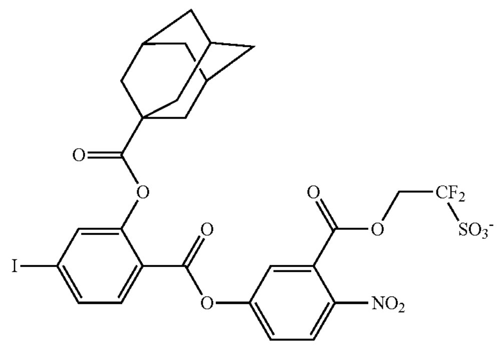
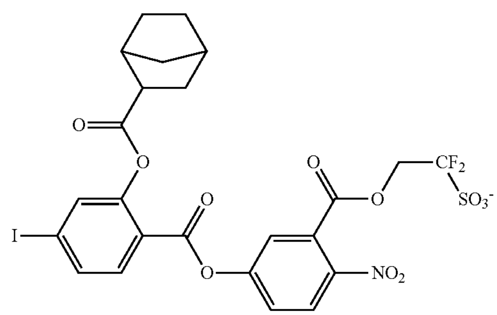
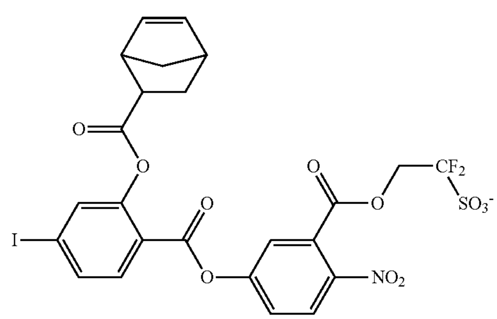
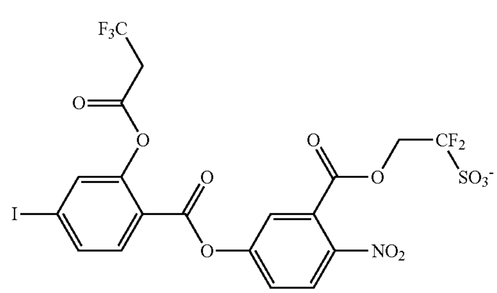

-continued
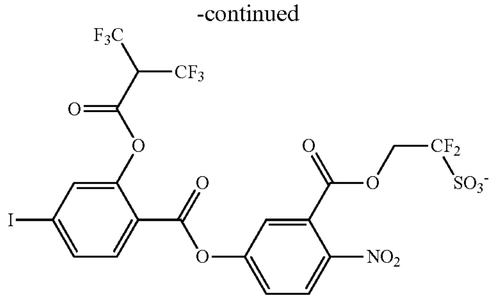
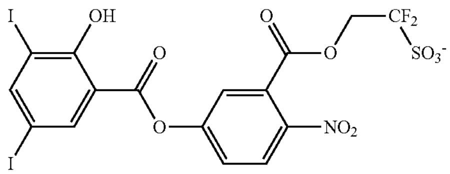
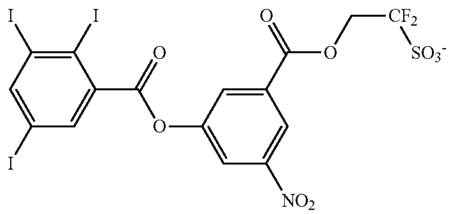
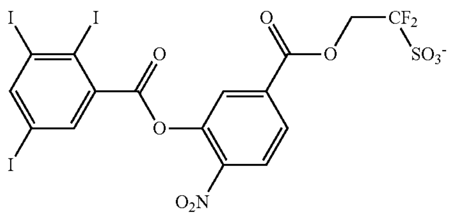
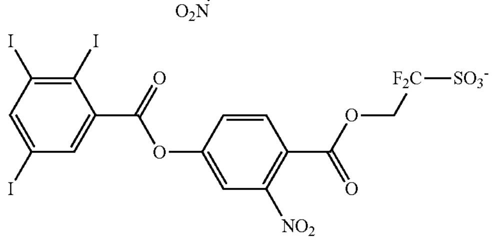
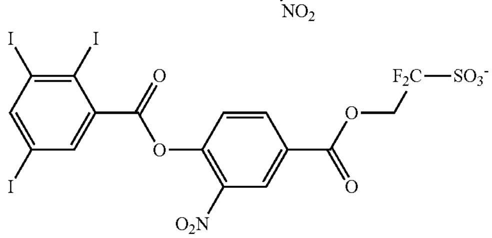
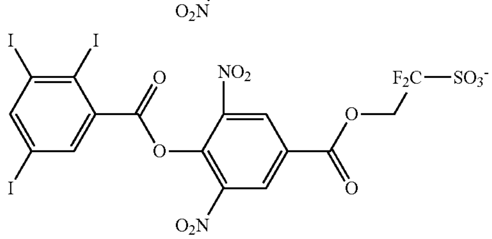
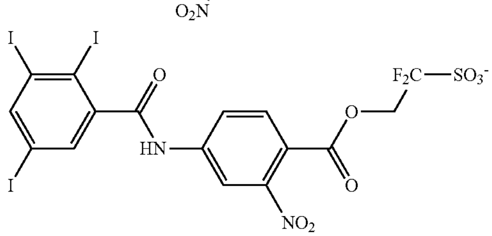
-continued
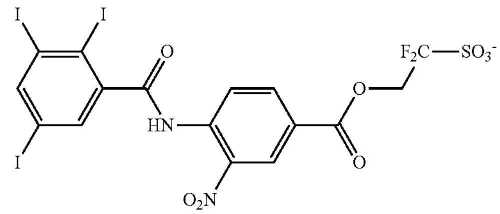
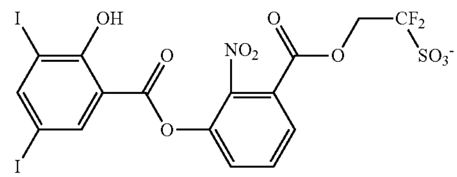
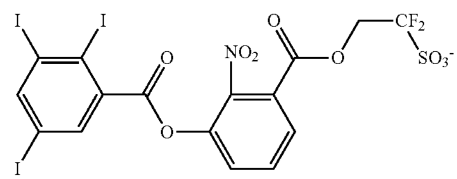
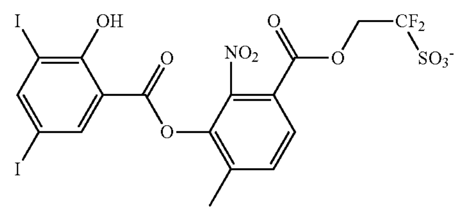
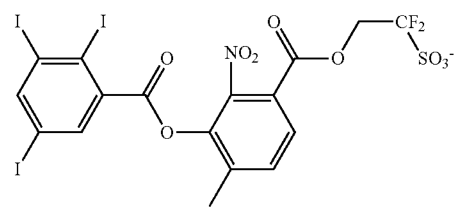
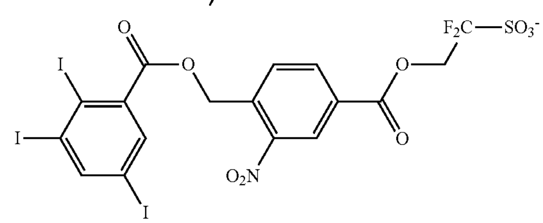
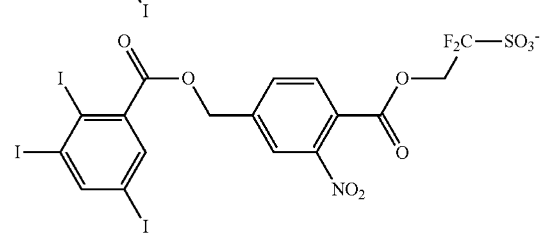
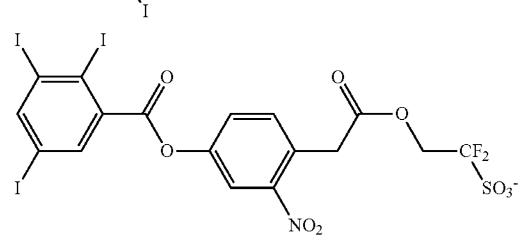

-continued
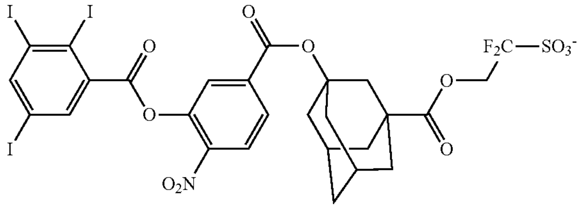
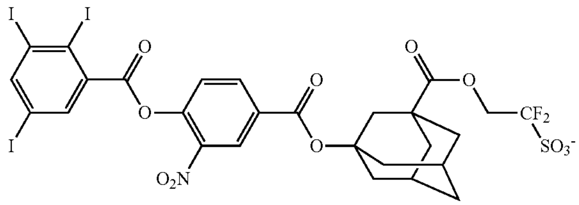
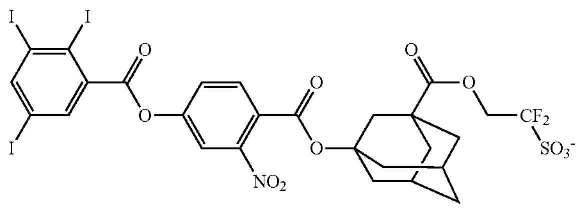
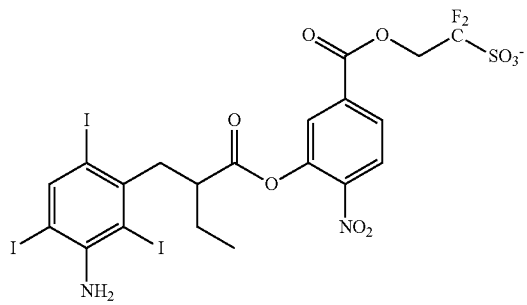
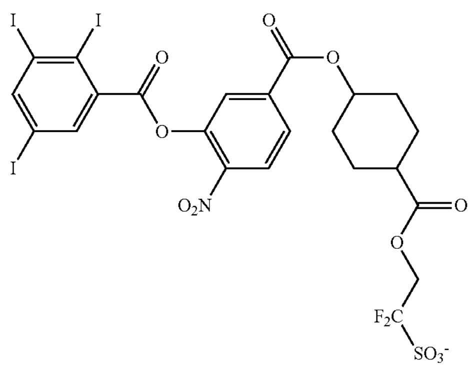
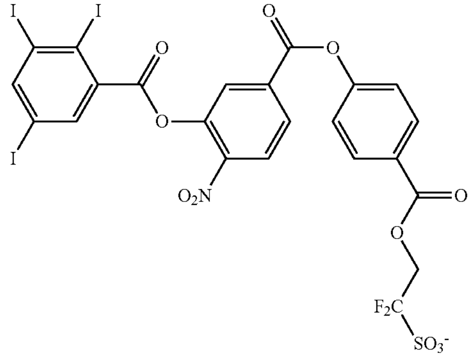
-continued
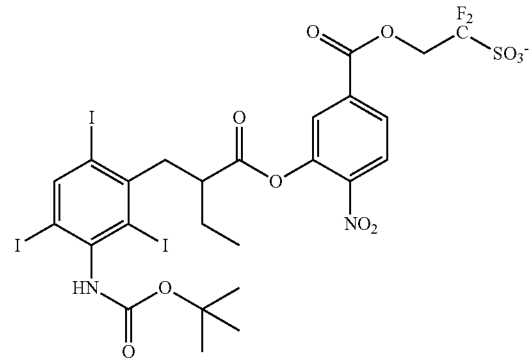
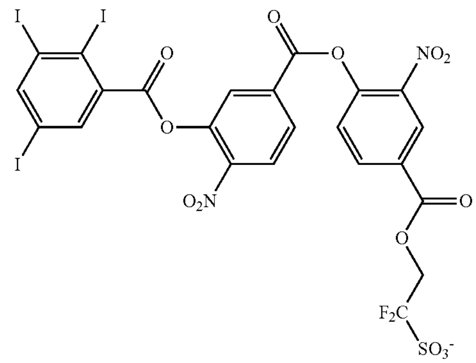
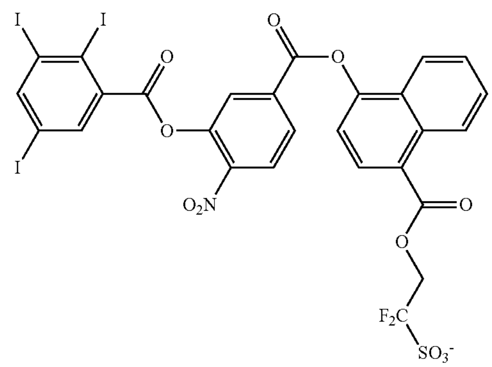
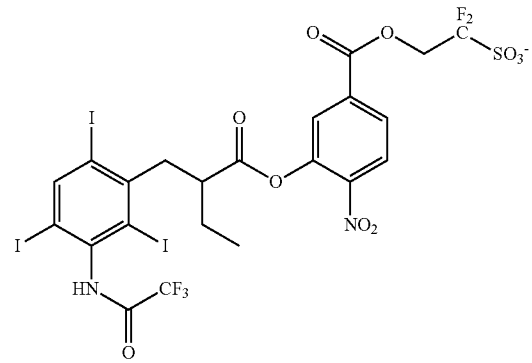

-continued
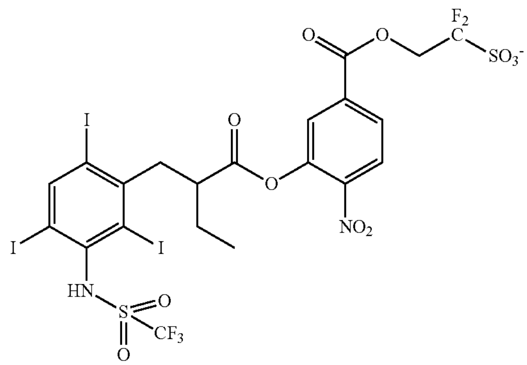
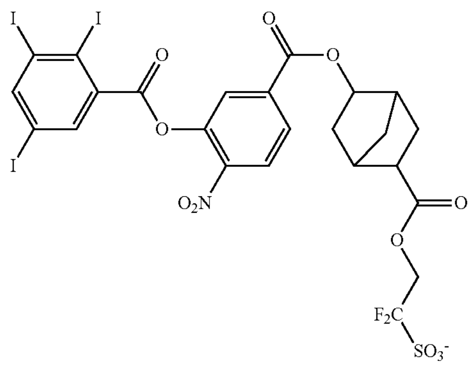
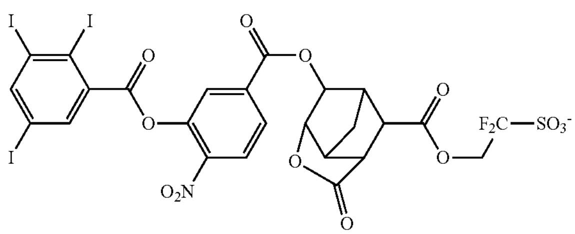
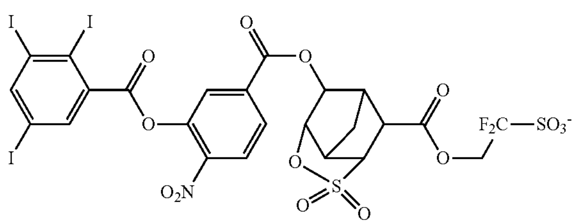
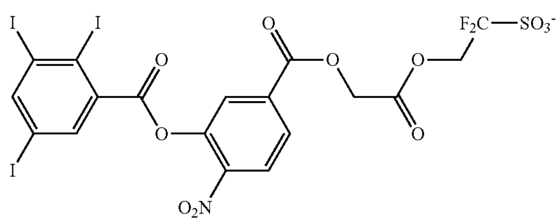
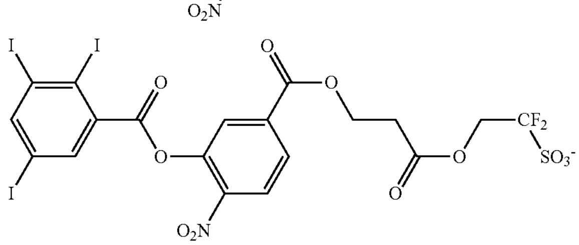
-continued
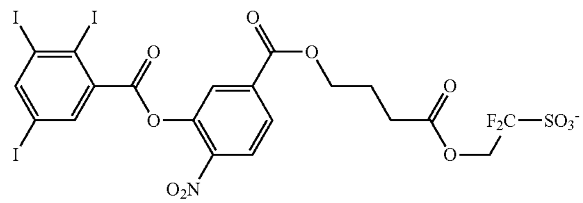
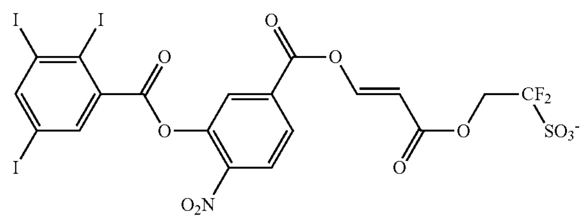
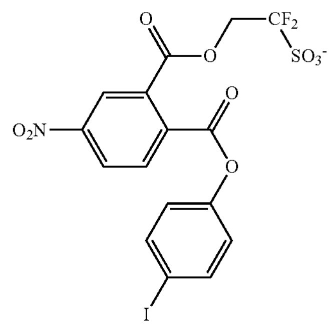
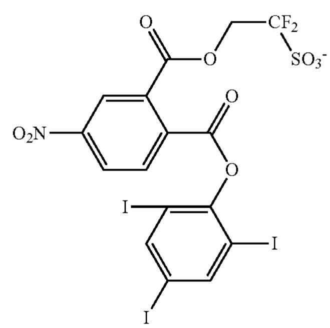
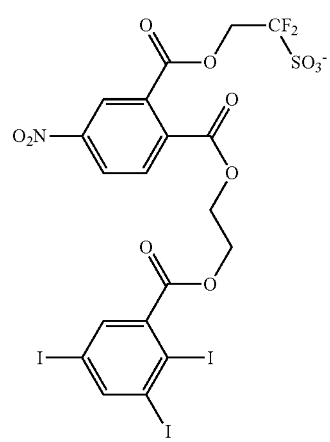

-continued
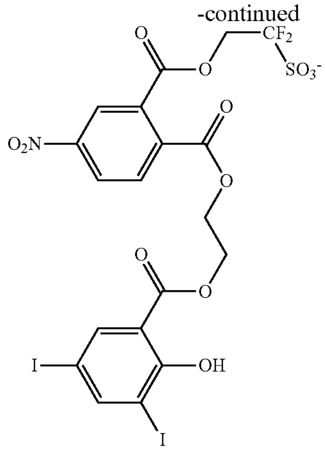
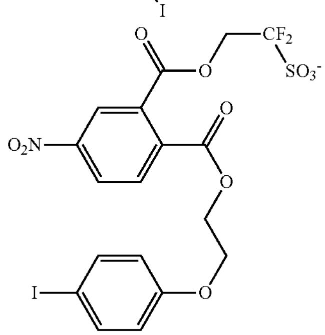
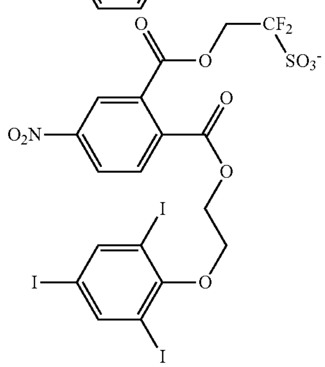
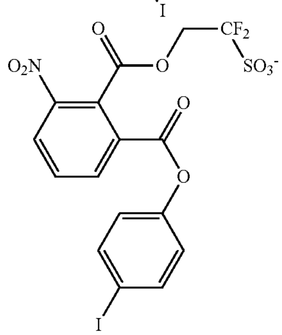
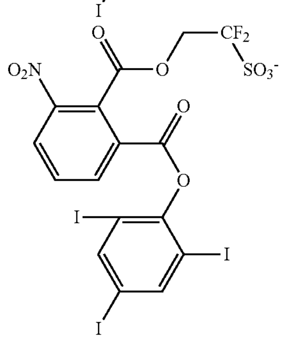
-continued
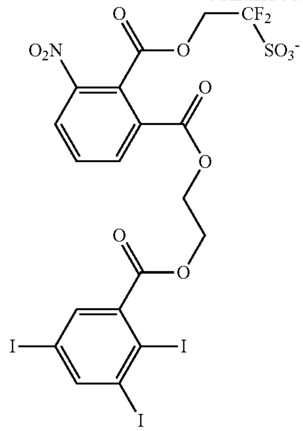
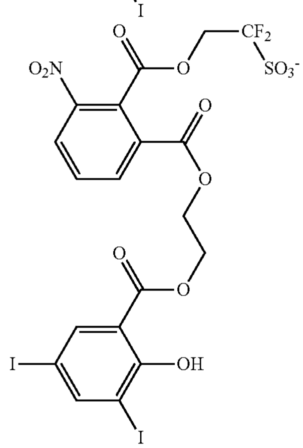
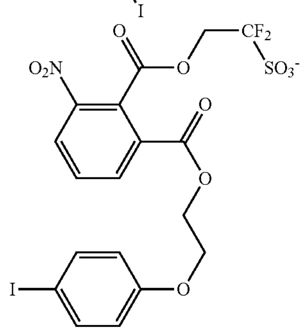
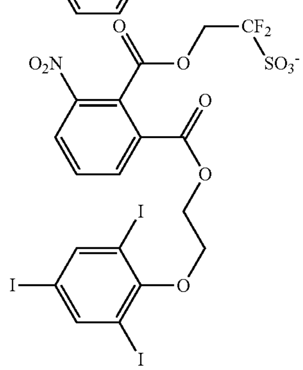
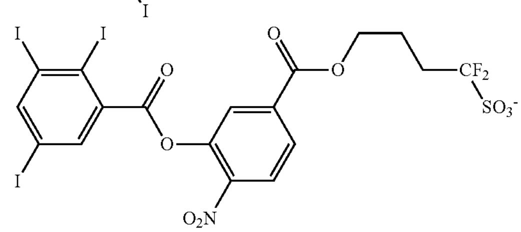

-continued
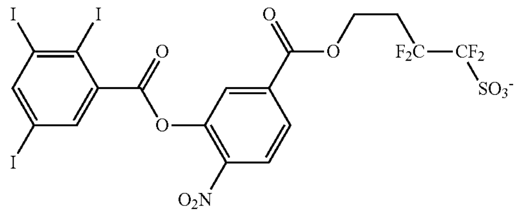
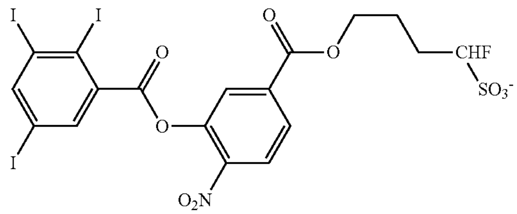
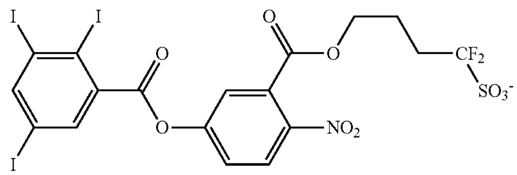
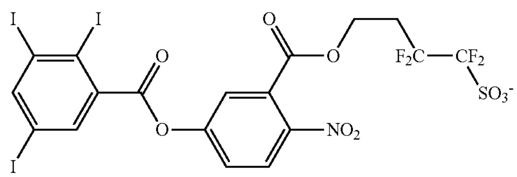
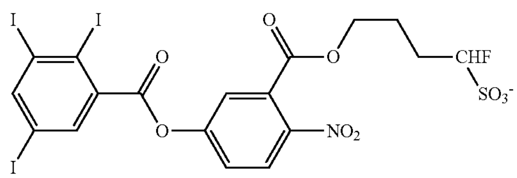
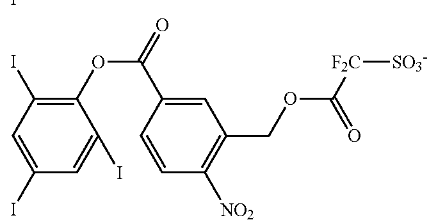
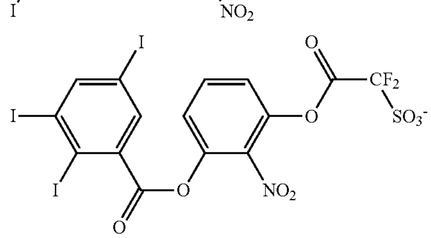
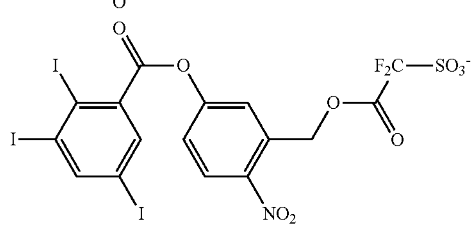
-continued
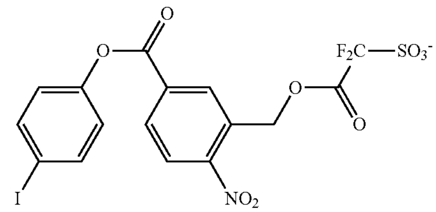
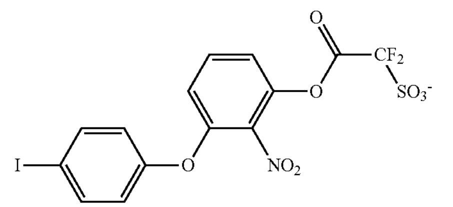
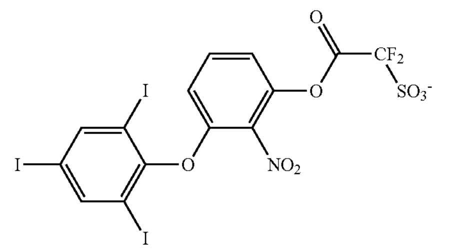
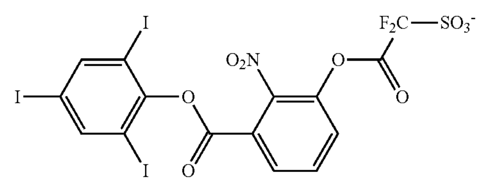
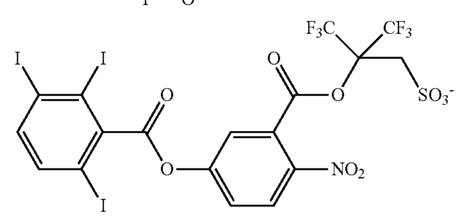
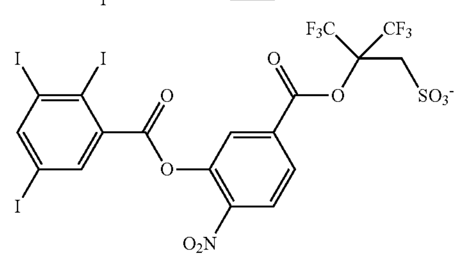
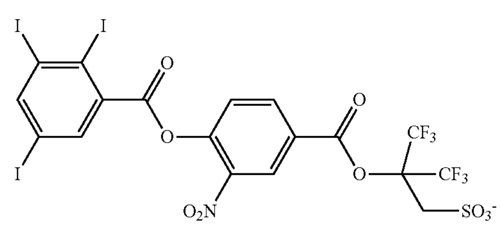
Of the sulfonium salts and the iodonium salts, those having the formulae (A-1-1) and (A-2-1) are preferred because of substantial absorption of EUV, a high sensitivity, and a remarkable LWR or CDU-improving effect.

(A-1-1)

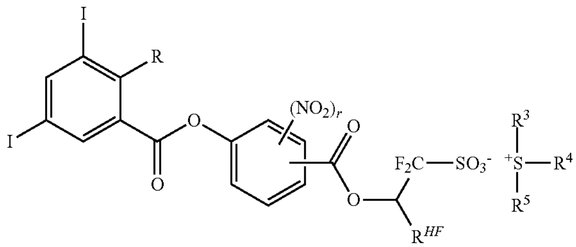

(A-2-1)

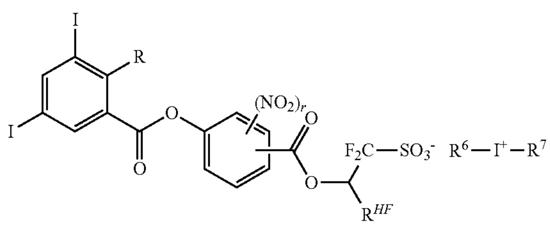

In formulae (A-1-1) and (A-2-1), $R^3$, $R^4$, $R^5$, $R^6$, $R^7$ and r are as defined above. R is iodine or hydroxy. $R^{HF}$ is hydrogen or trifluoromethyl.

With respect to the synthesis of the sulfonium salt having formula (A-1) and the iodonium salt having formula (A-2), one typical method is ion exchange between an ammonium salt of fluorinated sulfonic acid and a sulfonium or iodonium salt of an acid weaker than the fluorinated sulfonic acid. Suitable weaker acids than the fluorinated sulfonic acid include carbonic acid, halogens, and carboxylic acids. Another synthesis method is ion exchange between a sodium or ammonium salt of fluorinated sulfonic acid and a sulfonium chloride or iodonium chloride.

In the resist composition, the sulfonium salt having formula (A-1) or the iodonium salt having formula (A-2) is preferably present in an amount of 0.01 to 1,000 parts by weight, more preferably 0.05 to 500 parts by weight per 100 parts by weight of the base polymer to be described below, from the standpoints of sensitivity and acid diffusion controlling effect.

Base Polymer

Where the resist composition is of positive tone, the base polymer comprises repeat units containing an acid labile group, preferably repeat units having the formula (a1) or repeat units having the formula (a2). These units are simply referred to as repeat units (a1) and (a2).

(a1)

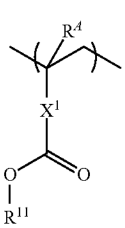

-continued (a2)

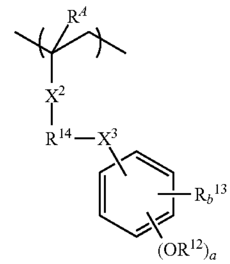

In formulae (a1) and (a2), $R^A$ is each independently hydrogen or methyl. $X^1$ is a single bond, phenylene or naphthylene group, or $C_1$-$C_{12}$ linking group containing an ester bond, ether bond or lactone ring. $X^2$ is a single bond or ester bond. $X^3$ is a single bond, ether bond or ester bond. $R^{11}$ and $R^{12}$ are each independently an acid labile group. When the base polymer contains both repeat units (a1) and (a2), $R^{11}$ and $R^{12}$ may be the same or different. $R^{13}$ is fluorine, trifluoromethyl group, cyano group, a $C_1$-$C_6$ saturated hydrocarbyl group, $C_1$-$C_6$ saturated hydrocarbyloxy group, $C_2$-$C_7$ saturated hydrocarbylcarbonyl group, $C_2$-$C_7$ saturated hydrocarbylcarbonyloxy group, or $C_2$-$C_7$ saturated hydrocarbyloxycarbonyl group. $R^{14}$ is a single bond or a $C_1$-$C_6$ alkanediyl group in which some constituent —$CH_2$— may be replaced by an ether bond or ester bond. The subscript "a" is 1 or 2, and "b" is an integer of 0 to 4.

Examples of the monomer from which the repeat units (a1) are derived are shown below, but not limited thereto. $R^A$ and $R^{11}$ are as defined above.

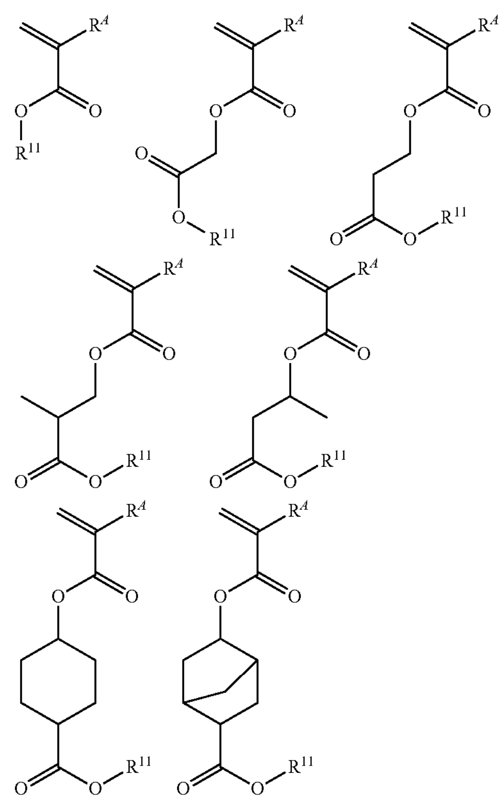

-continued
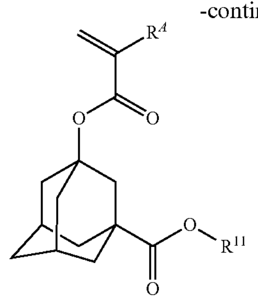
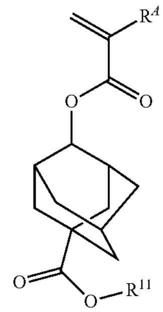
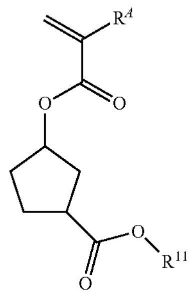
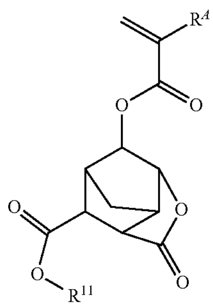
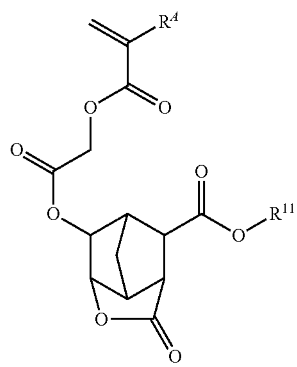
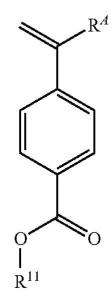
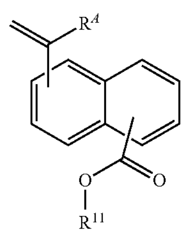
Examples of the monomer from which the repeat units (a2) are derived are shown below, but not limited thereto. $R^A$ and $R^{12}$ are as defined above.
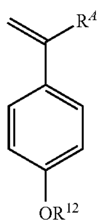
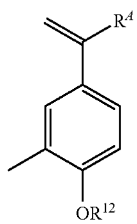
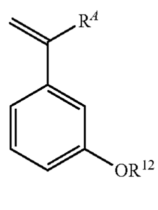
-continued
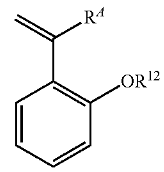
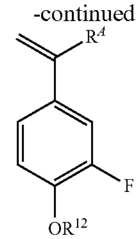
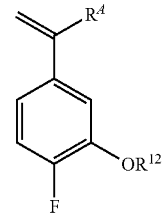
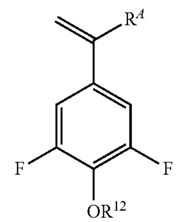
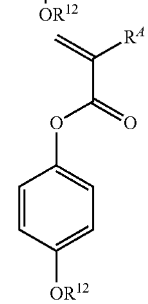
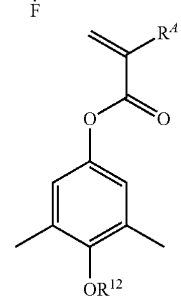
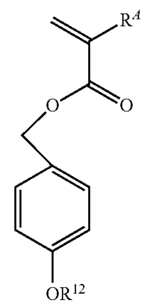
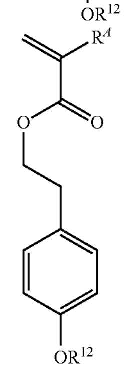
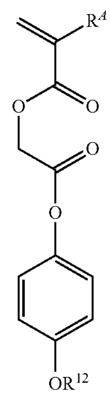
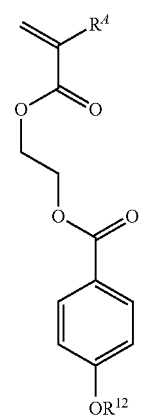
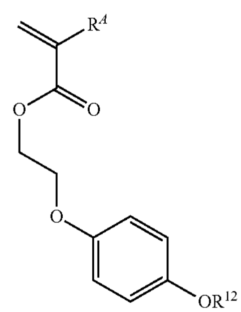
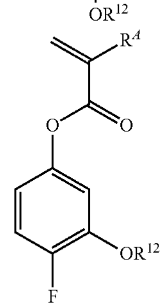
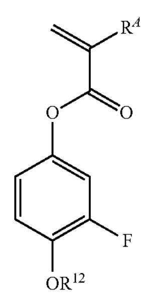
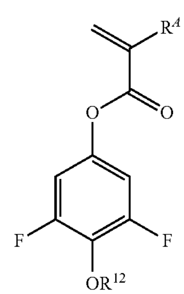
The acid labile groups represented by $R^{11}$ and $R^{12}$ in formulae (a1) and (a2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

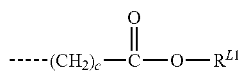

(AL-1)

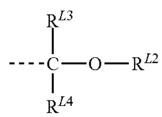

(AL-2)

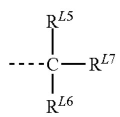

(AL-3)

In formulae (AL-1) and (AL-2), $R^{L1}$ and $R^{L2}$ are each independently a $C_1$-$C_{40}$ hydrocarbyl group which may contain a heteroatom such as oxygen, sulfur, nitrogen or fluorine. The hydrocarbyl group may be saturated or unsaturated and straight, branched or cyclic. Inter alia, $C_1$-$C_{40}$ saturated hydrocarbyl groups are preferred, and $C_1$-$C_{20}$ saturated hydrocarbyl groups are more preferred.

In formula (AL-1), c is an integer of 0 to 10, preferably 1 to 5.

In formula (AL-2), $R^{L3}$ and $R^{L4}$ are each independently hydrogen or a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Inter alia, $C_1$-$C_{20}$ saturated hydrocarbyl groups are preferred. Any two of $R^{L2}$, $R^{L3}$ and $R^{L4}$ may bond together to form a $C_3$-$C_{20}$ ring with the carbon atom or carbon and oxygen atoms to which they are attached. The ring preferably contains 4 to 16 carbon atoms and is typically alicyclic.

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Inter alia, $C_1$-$C_{20}$ saturated hydrocarbyl groups are preferred. Any two of $R^{L5}$, $R^{L6}$ and $R^{L7}$ may bond together to form a $C_3$-$C_{20}$ ring with the carbon atom to which they are attached. The ring preferably contains 4 to 16 carbon atoms and is typically alicyclic.

The base polymer may further comprise repeat units (b) having a phenolic hydroxy group as an adhesive group. Examples of suitable monomers from which repeat units (b) are derived are given below, but not limited thereto. Herein $R^A$ is as defined above.

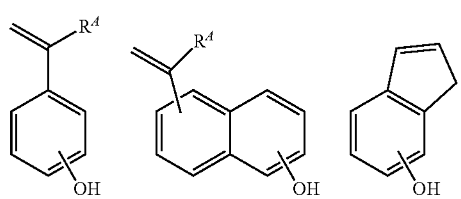

-continued

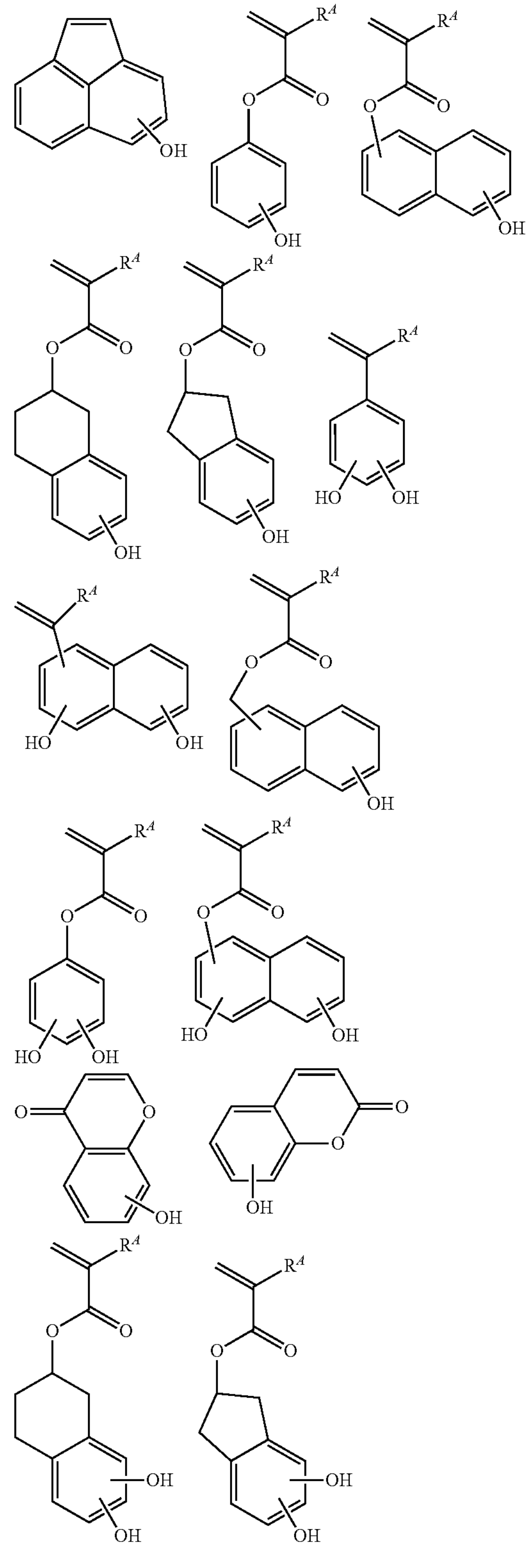

Further, repeat units (c) having another adhesive group selected from hydroxy group (other than the foregoing phenolic hydroxy), lactone ring, sultone ring, ether bond, ester bond, sulfonate bond, carbonyl group, sulfonyl group, cyano group, and carboxy group may also be incorporated in the base polymer. Examples of suitable monomers from which repeat units (c) are derived are given below, but not limited thereto. Herein $R^A$ is as defined above.
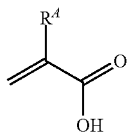
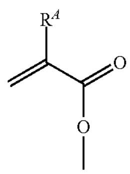
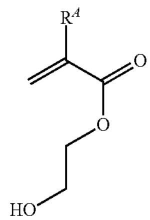
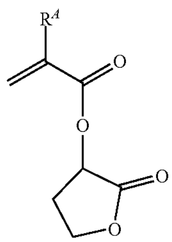
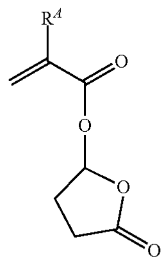
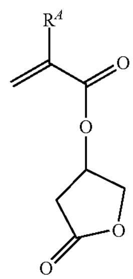
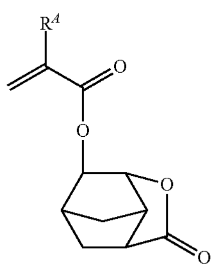
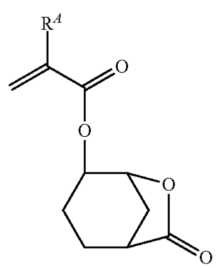
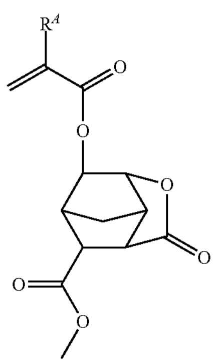
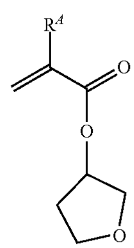
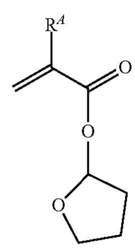
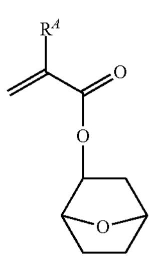
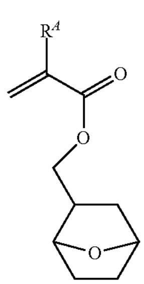
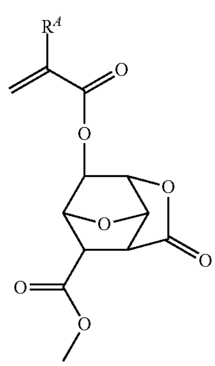
-continued
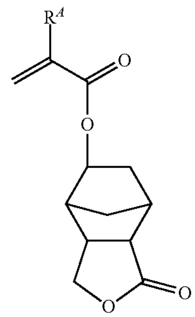
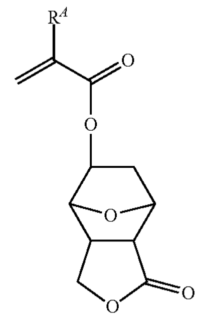
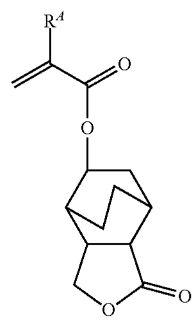
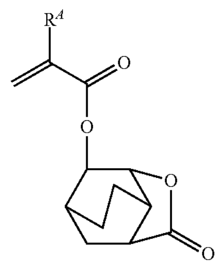
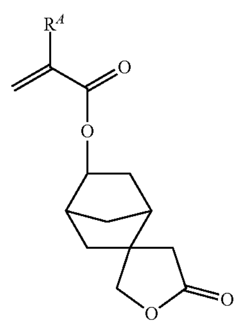
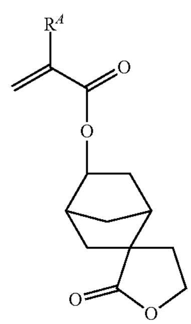
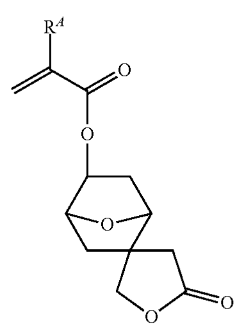
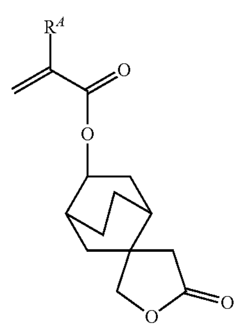
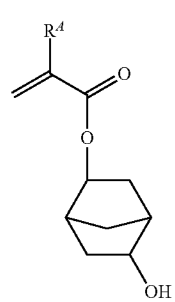
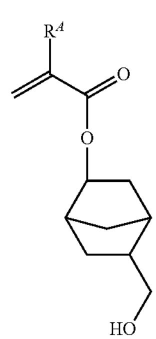
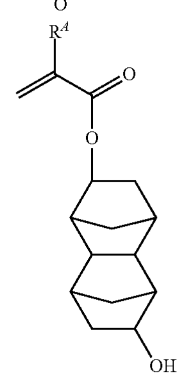

-continued
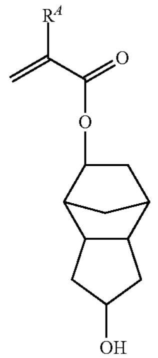
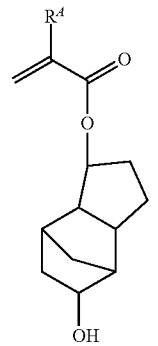
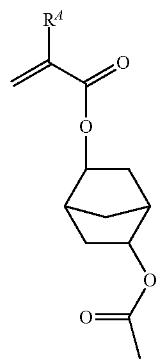
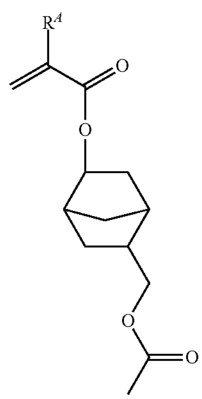
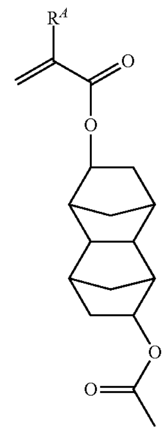
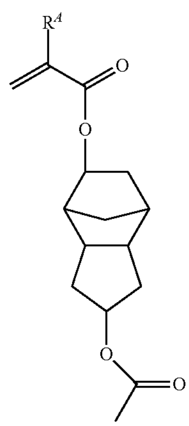
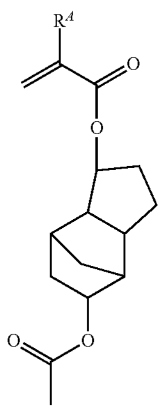
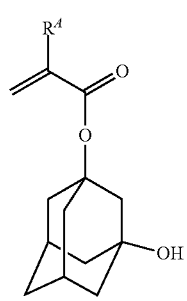
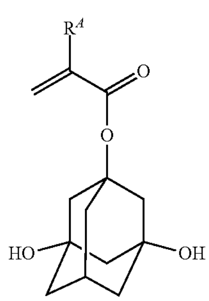
-continued
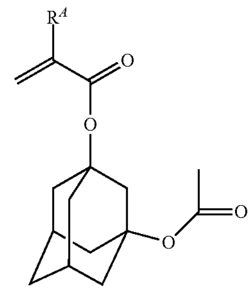
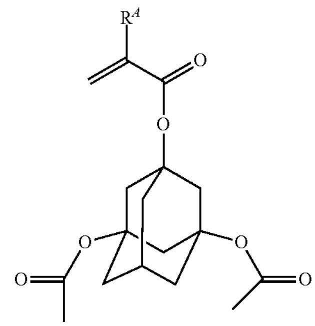
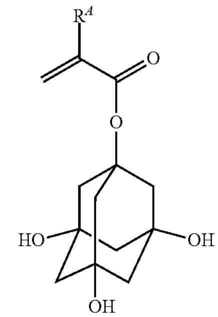
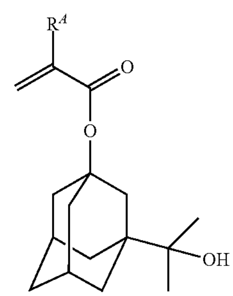
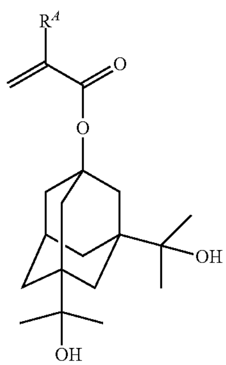
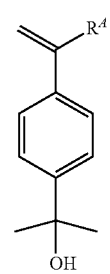
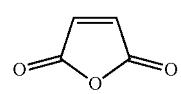
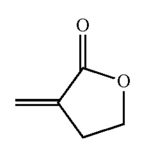
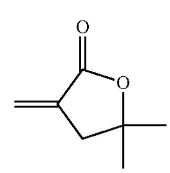
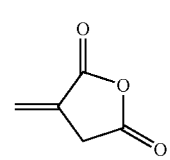
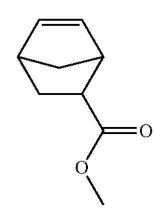
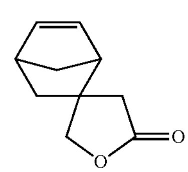
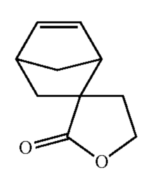
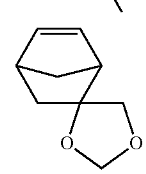

-continued
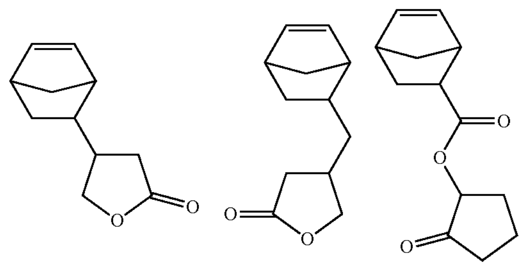
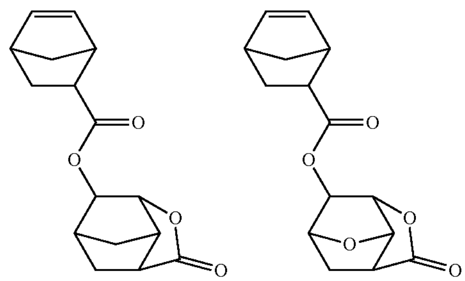
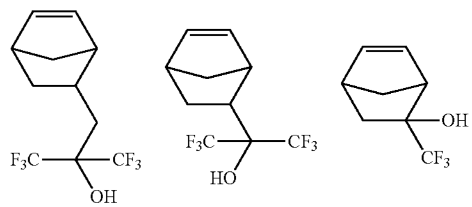
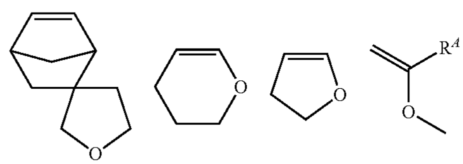
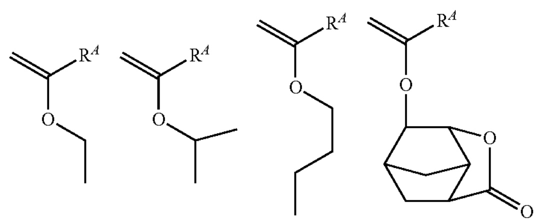
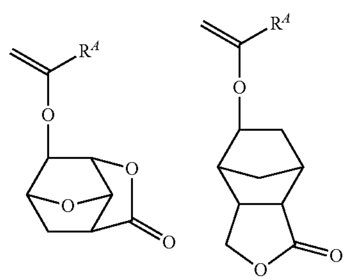
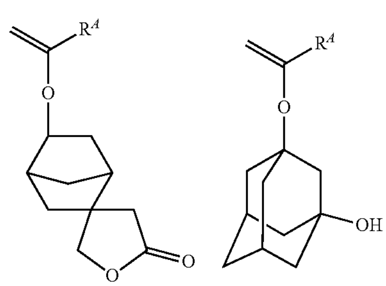
-continued
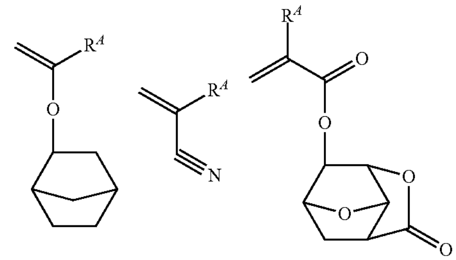
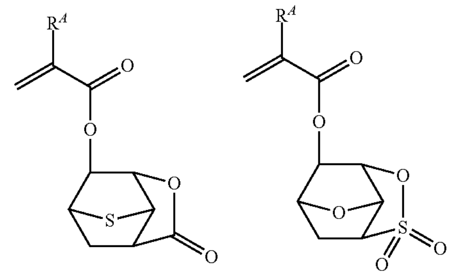
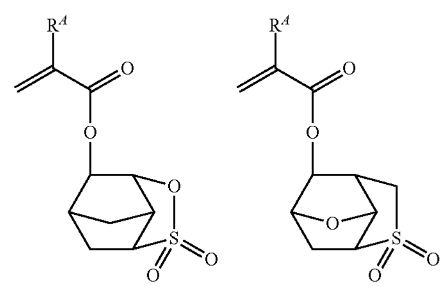
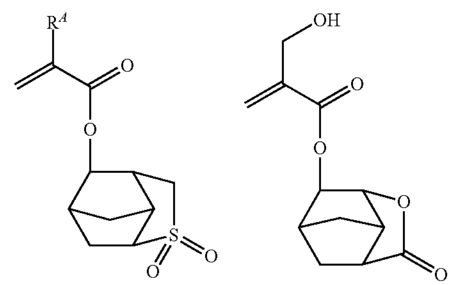
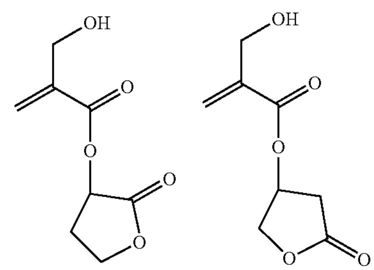
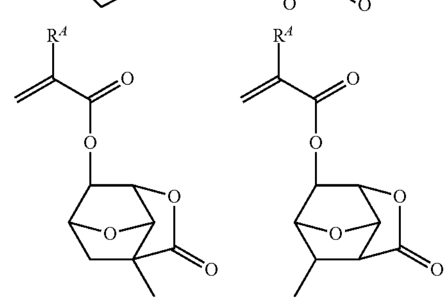

-continued
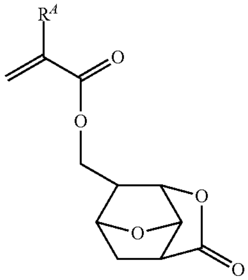
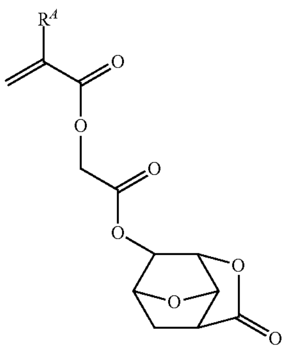
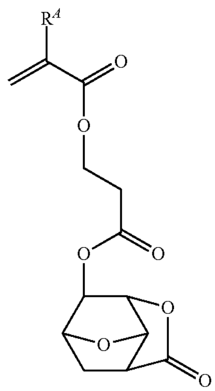
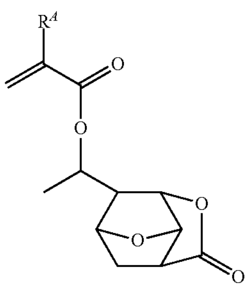
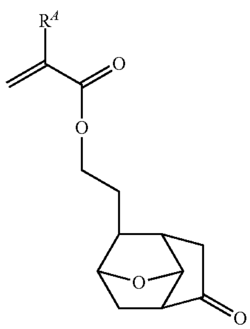
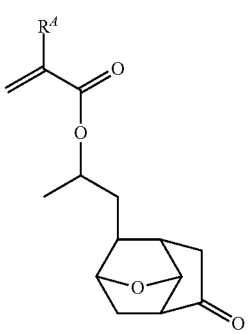
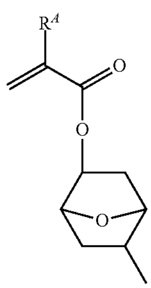
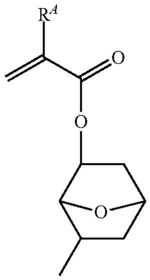
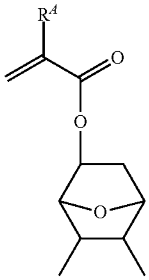
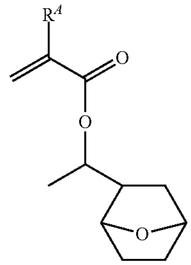
-continued
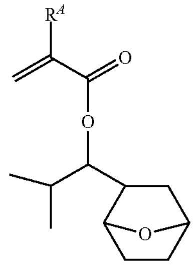
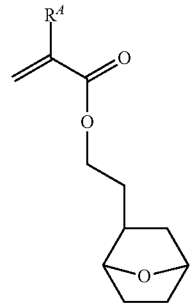
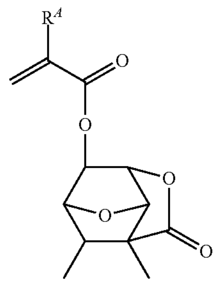
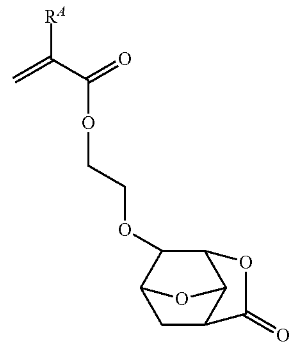
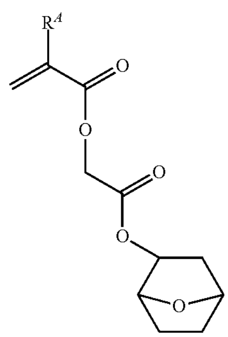
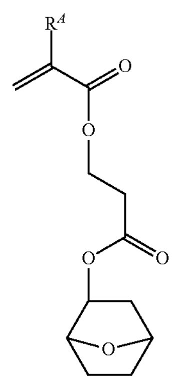
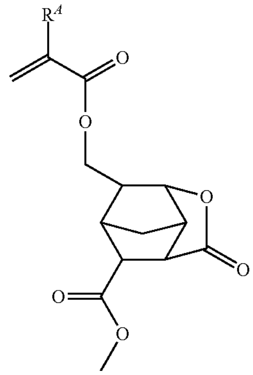

-continued
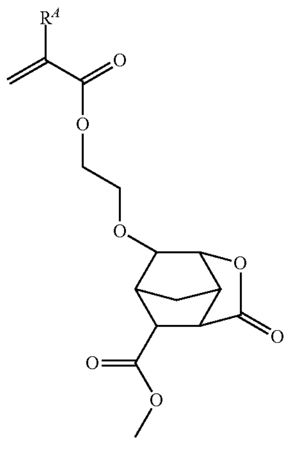
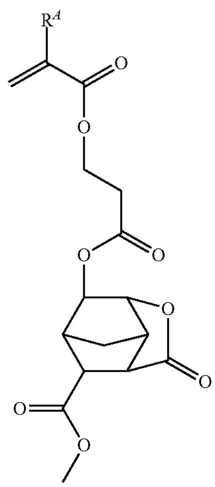
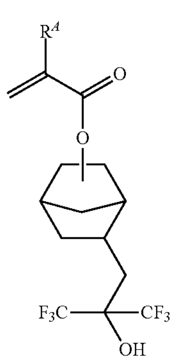
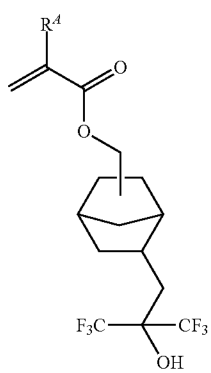
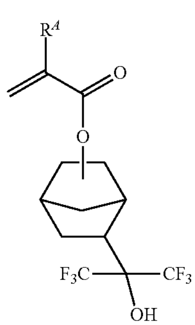
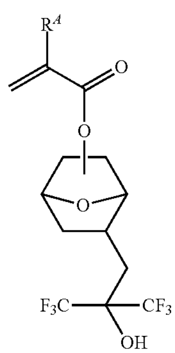
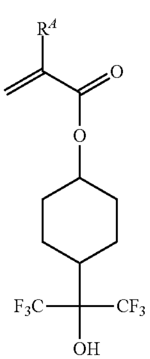
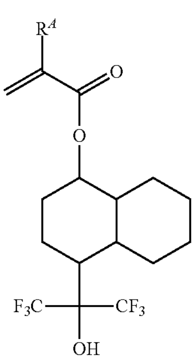
-continued
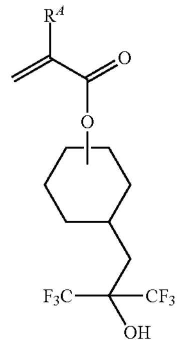
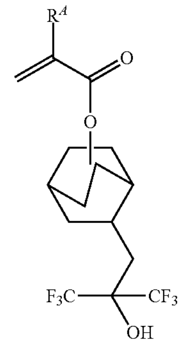
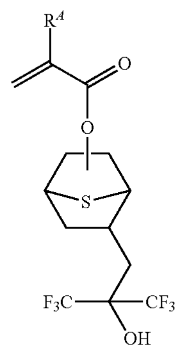
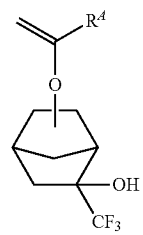
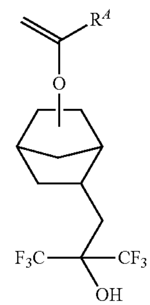
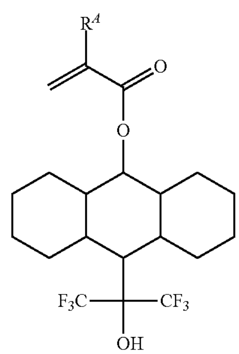
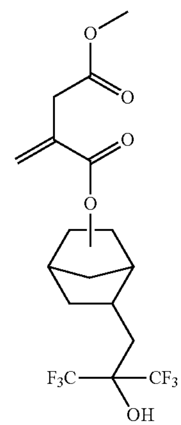
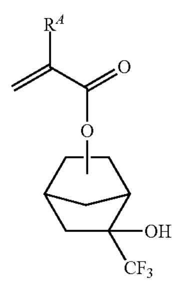
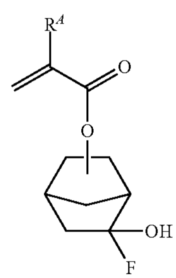
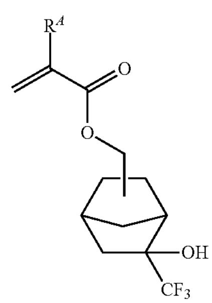
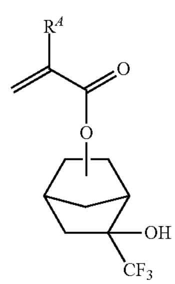

-continued
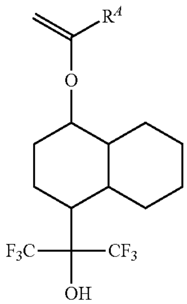
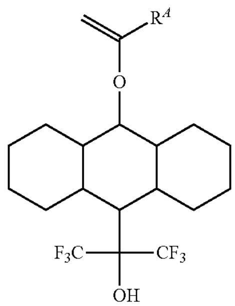
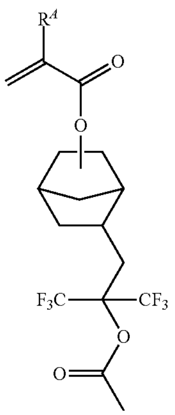
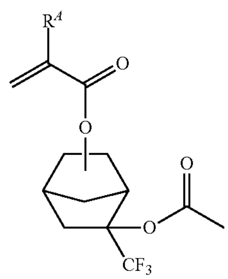
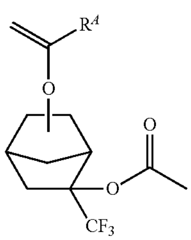
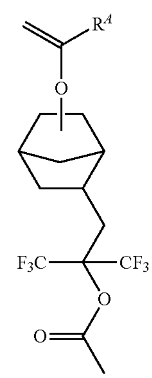
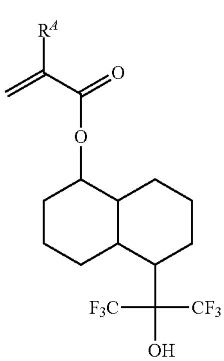
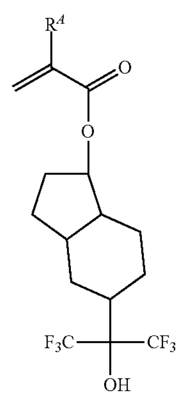
-continued
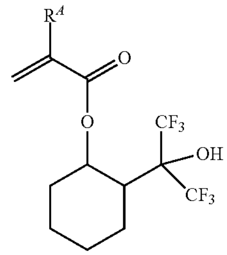
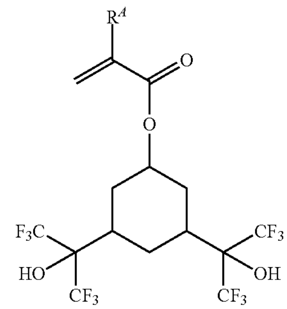
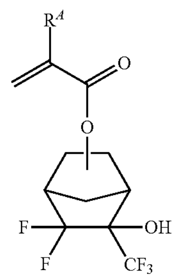
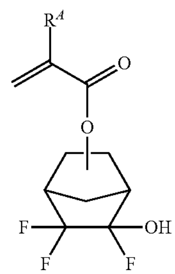
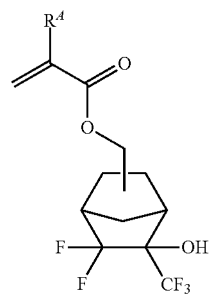
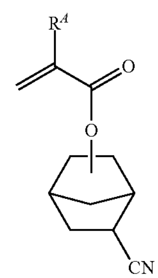
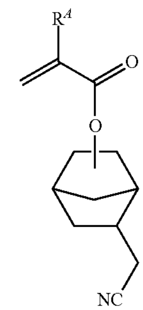
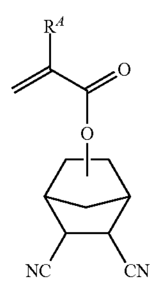
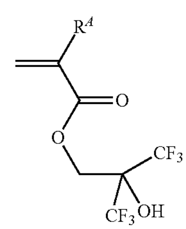
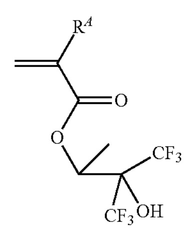
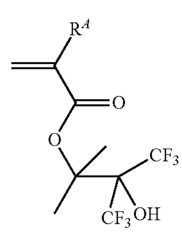
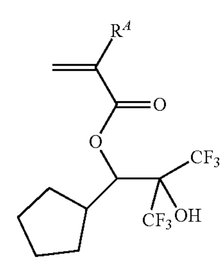
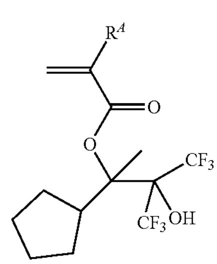
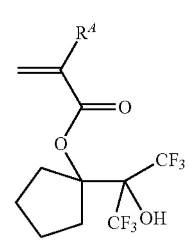

-continued
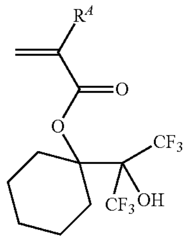
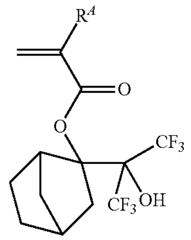
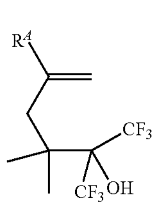
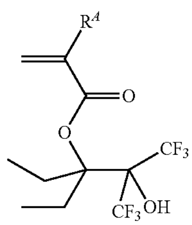
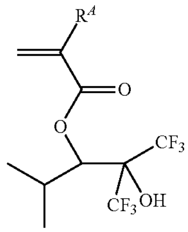
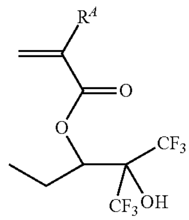
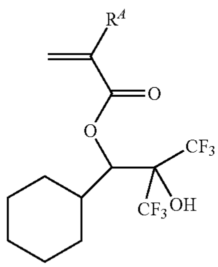
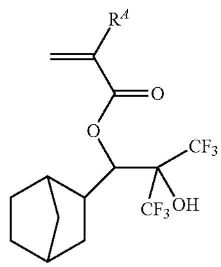
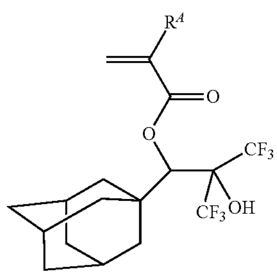
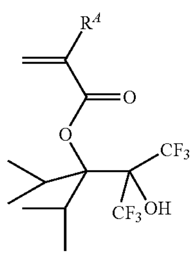
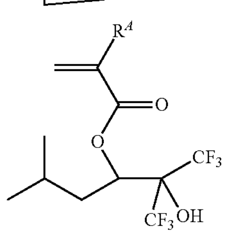
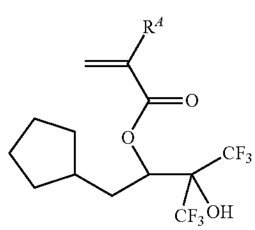
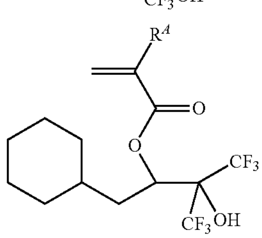
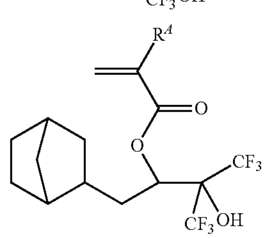
-continued
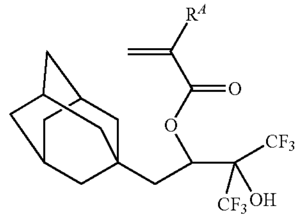
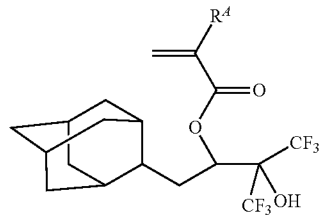
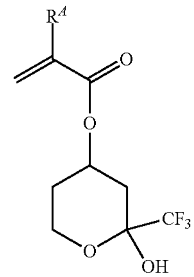
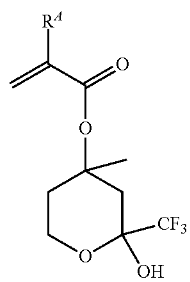
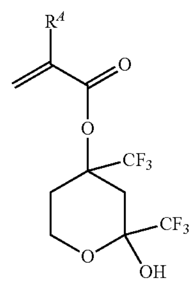
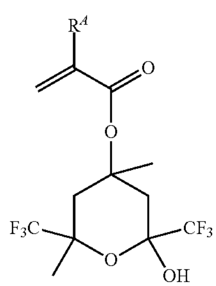
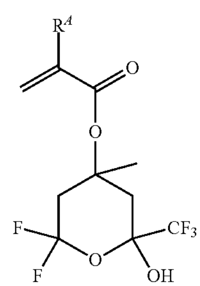
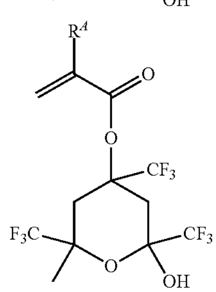
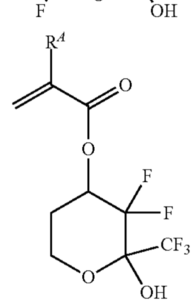
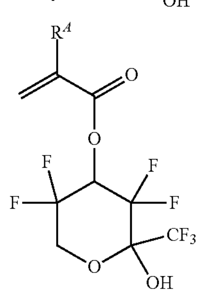
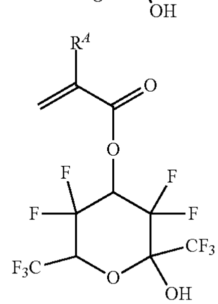

-continued
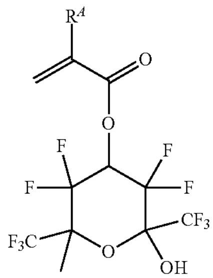
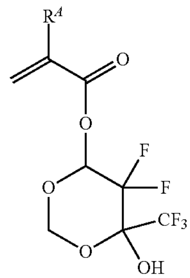
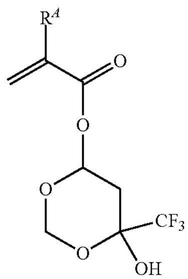
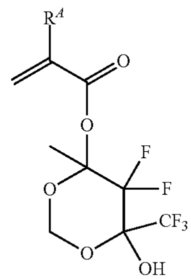
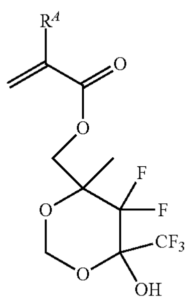
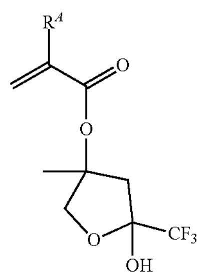
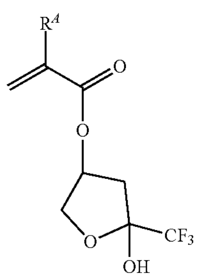
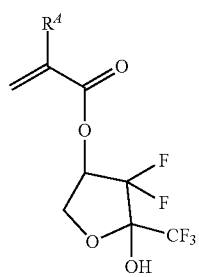
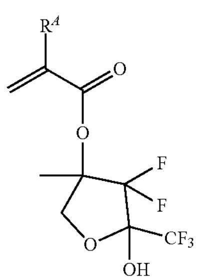
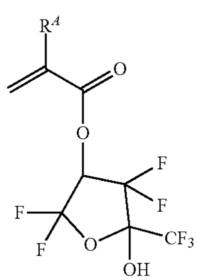
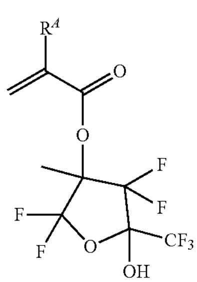
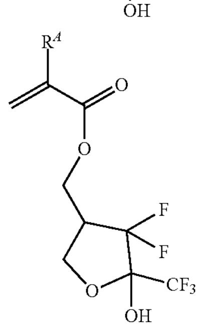
-continued
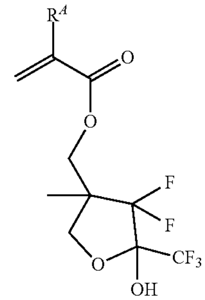
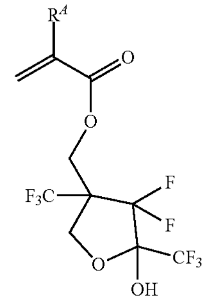
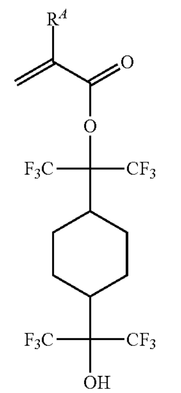
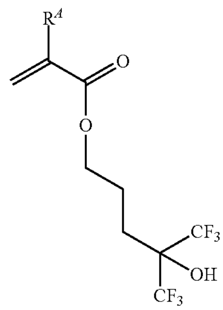
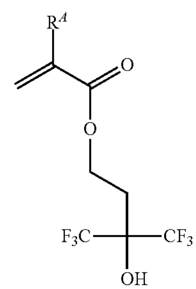
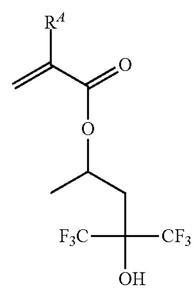
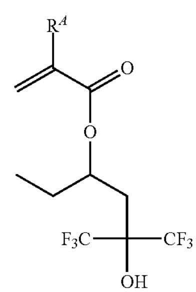
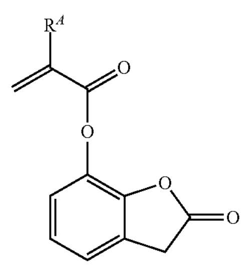
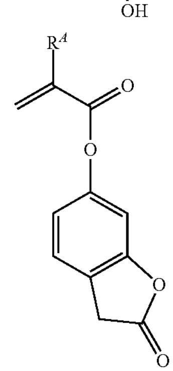
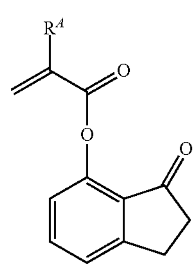

-continued
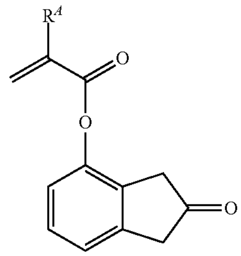
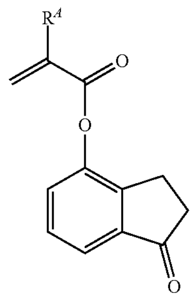
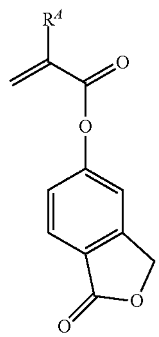
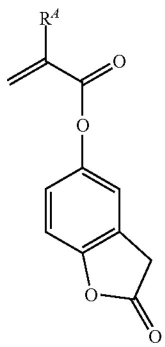
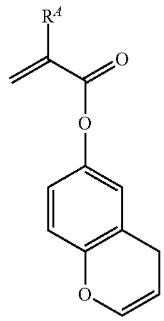
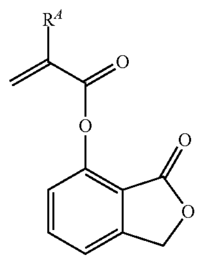
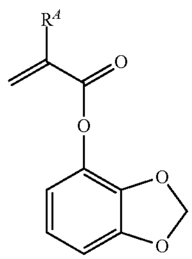
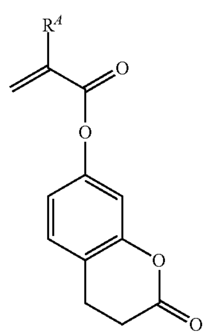
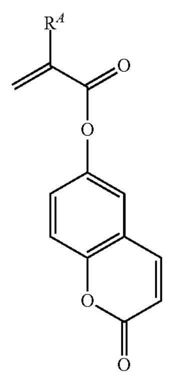
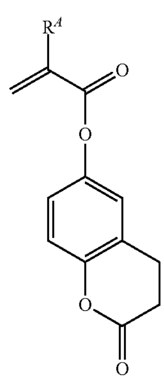
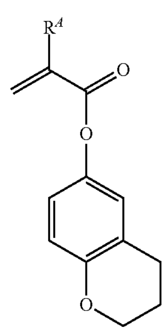
-continued
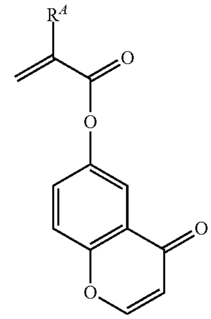
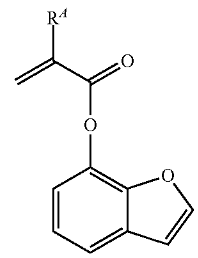
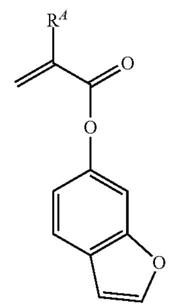
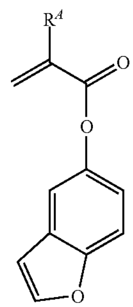
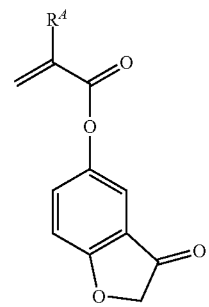
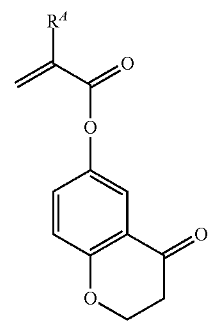
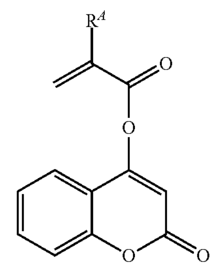
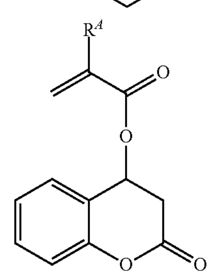
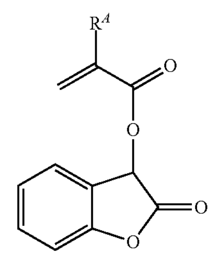
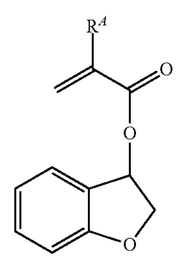
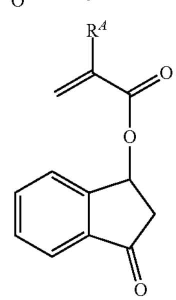
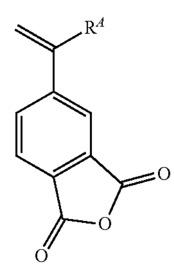
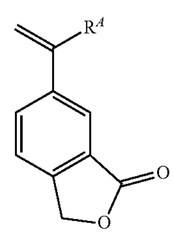
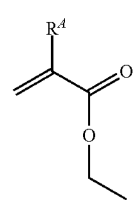
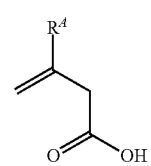

-continued
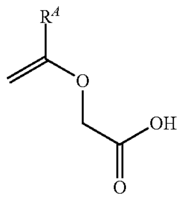
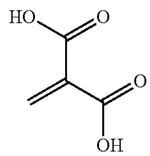
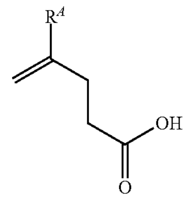
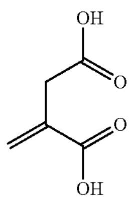
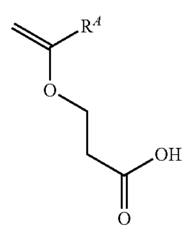
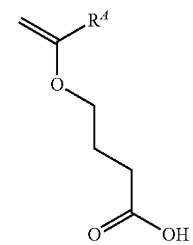
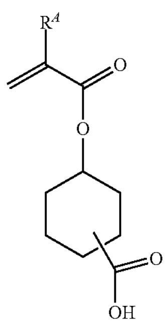
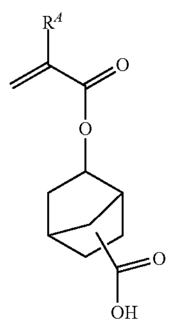
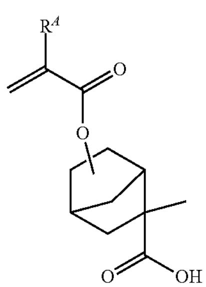
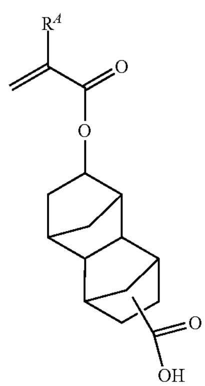
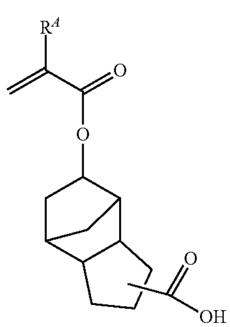
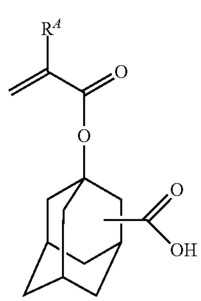
-continued
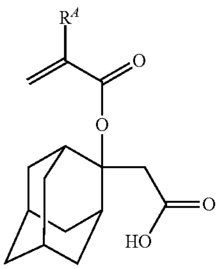
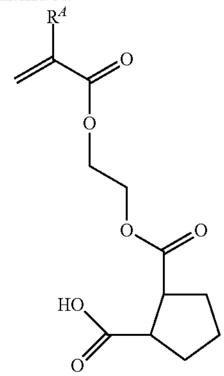
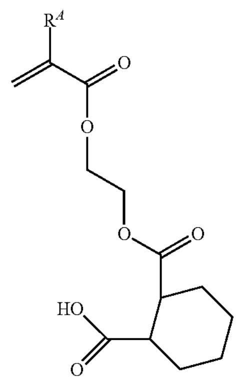
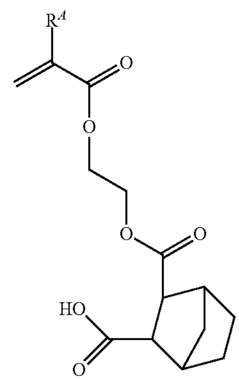
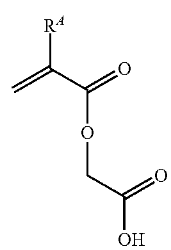
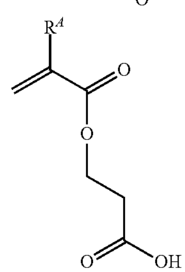
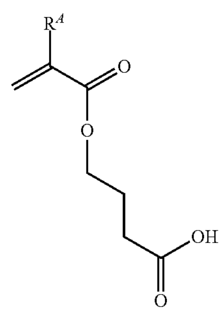
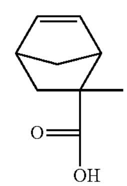
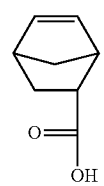
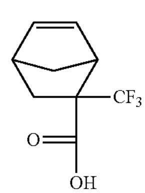
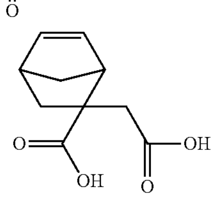
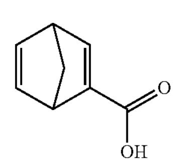
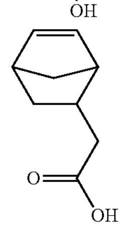

In another preferred embodiment, the base polymer may further comprise repeat units (d) derived from indene, benzofuran, benzothiophene, acenaphthylene, chromone, coumarin, and norbornadiene, or derivatives thereof. Suitable monomers are exemplified below.

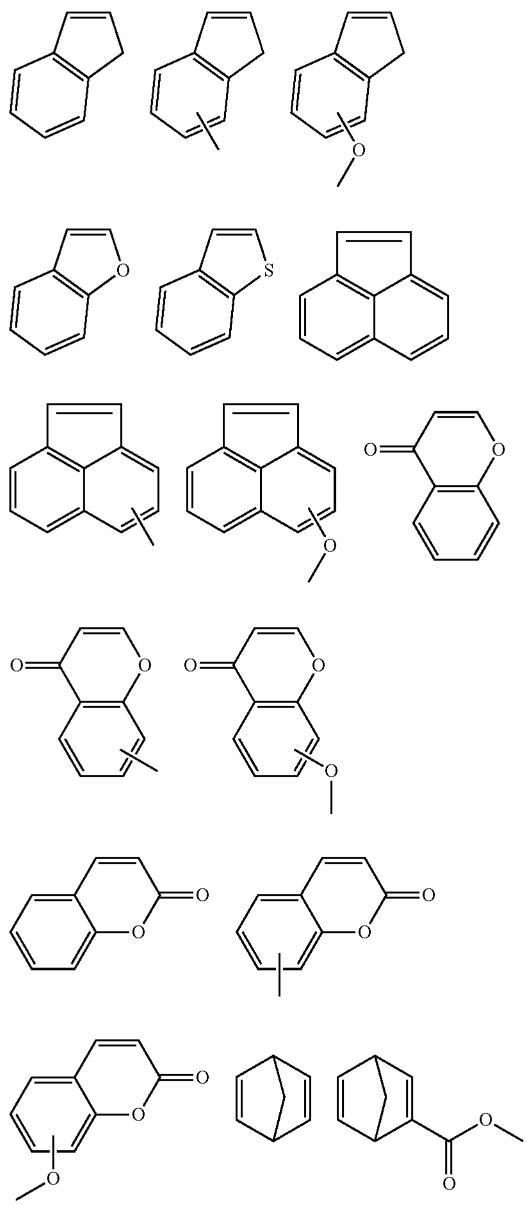

Furthermore, repeat units (e) may be incorporated in the base polymer, which are derived from styrene, vinylnaphthalene, vinylanthracene, vinylpyrene, methyleneindene, vinylpyridine, or vinylcarbazole.

In a further embodiment, repeat units (f) derived from an onium salt having a polymerizable unsaturated bond may be incorporated in the base polymer. Specifically, the base polymer may comprise repeat units of at least one type selected from repeat units having formulae (f1), (f2) and (f3). These units are simply referred to as repeat units (f1), (f2) and (f3), which may be used alone or in combination of two or more types.

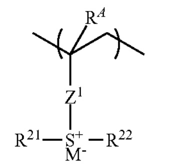

(f1)

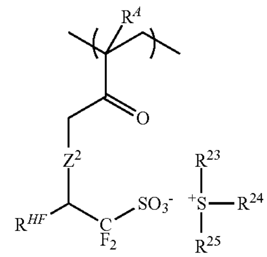

(f2)

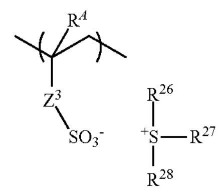

(f3)

In formulae (f1) to (f3), $R^A$ is independently hydrogen or methyl. $Z^1$ is a single bond, $C_1$-$C_6$ aliphatic hydrocarbylene group, phenylene group, naphthylene group, or $C_7$-$C_{18}$ group obtained by combining the foregoing, —O—$Z^{11}$—, —C(═O)—O—$Z^{11}$—, or —C(═O)—NH—$Z^{11}$—. $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety. $Z^2$ is a single bond, —$Z^{21}$—C(═O)—O—, —$Z^{21}$—O— or —$Z^{21}$—O—C(═O)—. $Z^{21}$ is a $C_1$-$C_{12}$ saturated hydrocarbylene group which may contain a carbonyl moiety, ester bond or ether bond. $Z^3$ is a single bond, methylene, ethylene, phenylene, fluorinated phenylene, trifluoromethyl-substituted phenylene group, —O—$Z^{31}$—, —C(═O)—O—$Z^{31}$—, or —C(═O)—NH—$Z^{31}$—. $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety.

In formulae (f1) to (f3), $R^{21}$ to $R^{28}$ are each independently halogen or a $C_1$-$C_{20}$ hydrocarbyl group which may contain a heteroatom. The hydrocarbyl group may be saturated or unsaturated and straight, branched or cyclic. Examples thereof are as exemplified above for $R^3$ to $R^7$ in formulae (A-1) and (A-2). In these groups, some or all of the hydrogen atoms may be substituted by a moiety containing a heteroatom such as oxygen, sulfur, nitrogen or halogen and some constituent —$CH_2$— may be replaced by a moiety containing a heteroatom such as oxygen, sulfur or nitrogen, so that the group may contain a hydroxy moiety, fluorine, chlorine, bromine, iodine, cyano moiety, nitro moiety, carbonyl moiety, ether bond, ester bond, sulfonate bond, carbonate bond, lactone ring, sultone ring, carboxylic anhydride (—C(═O)—O—C(═O)—), or haloalkyl moiety.

A pair of $R^{23}$ and $R^{24}$, or $R^{26}$ and $R^{27}$ may bond together to form a ring with the sulfur atom to which they are attached. Examples of the ring are as exemplified above for the ring that $R^3$ and $R^4$ in formula (A-1), taken together, form with the sulfur atom to which they are attached.

In formula (f2), $R^{H}F$ is hydrogen or trifluoromethyl.

In formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (f1-1) and sulfonate ions having fluorine substituted at α-position and trifluoromethyl at β-position as represented by the formula (f1-2).

$$R^{31}—CF_2—SO_3^- \quad \text{(f1-1)}$$

(f1-2)

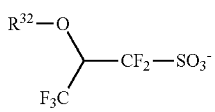

In formula (f1-1), $R^{31}$ is hydrogen, or a $C_1$-$C_{20}$ hydrocarbyl group which may contain an ether bond, ester bond, carbonyl moiety, lactone ring, or fluorine atom.

In formula (f1-2), $R^{32}$ is hydrogen, or a $C_1$-$C_{30}$ hydrocarbyl group or $C_2$-$C_{30}$ hydrocarbylcarbonyl group, which may contain an ether bond, ester bond, carbonyl moiety or lactone ring.

The hydrocarbyl group and hydrocarbyl moiety in the hydrocarbylcarbonyl group represented by $R^{31}$ and $R^{32}$ may be saturated or unsaturated and straight, branched or cyclic. Suitable hydrocarbyl groups include alkyl groups such as methyl, ethyl, n-propyl, isopropyl, n-butyl, isobutyl, sec-butyl, tert-butyl, pentyl, neopentyl, hexyl, heptyl, 2-ethylhexyl, nonyl, undecyl, tridecyl, pentadecyl, heptadecyl, icosanyl; cyclic saturated hydrocarbyl groups such as cyclopentyl, cyclohexyl, 1-adamantyl, 2-adamantyl, 1-adamantylmethyl, norbornyl, norbomylmethyl, tricyclodecanyl, tetracyclododecanyl, tetracyclododecanylmethyl, dicyclohexylmethyl; alkenyl groups such as allyl; cyclic unsaturated hydrocarbyl groups such as 3-cyclohexenyl; aryl groups such as phenyl, 1-naphthyl, 2-naphthyl; aralkyl groups such as benzyl and diphenylmethyl; and combinations thereof.

In the hydrocarbyl and hydrocarbylcarbonyl groups, some or all of the hydrogen atoms may be substituted by a moiety containing a heteroatom such as oxygen, sulfur, nitrogen or halogen, or some constituent $—CH_2—$ may be replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic ester bond, carbonate bond, lactone ring, sultone ring, carboxylic anhydride (—C(═O)—O—C(═O)—) or haloalkyl moiety. Examples of the heteroatom-containing hydrocarbyl group include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

Examples of the cation in the monomer from which repeat unit (f1) is derived are shown below, but not limited thereto. $R^A$ is as defined above.

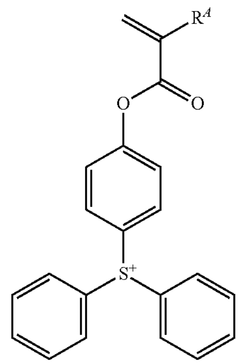

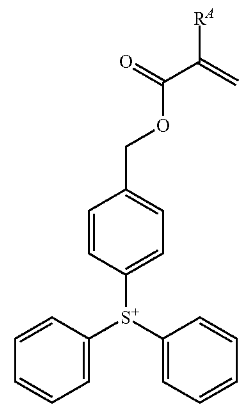

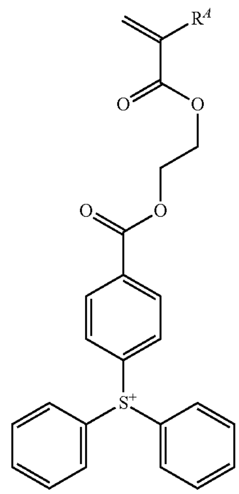

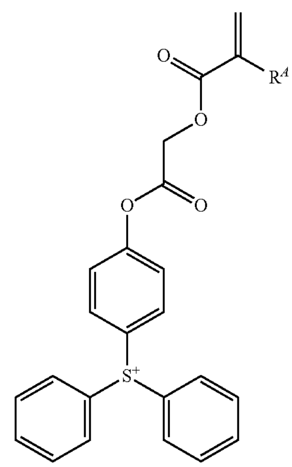

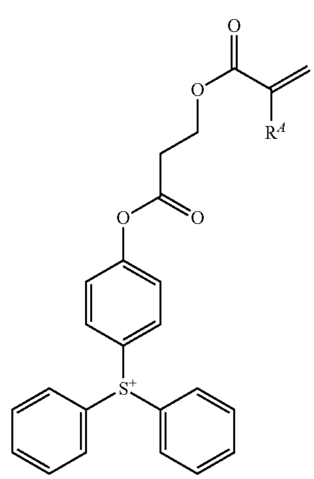

-continued
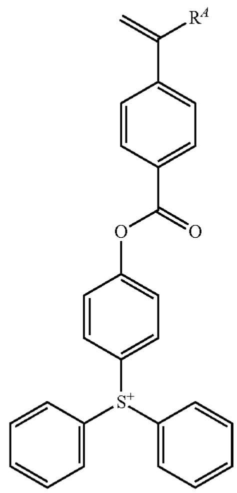
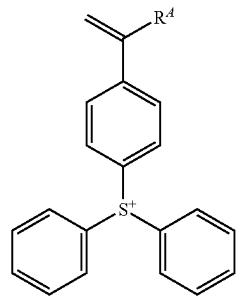
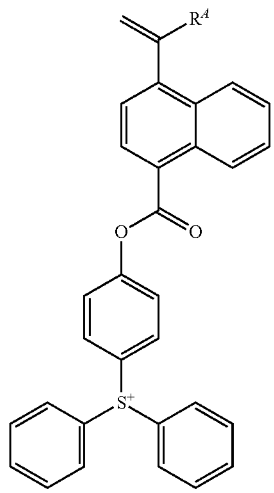
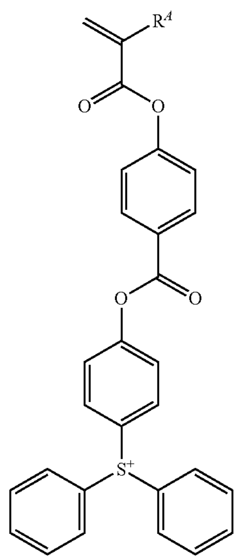
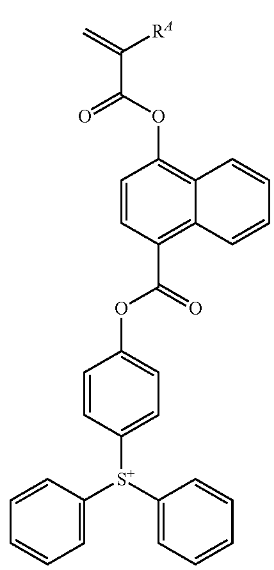
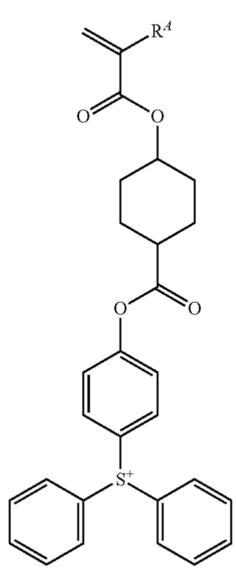
-continued
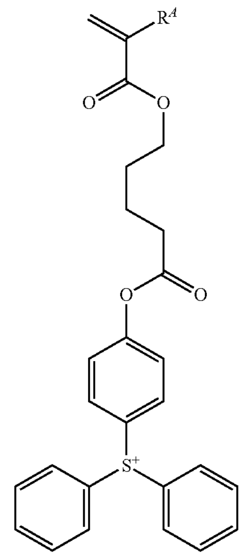
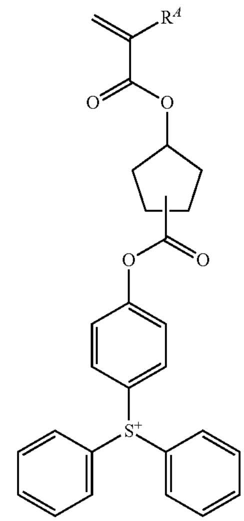
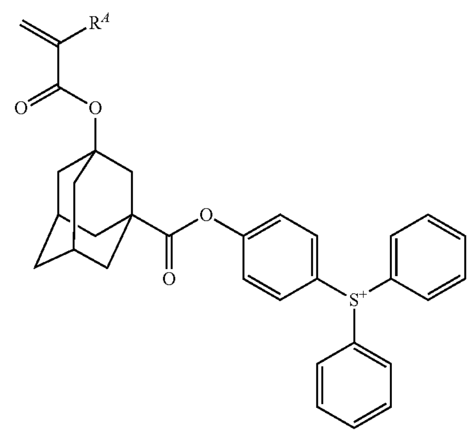
Examples of the cation in the monomer from which repeat unit (f2) or (f3) is derived are as exemplified above for the cation in the sulfonium salt having formula (A-1).
Examples of the anion in the monomer from which repeat unit (f2) is derived are shown below, but not limited thereto. $R^A$ is as defined above.
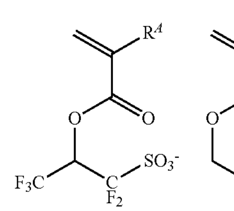
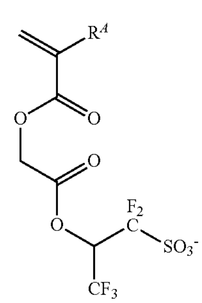

-continued
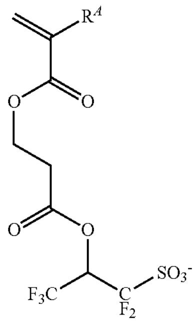
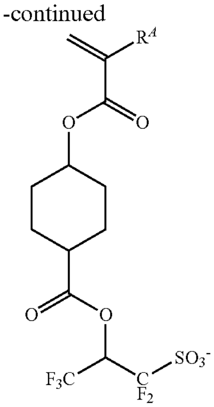
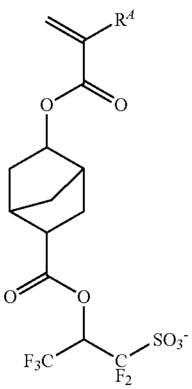
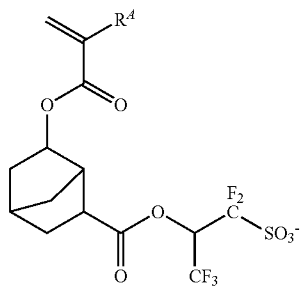
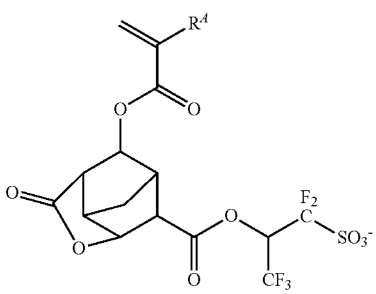
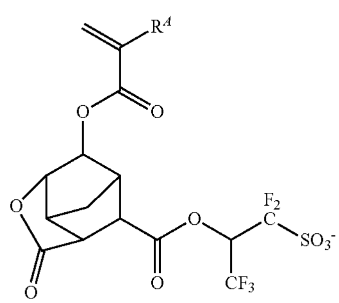
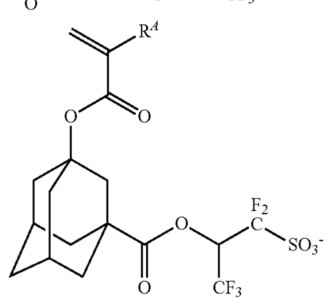
-continued
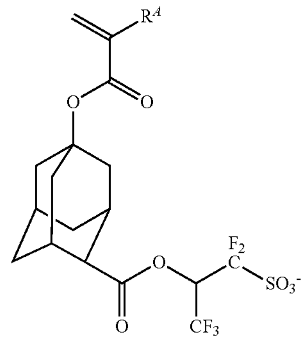
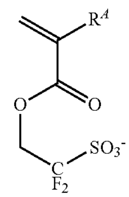
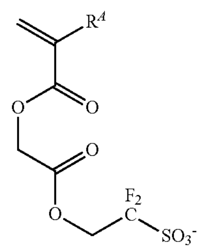
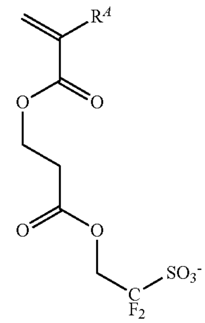
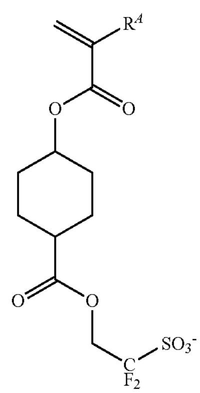
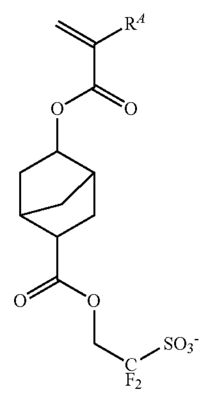
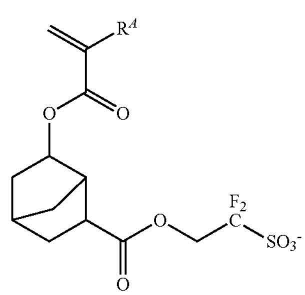
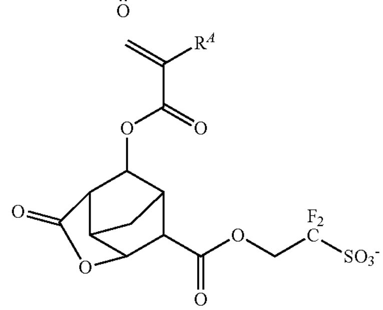

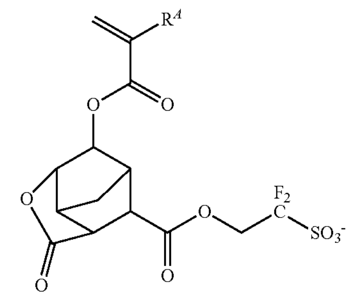
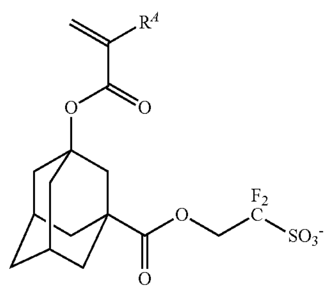
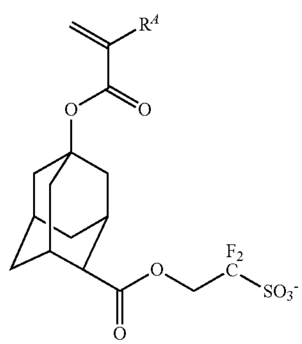
Examples of the anion in the monomer from which repeat unit (f3) is derived are shown below, but not limited thereto. $R^A$ is as defined above.
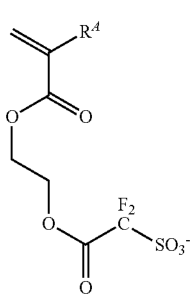
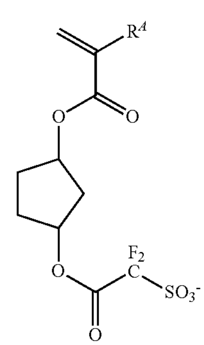
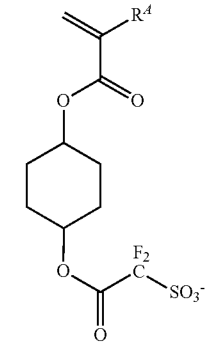
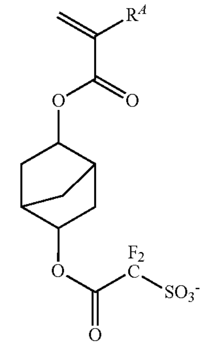
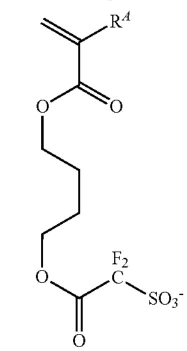
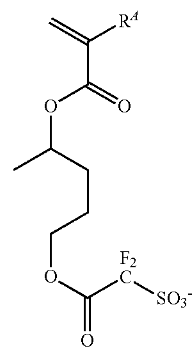
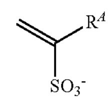
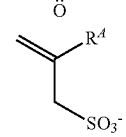
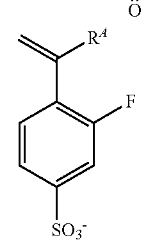
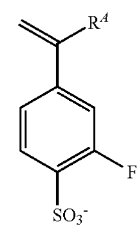
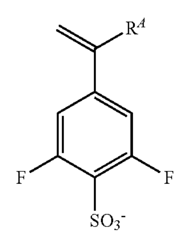
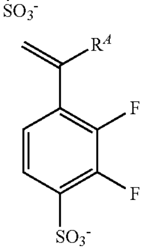
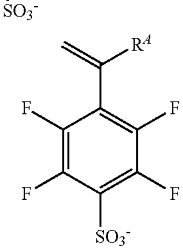
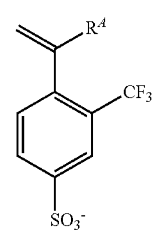
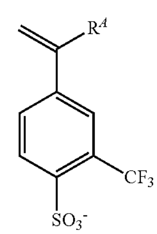
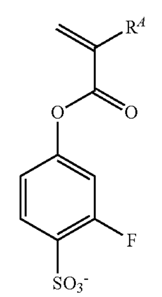
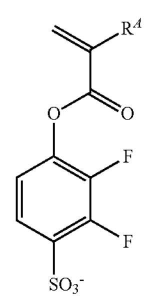
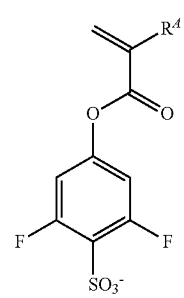
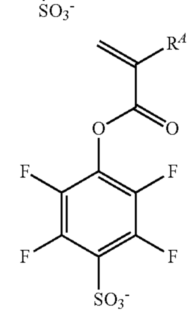

-continued

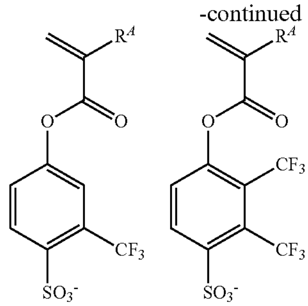

The attachment of an acid generator to the polymer main chain is effective in restraining acid diffusion, thereby preventing a reduction of resolution due to blur by acid diffusion. Also, LWR or CDU is improved since the acid generator is uniformly distributed.

The base polymer for formulating the positive resist composition comprises repeat units (a1) or (a2) having an acid labile group as essential component and additional repeat units (b), (c), (d), (e), and (f) as optional components. A fraction of units (a1), (a2), (b), (c), (d), (e), and (f) is: preferably $0 \le a1 < 1.0$, $0 \le a2 < 1.0$, $0 < a1+a2 < 1.0$, $0 \le b \le 0.9$, $0 \le c \le 0.9$, $0 \le d \le 0.8$, $0 \le e \le 0.8$, and $0 \le f \le 0.5$; more preferably $0 \le a1 \le 0.9$, $0 \le a2 \le 0.9$, $0.1 \le a1+a2 \le 0.9$, $0 \le b \le 0.8$, $0 \le c \le 0.8$, $0 \le d \le 0.7$, $0 \le e \le 0.7$, and $0 \le f \le 0.4$; and even more preferably $0 \le a1 \le 0.8$, $0 \le a2 \le 0.8$, $0.1 \le a1+a2 \le 0.8$, $0 \le b \le 0.75$, $0 \le c \le 0.75$, $0 \le d \le 0.6$, $0 \le e \le 0.6$, and $0 \le f \le 0.3$. Notably, $f=f1+f2+f3$, meaning that unit (f) is at least one of units (f1) to (f3), and $a1+a2+b+c+d+e+f=1.0$.

For the base polymer for formulating the negative resist composition, an acid labile group is not necessarily essential. The base polymer comprises repeat units (b), and optionally repeat units (c), (d), (e), and/or (f). A fraction of these units is: preferably $0 < b \le 1.0$, $0 \le c \le 0.9$, $0 \le d \le 0.8$, $0 \le e \le 0.8$, and $0 \le f \le 0.5$; more preferably $0.2 \le b \le 1.0$, $0 \le c \le 0.8$, $0 \le d \le 0.7$, $0 \le e \le 0.7$, and $0 \le f \le 0.4$; and even more preferably $0.3 \le b \le 1.0$, $0 \le c \le 0.75$, $0 \le d \le 0.6$, $0 \le e \le 0.6$, and $0 \le f \le 0.3$. Notably, $f=f1+f2+f3$, meaning that unit (f) is at least one of units (f1) to (f3), and $b+c+d+e+f=1.0$.

The base polymer may be synthesized by any desired methods, for example, by dissolving one or more monomers selected from the monomers corresponding to the foregoing repeat units in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably, the reaction temperature is 50 to 80° C. and the reaction time is 2 to 100 hours, more preferably 5 to 20 hours.

Where a monomer having a hydroxy group is copolymerized, the hydroxy group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. A Mw in the range ensures that a resist film has satisfactory heat resistance and solubility in alkaline developer.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, Mw or Mw/Mn is acceptable.

Organic Solvent

An organic solvent may be added to the resist composition. The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Exemplary solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, 1-ethoxy-2-propanol, and diacetone alcohol (DAA); ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Quencher

The resist composition may further contain a quencher. As used herein, the quencher refers to a compound capable of trapping the acid, which is generated by the acid generator in the resist composition upon light exposure, to prevent the acid from diffusing to the unexposed region.

The quencher is typically selected from conventional basic compounds. Conventional basic compounds include primary, secondary, and tertiary aliphatic amines, mixed amines, aromatic amines, heterocyclic amines, nitrogen-containing compounds with carboxy group, nitrogen-containing compounds with sulfonyl group, nitrogen-containing compounds with hydroxy group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxy, ether, ester, lactone ring, cyano, or sulfonic ester group as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium salts, iodonium salts and ammonium salts of sulfonic acids which are not fluorinated at α-position as described in U.S. Pat. No. 8,795,942 (JP-A 2008-158339) and similar onium salts of carboxylic acid may also be used as the quencher. While an α-fluorinated sulfonic acid, imide acid, and methide acid are necessary to deprotect the acid labile group of carboxylic acid ester, an α-non-fluorinated sulfonic acid or carboxylic acid is released by salt exchange with an α-non-fluorinated onium salt. An α-non-fluorinated sulfonic acid and a carboxylic acid function as a quencher because they do not induce deprotection reaction.

Examples of the quencher include compounds having the formula (B), i.e., onium salts of α-non-fluorinated sulfonic acid and compounds having the formula (C), i.e., onium salts of carboxylic acid.

$$R^{101}—SO_3^-Mq^+ \qquad (B)$$

$$R^{102}—CO_2^-Mq^+ \qquad (C)$$

In formula (B), $R^{101}$ is hydrogen or a $C_1$-$C_{40}$ hydrocarbyl group which may contain a heteroatom, exclusive of the hydrocarbyl group in which the hydrogen bonded to the carbon atom at α-position of the sulfone group is substituted by fluorine or fluoroalkyl.

The hydrocarbyl group may be saturated or unsaturated and straight, branched or cyclic. Examples thereof include $C_1$-$C_{40}$ alkyl groups such as methyl, ethyl, n-propyl, isopropyl, n-butyl, sec-butyl, tert-butyl, tert-pentyl, n-pentyl, n-hexyl, n-octyl, 2-ethylhexyl, n-nonyl, and n-decyl; $C_3$-$C_{40}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbomyl, tricyclo[5.2.1.$0^{2,6}$]decanyl, adamantyl, and adamantylmethyl; $C_2$-$C_{40}$ alkenyl groups such as vinyl, allyl, propenyl, butenyl, and hexenyl; $C_3$-$C_{40}$ cyclic unsaturated aliphatic hydrocarbyl groups such as cyclohexenyl; $C_6$-$C_{40}$ aryl groups such as phenyl, naphthyl, alkylphenyl groups, e.g., 2-methylphenyl, 3-methylphenyl, 4-methylphenyl, 4-ethylphenyl, 4-tert-butylphenyl, 4-n-butylphenyl, dialkylphenyl groups, e.g., 2,4-dimethylphenyl and 2,4,6-triisopropylphenyl, alkylnaphthyl groups, e.g., methylnaphthyl and ethylnaphthyl, dialkylnaphthyl groups, e.g., dimethylnaphthyl and diethylnaphthyl; heteroaryl groups such as thienyl; $C_7$-$C_{40}$ aralkyl groups such as benzyl, 1-phenylethyl and 2-phenylethyl; and combinations thereof.

In the hydrocarbyl group, some or all of the hydrogen atoms may be substituted by a moiety containing a heteroatom such as oxygen, sulfur, nitrogen or halogen, and some constituent $—CH_2—$ may be replaced by a moiety containing a heteroatom such as oxygen, sulfur or nitrogen, so that the group may contain a hydroxy moiety, fluorine, chlorine, bromine, iodine, cyano moiety, nitro moiety, carbonyl moiety, ether bond, ester bond, sulfonic ester bond, carbonate bond, lactone ring, sultone ring, carboxylic anhydride (—C(═O)—O—C(═O)—), or haloalkyl moiety. Examples of the heteroatom-containing hydrocarbyl group include 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, and 3-tert-butoxyphenyl; alkoxynaphthyl groups such as methoxynaphthyl, ethoxynaphthyl, n-propoxynaphthyl and n-butoxynaphthyl; dialkoxynaphthyl groups such as dimethoxynaphthyl and diethoxynaphthyl; and aryloxoalkyl groups, typically 2-aryl-2-oxoethyl groups such as 2-phenyl-2-oxoethyl, 2-(1-naphthyl)-2-oxoethyl, and 2-(2-naphthyl)-2-oxoethyl.

In formula (C), $R^{102}$ is a $C_1$-$C_{40}$ hydrocarbyl group which may contain a heteroatom. Examples of the hydrocarbyl group $R^{102}$ are as exemplified above for the hydrocarbyl group $R^{101}$. Also included are fluorinated alkyl groups such as trifluoromethyl, trifluoroethyl, 2,2,2-trifluoro-1-methyl-1-hydroxyethyl, 2,2,2-trifluoro-1-trifluoromethyl-1-hydroxyethyl, and fluorinated aryl groups such as pentafluorophenyl and 4-trifluoromethylphenyl.

In formulae (B) and (C), $Mq^+$ is an onium cation. The preferred onium cations are sulfonium, iodonium and ammonium cations, with the sulfonium and iodonium cations being more preferred. Examples of the sulfonium and iodonium cations are as exemplified above for the cations in the sulfonium and iodonium salts having formulae (A-1) and (A-2), respectively.

A sulfonium salt of iodized benzene ring-containing carboxylic acid having the formula (D) is also useful as the quencher.

(D)

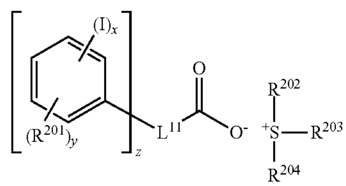

In formula (D), $R^{201}$ is hydroxy, fluorine, chlorine, bromine, amino, nitro, cyano, or a $C_1$-$C_6$ saturated hydrocarbyl, $C_1$-$C_6$ saturated hydrocarbyloxy, $C_2$-$C_6$ saturated hydrocarbylcarbonyloxy or $C_1$-$C_4$ saturated hydrocarbylsulfonyloxy group, in which some or all hydrogen may be substituted by halogen, or $—N(R^{201A})(R^{201B})$, $—N(R^{201C})—C(═O)—R^{201D}$, or $—N(R^{201C})—C(═O)—O—R^{210D}$. $R^{201A}$ and $R^{201B}$ are each independently hydrogen or a $C_1$-$C_6$ saturated hydrocarbyl group. $R^{201C}$ is hydrogen or a $C_1$-$C_6$ saturated hydrocarbyl group. $R^{201D}$ is a $C_1$-$C_6$ saturated hydrocarbyl or $C_2$-$C_8$ unsaturated aliphatic hydrocarbyl group. The saturated hydrocarbyl, saturated hydrocarbyloxy, saturated hydrocarbylcarbonyloxy, and saturated hydrocarbylsulfonyloxy groups may be straight, branched or cyclic. Groups $R^{201}$ may be the same or different when y and/or z is 2 or 3.

In formula (D), x is an integer of 1 to 5, y is an integer of 0 to 3, and z is an integer of 1 to 3. $L^{11}$ is a single bond, or a $C_1$-$C_{20}$ (z+1)-valent linking group which may contain at least one moiety selected from ether bond, carbonyl moiety, ester bond, amide bond, sultone ring, lactam ring, carbonate bond, halogen, hydroxy moiety, and carboxy moiety.

In formula (D), $R^{202}$, $R^{203}$ and $R^{204}$ are each independently halogen, or a $C_1$-$C_{20}$ hydrocarbyl group which may contain a heteroatom. The hydrocarbyl group may be saturated or unsaturated and straight, branched or cyclic. Examples thereof are as exemplified above for the hydrocarbyl groups $R^3$ to $R^7$ in formulae (A-1) and (A-2). In the hydrocarbyl groups, some or all hydrogen may be substituted by hydroxy, carboxy, halogen, oxo, cyano, nitro, sultone, sulfone, or sulfonium salt-containing moiety, or some constituent —$CH_2$— may be replaced by an ether bond, ester bond, carbonyl moiety, amide bond, carbonate bond or sulfonic ester bond. Also $R^{202}$ and $R^{203}$ may bond together to form a ring with the sulfur atom to which they are attached. Examples of the ring are as exemplified for the ring that $R^3$ and $R^4$ in formula (A-1), taken together, form with the sulfur atom to which they are attached.

Examples of the compound having formula (D) include those described in U.S. Pat. No. 10,295,904 (JP-A 2017-219836).

Also useful are quenchers of polymer type as described in U.S. Pat. No. 7,598,016 (JP-A 2008-239918). The polymeric quencher segregates at the resist film surface after coating and thus enhances the rectangularity of resist pattern. When a protective film is applied as is often the case in the immersion lithography, the polymeric quencher is also effective for preventing a film thickness loss of resist pattern or rounding of pattern top.

The quencher is preferably added in an amount of 0 to 20 parts by weight, more preferably 0.1 to 10 parts by weight per 100 parts by weight of the base polymer.

Other Components

In addition to the foregoing components, the resist composition may further contain other components such as an acid generator other than the sulfonium or iodonium salt having formula (A-1) or (A-2), surfactant, dissolution inhibitor, crosslinker, water repellency improver, and acetylene alcohol. Each additional component may be used alone or in admixture of two or more.

The other acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880), JP-A 2018-005224, and JP-A 2018-025789. The other acid generator is preferably added in an amount of 0 to 200 parts, more preferably 0.1 to 100 parts by weight per 100 parts by weight of the base polymer.

Exemplary surfactants are described in JP-A 2008-111103, paragraphs [0165]-[0166]. Inclusion of a surfactant may improve or control the coating characteristics of the resist composition. The surfactant is preferably added in an amount of 0.0001 to 10 parts by weight per 100 parts by weight of the base polymer.

In the case of positive resist compositions, inclusion of a dissolution inhibitor may lead to an increased difference in dissolution rate between exposed and unexposed areas and a further improvement in resolution. The dissolution inhibitor which can be used herein is a compound having at least two phenolic hydroxy groups on the molecule, in which an average of from 0 to 100 mol % of all the hydrogen atoms on the phenolic hydroxy groups are replaced by acid labile groups or a compound having at least one carboxy group on the molecule, in which an average of 50 to 100 mol % of all the hydrogen atoms on the carboxy groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxy or carboxy group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per 100 parts by weight of the base polymer.

In the case of negative resist compositions, a negative pattern may be formed by adding a crosslinker to reduce the dissolution rate of exposed area. Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyloxy group. These compounds may be used as an additive or introduced into a polymer side chain as a pendant. Hydroxy-containing compounds may also be used as the crosslinker.

Suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyloxy-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer.

To the resist composition, a water repellency improver may also be added for improving the water repellency on surface of a resist film. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in alkaline developers and organic solvent developers.

The water repellency improver of specific structure with a 1,1,1,3,3,3-hexafluoro-2-propanol residue is well soluble in the developer. A polymer comprising repeat units having an amino group or amine salt serves as the water repellency improver and is effective for preventing evaporation of acid during PEB, thus preventing any hole pattern opening failure after development. An appropriate amount of the water repellency improver is 0 to 20 parts, preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer.

Process

The resist composition is used in the fabrication of various integrated circuits. Pattern formation using the resist composition may be performed by well-known lithography processes. The process generally involves the steps of applying the resist composition onto a substrate to form a resist film thereon, exposing the resist film to high-energy radiation, and developing the exposed resist film in a developer. If necessary, any additional steps may be added.

For example, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hotplate at a temperature of 60 to 150° C. for 10 seconds to 30 minutes, preferably at 80 to 120° C. for 30 seconds to 20 minutes. The resulting resist film is generally 0.01 to 2 μm thick.

Then the resist film is exposed to high-energy radiation. Examples of the high-energy radiation include UV, deep-UV, EB, EUV of wavelength 3 to 15 nm, x-ray, soft x-ray, excimer laser light, γ-ray or synchrotron radiation. On use of UV, deep UV, EUV, x-ray, soft x-ray, excimer laser, γ-ray or synchrotron radiation, the resist film is exposed directly or through a mask having a desired pattern, preferably in a dose of about 1 to 200 $mJ/cm^2$, more preferably about 10 to 100 $mJ/cm^2$. On use of EB, a pattern may be written directly or through a mask having a desired pattern, preferably in a dose of about 0.1 to 1,000 $\mu C/cm^2$, more preferably about 0.5 to 200 $\mu C/cm^2$. The resist composition is suited for micropatterning using high-energy radiation such as i-line of wavelength 365 nm, KrF excimer laser, ArF excimer laser, EB, EUV, x-ray, soft x-ray, γ-ray or synchrotron radiation, especially EB or EUV.

After the exposure, the resist film may be baked (PEB) on a hotplate or in an oven at 50 to 150° C. for 10 seconds to 30 minutes, preferably at 60 to 120° C. for 30 seconds to 20 minutes.

After the exposure or PEB, the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

Acid generators PAG-1 to PAG-20 in the form of sulfonium or iodonium salts used in resist compositions have the structure shown below. They were synthesized by ion exchange between an ammonium salt of fluorinated sulfonic acid providing the anion shown below and a sulfonium or iodonium chloride providing the cation shown below.

PAG-1

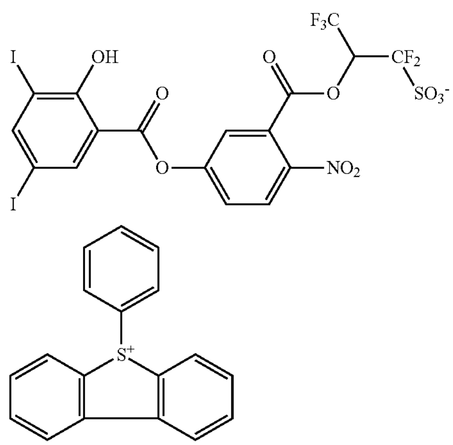

PAG-2

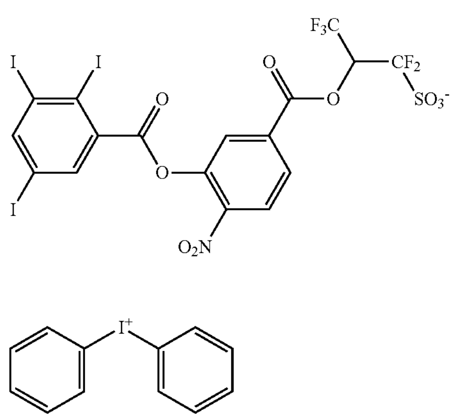

-continued

PAG-3

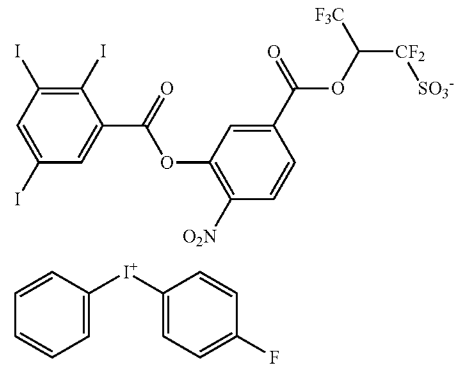

PAG-4

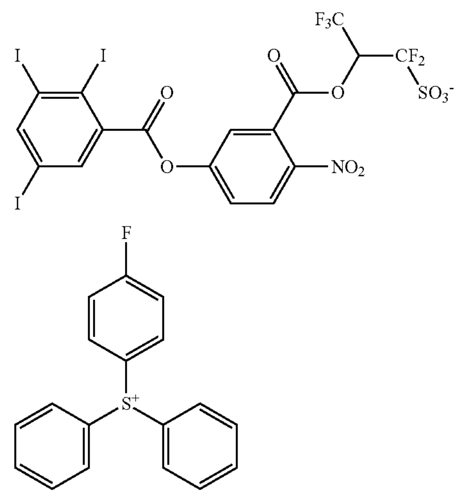

PAG-5

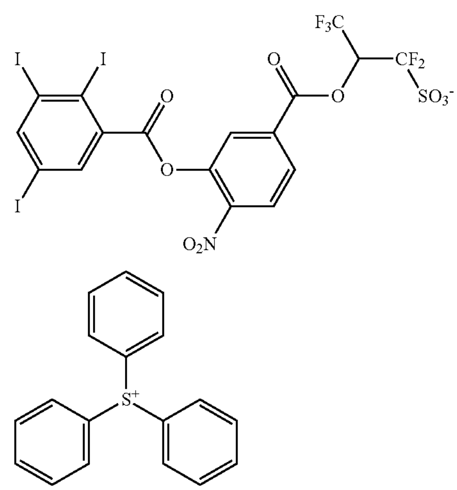

PAG-6

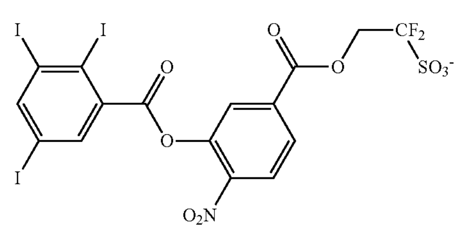

-continued
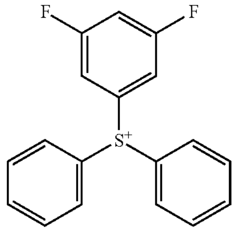
PAG-7
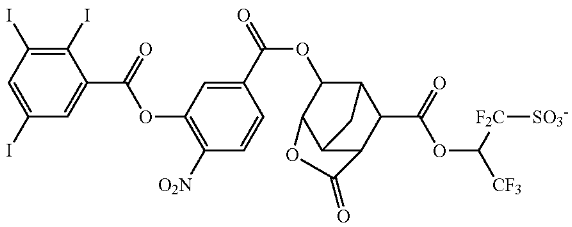
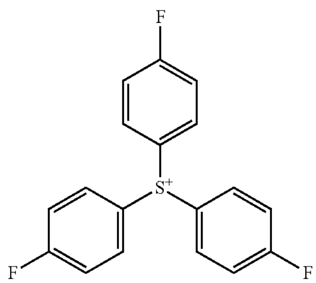
PAG-8
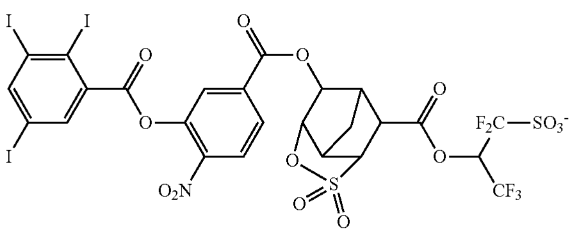
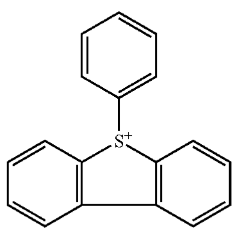
PAG-9
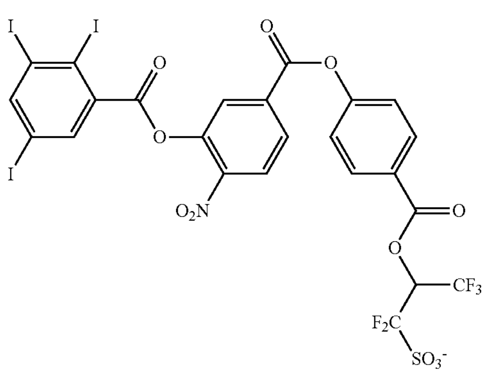
-continued
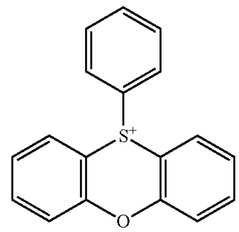
PAG-10
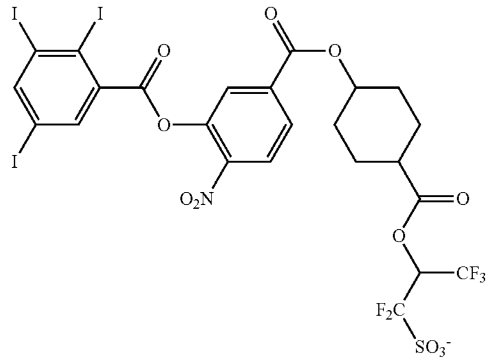
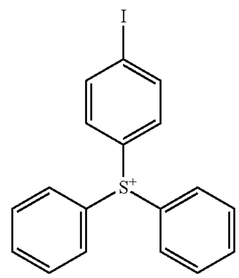
PAG-11
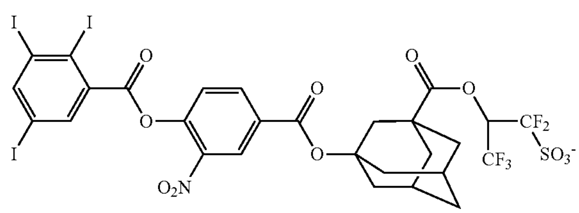
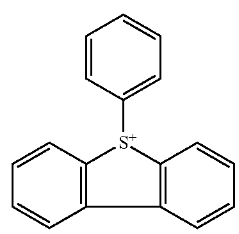
PAG-12
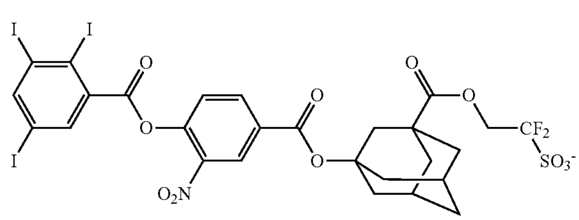

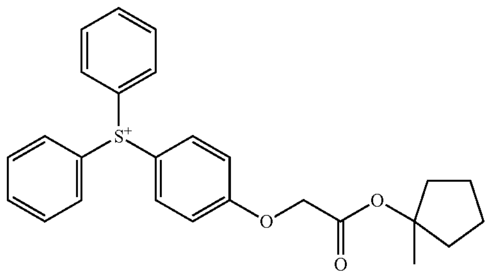
PAG-13
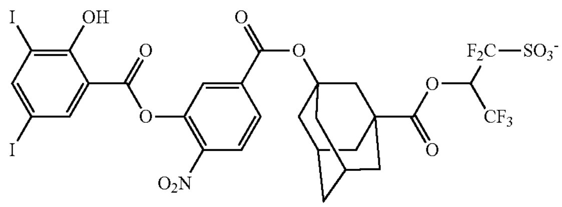
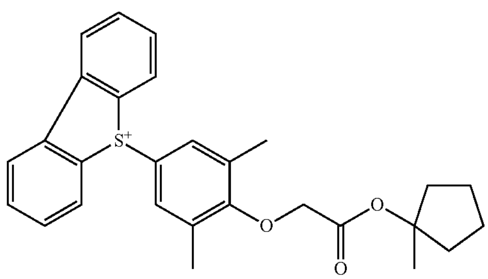
PAG-14
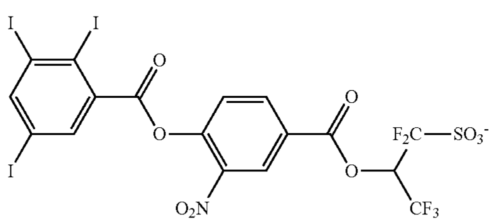
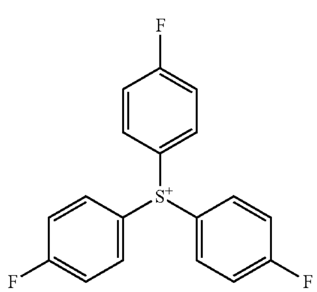
PAG-15
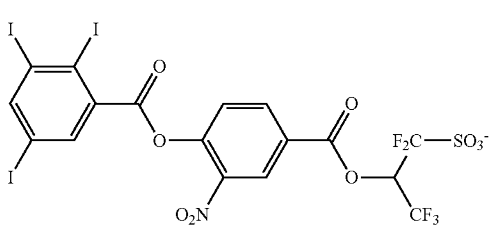
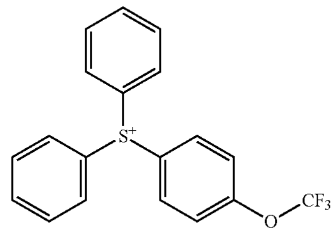
PAG-16
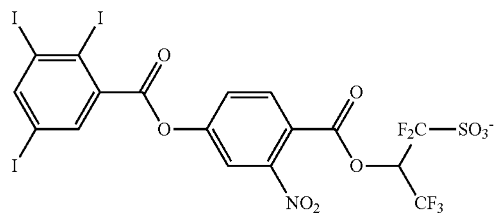
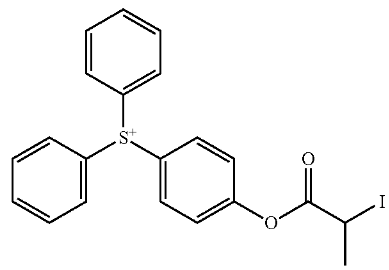
PAG-17
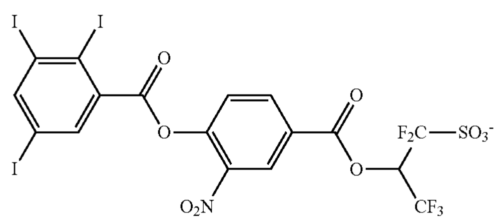
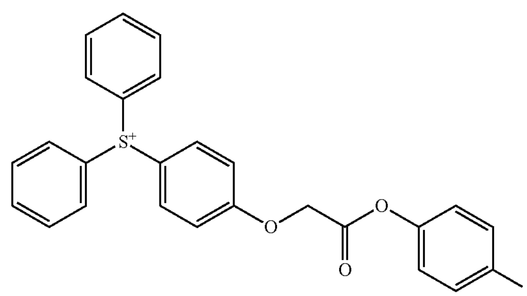
PAG-18
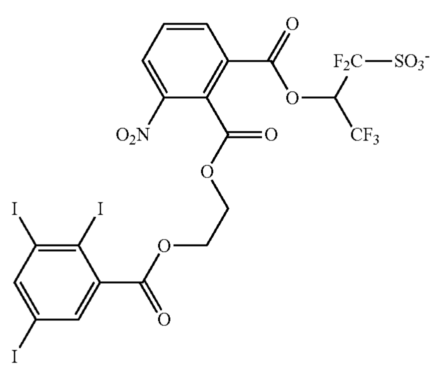

-continued

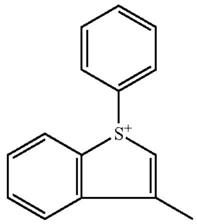

PAG-19

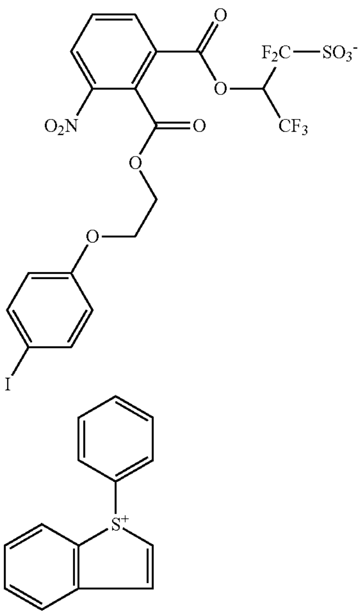

PAG-20

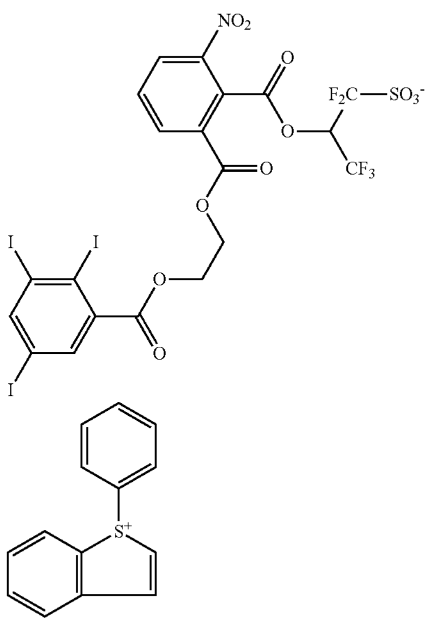

Synthesis Example

Synthesis of Base Polymers (Polymers P-1 to P-4)

A base polymer (Polymers P-1 to P-4) was prepared by combining suitable monomers, effecting copolymerization reaction thereof in tetrahydrofuran (THF) solvent, pouring the reaction solution into methanol, repeatedly washing the precipitate with hexane, isolation, and drying. The resulting polymer was analyzed for composition by $^1$H-NMR spectroscopy, and for Mw and Mw/Mn by GPC versus polystyrene standards using THF solvent.

P-1

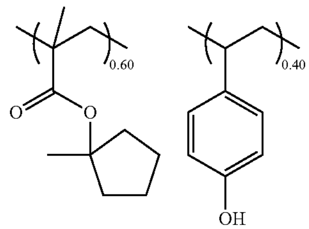

Mw = 5,200
Mw/Mn = 1.45

P-2

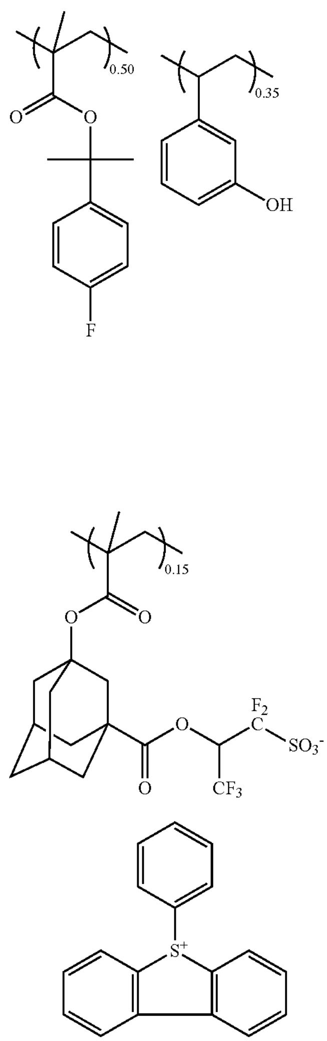

Mw = 8,800
Mw/Mn = 1.55

-continued

P-3

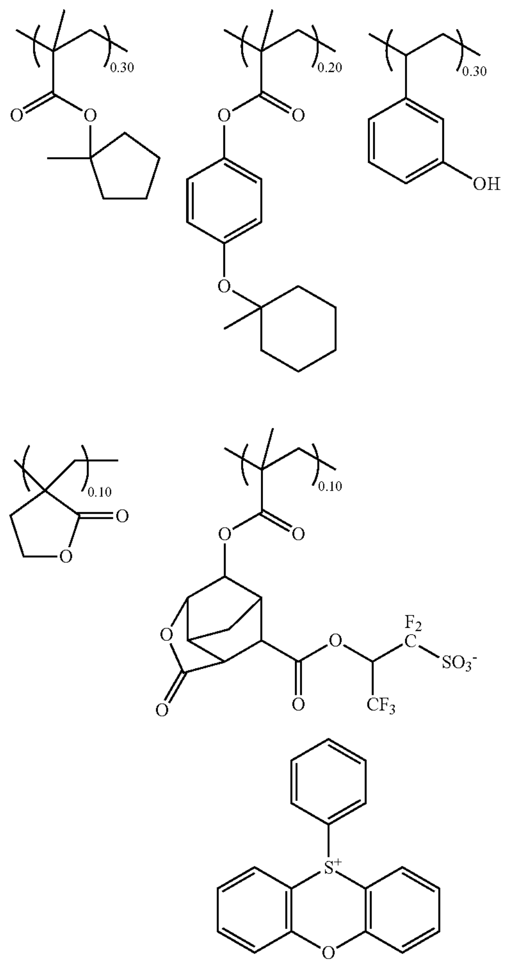

Mw = 8,100
Mw/Mn = 1.91

P-4

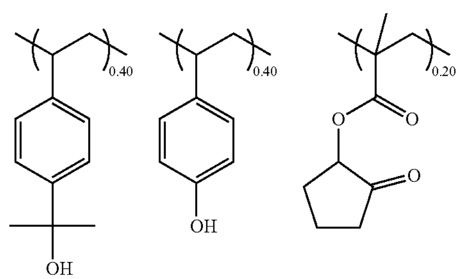

Mw = 6,900
Mw/Mn = 1.62

Examples 1 to 23 and Comparative Examples 1 to 3

(1) Preparation of Resist Compositions

Resist compositions were prepared by dissolving various components in a solvent in accordance with the recipe shown in Table 1, and filtering through a filter having a pore size of 0.2 μm. The solvent contained 100 ppm of surfactant Polyfox PF-636 (Omnova Solutions Inc.).

The components in Table 1 are as identified below.

Organic Solvent:

PGMEA (propylene glycol monomethyl ether acetate)

EL (ethyl lactate)

DAA (diacetone alcohol)

Comparative Acid Generator: cPAG-1 and cPAG-2 of the Following Structural Formulae cPAG-1

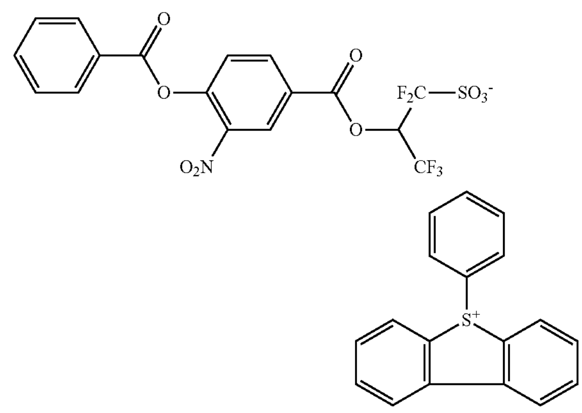

cPAG-2

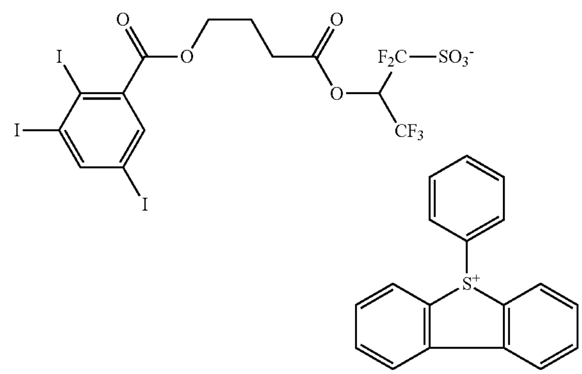

Quencher: Q-1 and Q-2 of the Following Structural Formulae

Q-1

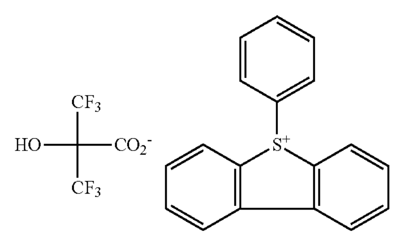

Q-2

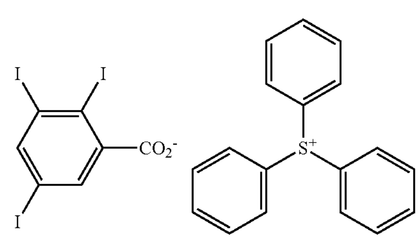

(2) EUV Lithography Test

Each of the resist compositions in Table 1 was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 50 nm thick. Using an EUV scanner NXE3400 (ASML, NA 0.33, σ 0.9/0.6, quadrupole illumination), the resist film was exposed to EUV through a mask bearing a hole pattern at a pitch 40 nm (on-wafer size) and +20% bias. The resist film was baked (PEB) on a hotplate at the temperature shown in Table 1 for 60 seconds and developed in a 2.38 wt % TMAH aqueous solution for 30 seconds to form a pattern. In Examples 1 to 22 and Comparative Examples 1 to 2, a hole pattern having a size of nm was formed. In Example 23 and Comparative Example 3, a dot pattern having a size of 20 nm was formed.

The resist pattern was observed under CD-SEM (CG-6300, Hitachi High-Technologies Corp.). The exposure dose that provides a hole or dot pattern having a size of 20 nm is reported as sensitivity. The size of 50 holes or dots was measured, from which a 3-fold value (3σ) of standard deviation (σ) was computed and reported as size variation or CDU.

The resist composition is shown in Table 1 together with the sensitivity and CDU of EUV lithography.

TABLE 1

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Example | 1 | P-1 (100) | PAG-1 (30.8) | Q-1 (4.72) | PGMEA (500) EL (2,000) | 80 | 33 | 3.5 |
| | 2 | P-1 (100) | PAG-2 (34.7) | Q-1 (4.72) | PGMEA (500) EL (2,000) | 80 | 33 | 3.4 |
| | 3 | p-1 (100) | PAG-3 (35.3) | Q-1 (4.72) | PGMEA (500) EL (2,000) | 80 | 32 | 3.4 |
| | 4 | p-1 (100) | PAG-4 (34.7) | Q-1 (4.72) | PGMEA (2,000) DAA (500) | 80 | 35 | 3.4 |
| | 5 | p-1 (100) | PAG-5 (34.2) | Q-1 (4.72) | PGMEA (2,000) DAA (500) | 80 | 36 | 3.2 |
| | 6 | p-1 (100) | PAG-6 (33.2) | Q-1 (4.72) | PGMEA (2,000) DAA (500) | 80 | 34 | 3.5 |
| | 7 | p-1 (100) | PAG-7 (41.2) | Q-1 (4.72) | PGMEA (2,000) DAA (500) | 80 | 35 | 2.9 |
| | 8 | p-1 (100) | PAG-8 (40.6) | Q-1 (4.72) | PGMEA (2,000) DAA (500) | 80 | 32 | 3.2 |
| | 9 | p-1 (100) | PAG-9 (38.2) | Q-1 (4.72) | PGMEA (2,000) DAA (500) | 80 | 36 | 2.9 |
| | 10 | p-1 (100) | PAG-10 (41.7) | Q-1 (4.72) | PGMEA (2,000) DAA (500) | 80 | 35 | 2.9 |
| | 11 | p-1 (100) | PAG-11 (39.0) | Q-1 (4.72) | PGMEA (2,000) DAA (500) | 80 | 35 | 3.2 |
| | 12 | p-1 (100) | PAG-12 (42.2) | Q-1 (4.72) | PGMEA (2,000) DAA (500) | 80 | 34 | 3.5 |
| | 13 | p-1 (100) | PAG-13 (41.7) | Q-1 (4.72) | PGMEA (2,000) DAA (500) | 80 | 35 | 3.4 |
| | 14 | p-1 (100) | PAG-14 (35.8) | Q-1 (4.72) | PGMEA (2,000) DAA (500) | 80 | 37 | 3.5 |
| | 15 | p-1 (100) | PAG-15 (36.7) | Q-2 (7.62) | PGMEA (2,000) DAA (500) | 80 | 34 | 3.4 |
| | 16 | p-1 (100) | PAG-16 (40.1) | Q-2 (7.62) | PGMEA (2,000) DAA (500) | 80 | 36 | 3.5 |
| | 17 | p-1 (100) | PAG-17 (42.5) | Q-2 (7.62) | PGMEA (2,000) DAA (500) | 80 | 32 | 3.6 |
| | 18 | P-2 (100) | PAG-8 (13.5) | Q-2 (7.62) | PGMEA (2,000) DAA (500) | 80 | 32 | 3.1 |
| | 19 | P-3 (100) | PAG-7 (13.7) | Q-2 (7.62) | PGMEA (2,000) DAA (500) | 80 | 32 | 3.0 |
| | 20 | p-1 (100) | PAG-18 (35.2) | Q-2 (7.62) | PGMEA (2,000) DAA (500) | 80 | 29 | 3.3 |
| | 21 | P-2 (100) | PAG-19 (26.3) | Q-2 (7.62) | PGMEA (2,000) DAA (500) | 80 | 31 | 3.3 |
| | 22 | P-3 (100) | PAG-20 (34.8) | Q-2 (7.62) | PGMEA (2,000) DAA (500) | 80 | 29 | 3.0 |
| | 23 | P-4 (100) | PAG-1 (10.3) | Q-1 (2.72) | PGMEA (2,000) DAA (500) | 130 | 39 | 3.9 |
| Comparative Example | 1 | P-1 (100) | cPmAG-1 (22.8) | Q-1 (4.72) | PGMEA (2,000) DAA (500) | 80 | 37 | 4.9 |
| | 2 | P-1 (100) | cPAG-2 (31.7) | Q-1 (4.72) | PGMEA (2,000) DAA (500) | 80 | 32 | 4.1 |
| | 3 | P-4 (100) | cPAG-1 (7.6) | Q-1 (2.72) | PGMEA (2,000) DAA (500) | 130 | 55 | 4.9 |

It is demonstrated in Table 1 that resist compositions comprising a sulfonium or iodonium salt having formula (A-1) or (A-2) as the acid generator offer a high sensitivity and improved CDU.

Japanese Patent Application No. 2021-078966 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base polymer and a sulfonium salt having the formula (A-1) or an iodonium salt having the formula (A-2):

(A-1)

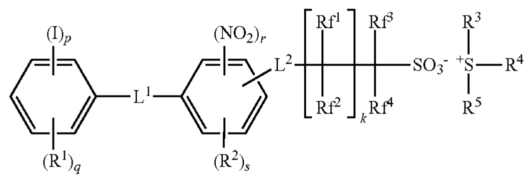

(A-2)

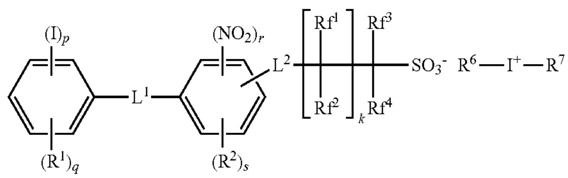

wherein k is an integer of 0 to 2, p is an integer of 1 to 5, q is an integer of 0 to 4, p+q is from 1 to 5, r is 1 or 2, s is an integer of 0 to 3, r+s is from 1 to 4, $L^1$ is a single bond, ether bond, ester bond, amide bond, or a $C_1$-$C_6$ saturated hydrocarbylene group in which some constituent —$CH_2$— may be replaced by an ether bond, ester bond or amide bond, $L^2$ is a single bond or a $C_1$-$C_{20}$ divalent linking group which may contain oxygen, sulfur or nitrogen, $Rf^1$ to $Rf^4$ are each independently hydrogen, fluorine or trifluoromethyl, at least one of $Rf^1$ to $Rf^4$ being fluorine or trifluoromethyl, $R^1$ is a hydroxy, carboxy, fluorine, chlorine, bromine, amino group, or a $C_1$-$C_{20}$ hydrocarbyl group, $C_1$-$C_{20}$ hydrocarbyloxy group, $C_2$-$C_{20}$ hydrocarbyloxycarbonyl group, $C_2$-$C_{20}$ hydrocarbylcarbonyloxy group, or $C_1$-$C_{20}$ hydrocarbylsulfonyloxy group, which may contain fluorine, chlorine, bromine, hydroxy, amino or ether bond, or —$N(R^{1A})$ $(R^{1B})$, —$N(R^{1C})$—C(═O)—$R^{1D}$, or —$N(R^{1C})$—C(═O)—O—$R^{1D}$, wherein $R^{1A}$ and $R^{1B}$ are each independently hydrogen or a $C_1$-$C_6$ saturated hydrocarbyl group, $R^{1C}$ is hydrogen or a $C_1$-$C_6$ saturated hydrocarbyl group which may contain halogen, hydroxy moiety, a $C_1$-$C_6$ saturated hydrocarbyloxy moiety, $C_2$-$C_6$ saturated hydrocarbylcarbonyl moiety, or $C_2$-$C_6$ saturated hydrocarbylcarbonyloxy moiety, $R^{1D}$ is a $C_1$-$C_{16}$ aliphatic hydrocarbyl group or $C_6$-$C_{12}$ aryl group, which may contain halogen, hydroxy moiety, a $C_1$-$C_6$ saturated hydrocarbyloxy moiety, $C_2$-$C_6$ saturated hydrocarbylcarbonyl moiety, or $C_2$-$C_6$ saturated hydrocarbylcarbonyloxy moiety, $R^2$ is a $C_1$-$C_4$ alkyl group, $C_1$-$C_4$ alkyloxy group, $C_2$-$C_5$ alkylcarbonyloxy group, or halogen fluorine, or chlorine, $R^3$, $R^4$, $R^5$, $R^6$ and $R^7$ are each independently halogen or a $C_1$-$C_{20}$ hydrocarbyl group which may contain a heteroatom, $R^3$ and $R^4$ may bond together to form a ring with the sulfur atom to which they are attached.

2. The resist composition of claim 1 wherein the base polymer comprises repeat units having the formula (a1) or repeat units having the formula (a2):

(a1)

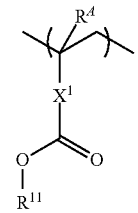

(a2)

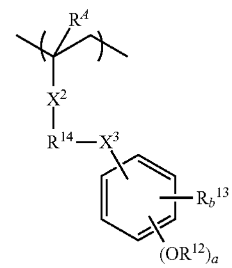

wherein $R^A$ is each independently hydrogen or methyl, $X^1$ is a single bond, phenylene, naphthylene, or a $C_1$-$C_{12}$ linking group containing an ester bond, ether bond or lactone ring, $X^2$ is a single bond or ester bond, $X^3$ is a single bond, ether bond or ester bond, $R^{11}$ and $R^{12}$ are each independently an acid labile group, $R^{13}$ is fluorine, trifluoromethyl group, cyano group, a $C_1$-$C_6$ saturated hydrocarbyl group, $C_1$-$C_6$ saturated hydrocarbyloxy group, $C_2$-$C_7$ saturated hydrocarbylcarbonyl group, $C_2$-$C_7$ saturated hydrocarbylcarbonyloxy group, or $C_2$-$C_7$ saturated hydrocarbyloxycarbonyl group, $R^{14}$ is a single bond or a $C_1$-$C_6$ alkanediyl group in which some constituent —$CH_2$— may be replaced by an ether bond or ester bond, a is 1 or 2, and b is an integer of 0 to 4.

3. The resist composition of claim 2 which is a chemically amplified positive resist composition.

4. The resist composition of claim 1 wherein the base polymer is free of an acid labile group.

5. The resist composition of claim 4 which is a chemically amplified negative resist composition.

6. The resist composition of claim 1 wherein the base polymer comprises repeat units of at least one type selected from repeat units having the formulae (f1) to (f3):

(f1)

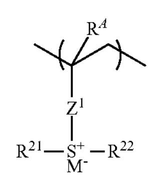

-continued (f2)

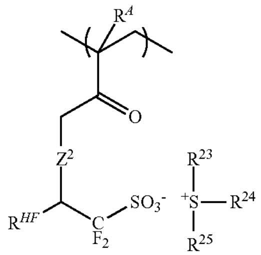

(f3)

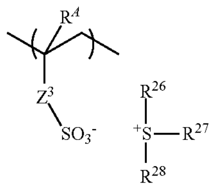

wherein $R^A$ is each independently hydrogen or methyl, $Z^1$ is a single bond, a $C_1$-$C_6$ aliphatic hydrocarbylene group, phenylene group, naphthylene group, or $C_7$-$C_{18}$ group obtained by combining the foregoing, or —O—$Z^{11}$—, —C(═O)—O—$Z^{11}$— or —C(═O)—NH—$Z^{11}$—, $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety, $Z^2$ is a single bond, —$Z^{21}$—C(═O)—O—, —$Z^{21}$—O— or —$Z^{21}$—O—C(═O)—, $Z^{21}$ is a $C_1$-$C_{12}$ saturated hydrocarbylene group which may contain a carbonyl moiety, ester bond or ether bond, $Z^3$ is a single bond, methylene, ethylene, phenylene, fluorinated phenylene, trifluoromethyl-substituted phenylene group, —O—$Z^{31}$—, —C(═O)—O—$Z^{31}$—, or —C(═O)—NH—$Z^{31}$—, $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety, $R^{21}$ to $R^{28}$ are each independently halogen or a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached, $R^{HF}$ is hydrogen or trifluoromethyl, and $M^-$ is a non-nucleophilic counter ion.

7. The resist composition of claim 1, further comprising an organic solvent.

8. The resist composition of claim 1, further comprising a quencher.

9. The resist composition of claim 1, further comprising a surfactant.

10. A pattern forming process comprising the steps of applying the resist composition of claim 1 onto a substrate to form a resist film thereon, exposing the resist film to high-energy radiation, and developing the exposed resist film in a developer.

11. The process of claim 10 wherein the high-energy radiation is ArF excimer laser of wavelength 193 nm or KrF excimer laser of wavelength 248 nm.

12. The process of claim 10 wherein the high-energy radiation is EB or EUV of wavelength 3 to 15 nm.

13. The resist composition of claim 1, wherein $L^2$ is a single bond, an amide bond, or a $C_1$-$C_{20}$ hydrocarbylene group in which some constituent —$CH_2$— may be replaced by an ester bond, ether bond, amide bond or sulfonic ester bond, and the constituent —$CH_2$— may be located at the end of the group.

14. The resist composition of claim 8, wherein the quencher is a sulfonium salt of iodized benzene ring-containing carboxylic acid having the following formula (D)

(D)

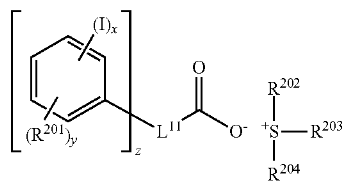

wherein $R^{201}$ is hydroxy, fluorine, chlorine, bromine, amino, nitro, cyano, or a $C_1$-$C_6$ saturated hydrocarbyl, $C_1$-$C_6$ saturated hydrocarbyloxy, $C_2$-$C_6$ saturated hydrocarbylcarbonyloxy or $C_1$-$C_4$ saturated hydrocarbylsulfonyloxy group, in which some or all hydrogen may be substituted by halogen, or —N($R^{201A}$) ($R^{201B}$), —N($R^{201C}$)—C(═O)—$R^{201D}$, or —N($R^{201C}$)—C(═O)—O—$R^{201D}$, $R^{201A}$ and $R^{201B}$ are each independently hydrogen or a $C_1$-$C_6$ saturated hydrocarbyl group, $R^{201C}$ is hydrogen or a $C_1$-$C_6$ saturated hydrocarbyl group, $R^{201D}$ is a $C_1$-$C_6$ saturated hydrocarbyl or $C_2$-$C_8$ unsaturated aliphatic hydrocarbyl group, groups $R^{201}$ may be the same or different when y and/or z is 2 or 3, x is an integer of 1 to 5, y is an integer of 0 to 3, and z is an integer of 1 to 3, $L^{11}$ is a single bond, or a $C_1$-$C_{20}$ (z+1)-valent linking group which may contain at least one moiety selected from ether bond, carbonyl moiety, ester bond, amide bond, sultone ring, lactam ring, carbonate bond, halogen, hydroxy moiety, and carboxy moiety, $R^{202}$, $R^{203}$ and $R^{204}$ are each independently halogen, or a $C_1$-$C_{20}$ hydrocarbyl group which may contain a heteroatom, $R^{202}$ and $R^{203}$ may bond together to form a ring with the sulfur atom to which they are attached.

* * * * *